(12) United States Patent
Despesse

(10) Patent No.: US 9,813,011 B2
(45) Date of Patent: Nov. 7, 2017

(54) DEVICE FOR GENERATING PHOTOVOLTAIC ENERGY WITH BLOCKS OF CELLS

(75) Inventor: Ghislain Despesse, Saint Egreve (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/124,527

(22) PCT Filed: Jun. 8, 2012

(86) PCT No.: PCT/EP2012/060884
§ 371 (c)(1),
(2), (4) Date: Dec. 6, 2013

(87) PCT Pub. No.: WO2012/168426
PCT Pub. Date: Dec. 13, 2012

(65) Prior Publication Data
US 2014/0109951 A1 Apr. 24, 2014

(30) Foreign Application Priority Data
Jun. 8, 2011 (FR) .................................. 11 55018

(51) Int. Cl.
*H02N 6/00* (2006.01)
*H01L 31/042* (2014.01)
*H02S 10/00* (2014.01)
*H01L 31/02* (2006.01)
*H02S 50/00* (2014.01)
*H02J 1/00* (2006.01)

(52) U.S. Cl.
CPC ........ *H02S 10/00* (2013.01); *H01L 31/02021* (2013.01); *H02J 1/00* (2013.01); *H02S 50/00* (2013.01); *Y02B 10/14* (2013.01); *Y02E 10/50* (2013.01); *Y10T 307/76* (2015.04)

(58) Field of Classification Search
CPC .......... H01L 31/02008; H01L 31/02021; H02J 7/34; H02J 7/35; H02J 1/00; Y02E 10/50; Y02E 10/56; Y02E 10/566; Y02B 10/14; H02S 50/00; H02S 50/10; H02S 10/00
See application file for complete search history.

(56) References Cited

U.S. PATENT DOCUMENTS

| 4,175,249 A | 11/1979 | Gruber |
| 2008/0210286 A1 | 9/2008 | Ball |
| 2009/0079412 A1 | 3/2009 | Kuo |
| 2009/0183763 A1 | 7/2009 | Meyer |

(Continued)

FOREIGN PATENT DOCUMENTS

| EP | 2 169 727 A | 3/2010 |
| WO | WO 2009/121062 A | 10/2009 |
| WO | WO 2010/062662 A | 6/2010 |

*Primary Examiner* — Eli Mekhlin
(74) *Attorney, Agent, or Firm* — Haug Partners LLP

(57) ABSTRACT

Photovoltaic energy generation device, characterized in that it comprises at least one brick (120) comprising a lower terminal and an upper terminal, between which are arranged two cells (111), each comprising a photovoltaic cell (7), comprising one or more elementary photovoltaic cell(s), and a storage element (8) connected to the terminals of the photovoltaic cell, and at least three cell switchs (113), so as to be able to dispose the said two cells (111) in series or in parallel.

23 Claims, 41 Drawing Sheets

(56) References Cited

U.S. PATENT DOCUMENTS

| | | |
|---|---|---|
| 2009/0242015 A1 | 10/2009 | Wattman et al. |
| 2010/0032010 A1* | 2/2010 | Herner et al. ................ 136/256 |
| 2010/0037936 A1 | 2/2010 | Becker et al. |
| 2010/0078058 A1 | 4/2010 | Nightingale et al. |
| 2010/0127570 A1* | 5/2010 | Hadar et al. .................... 307/77 |
| 2011/0006742 A1* | 1/2011 | Teggatz et al. ............... 323/234 |
| 2011/0101787 A1 | 5/2011 | Gaul |

* cited by examiner

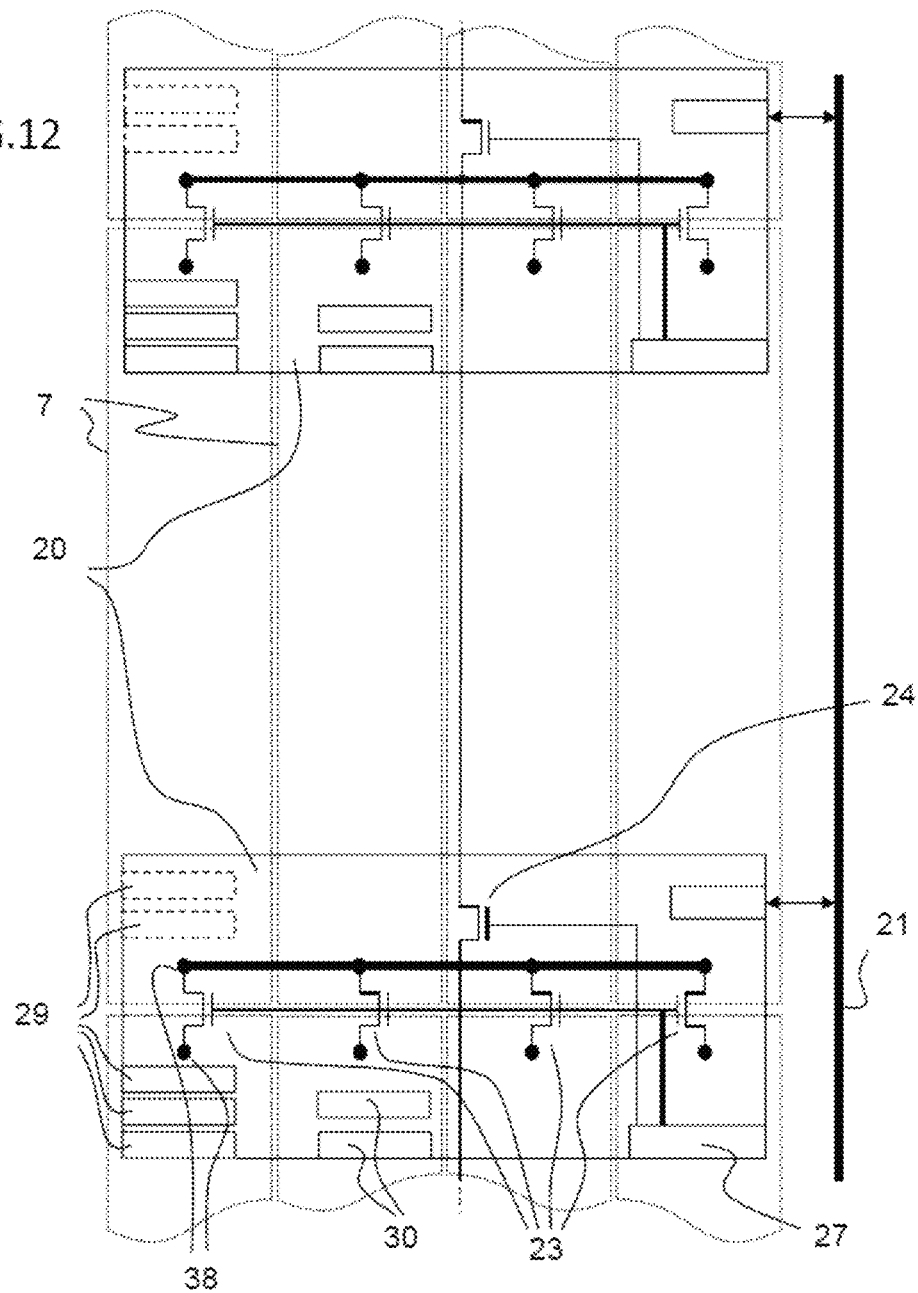

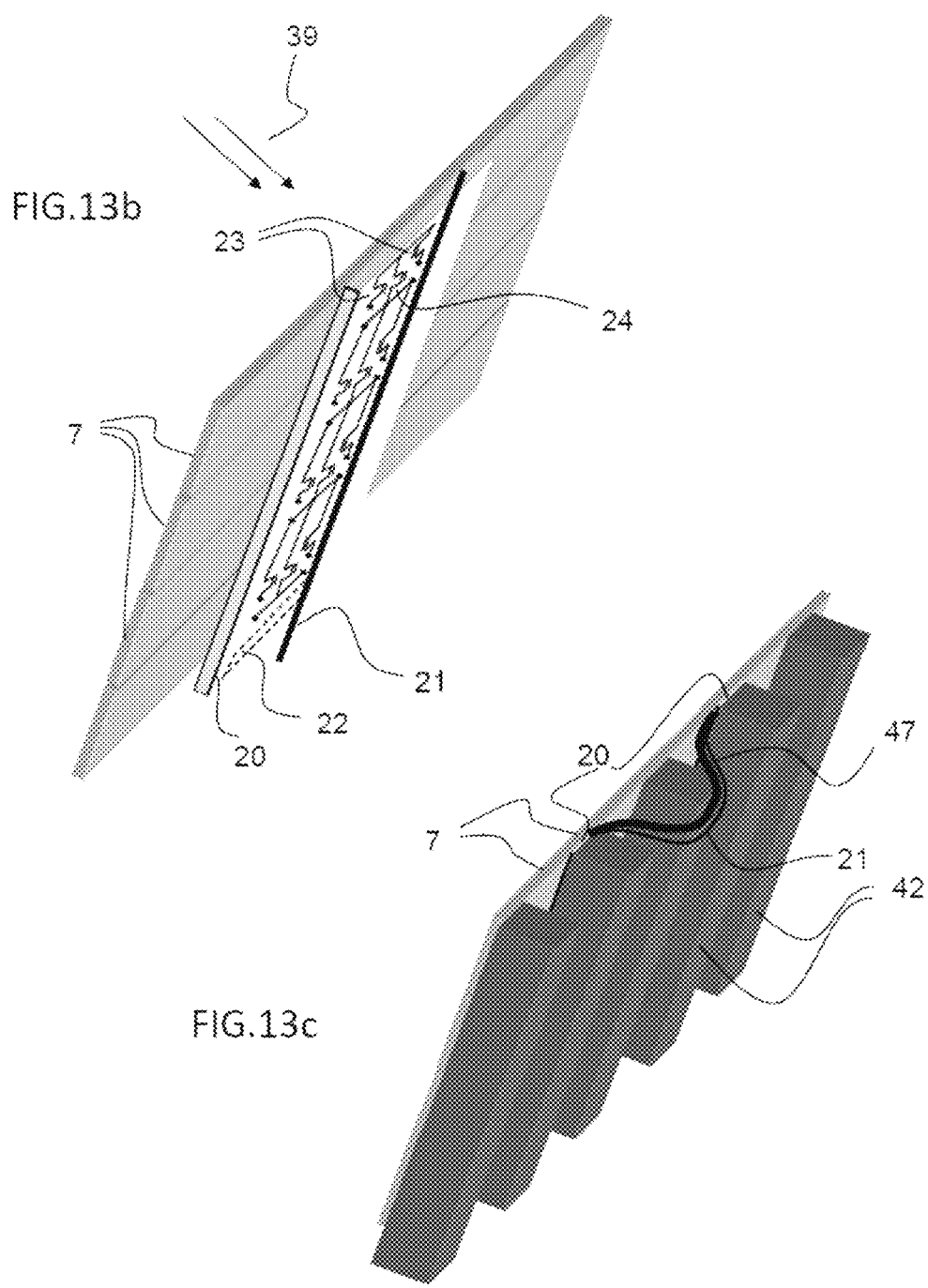

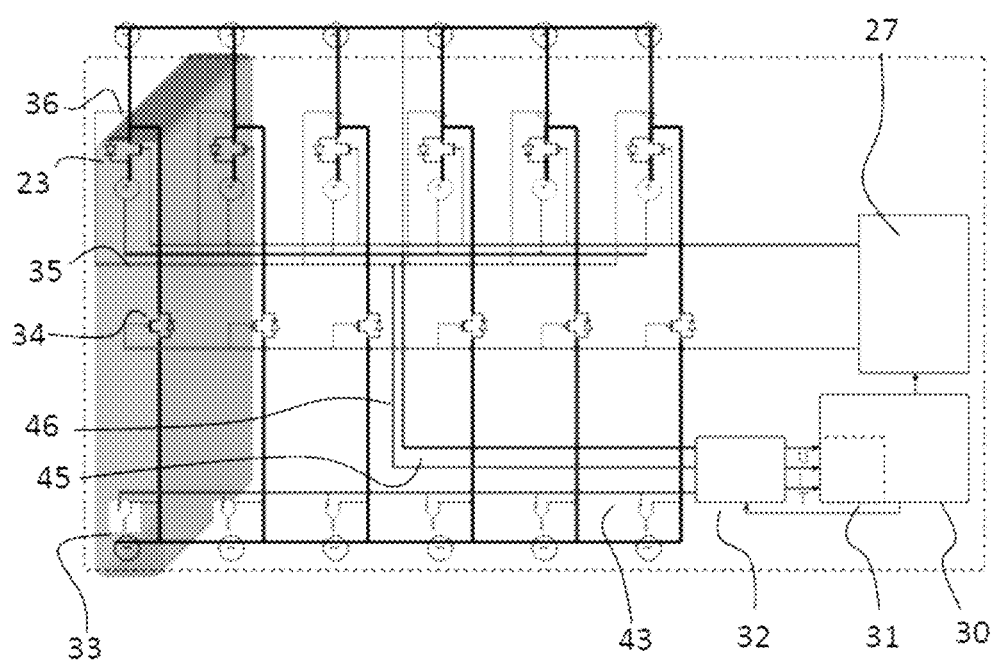

DEVICE FOR GENERATING PHOTOVOLTAIC ENERGY WITH BLOCKS OF CELLS

This application is a 371 of PCT/EP2012/060884 filed on Jun. 8, 2012, published on Dec. 13, 2012 under publication number WO 2012/168426, which claims priority benefits from French Patent Application Number 1155018 filed Jun. 8, 2011, the disclosure of which is incorporated herein by reference.

The invention relates to a photovoltaic energy generation device. It also relates to a method for managing the generation of photovoltaic energy.

The generation of photovoltaic energy is generally implemented by an energy generation device comprising the association of a multitude of elementary photovoltaic cells, possessing a low voltage across their terminals, disposed in series so as to attain a desired output voltage. Often, this photovoltaic energy generation device is connected to the electrical distribution network, which requires a voltage of a few hundred volts from it. In practice, a disparity is noted in the situations and behaviours of the various elementary photovoltaic cells of the generation device since some of these cells may have failed, others be in a shaded zone, etc. It follows from this that an energy generation device is not optimized since its photovoltaic cells do not operate at their optimal operating point.

FIG. 1 illustrates by way of example a photovoltaic energy generation device 1 linked to the mains 5, by an intermediate device 6 of DC/AC converter type. The function of the device 6 is to transform the output voltage of the photovoltaic generator into an alternating voltage compatible with the mains 5. Naturally, the use of this intermediate device 6 exhibits several drawbacks, including the generation of losses at the level of the transistors and other components used, thereby giving rise to additional energy consumption globally. Moreover, this also represents additional bulk.

Document U.S. Pat. No. 4,175,249 describes an energy generation device whose structure comprises a multitude of switches, to make it possible to dispose certain photo-voltaic cells in series or in parallel, so as to afford flexibility in electrical generation. However, this solution remains non-optimized and difficult to manage in practice.

Thus, there exists a need for an improved solution for photovoltaic energy generation making it possible to resolve the drawbacks of the existing solutions, and the invention seeks to attain all or some of the following objects:

A first object of the invention is to propose an optimized solution for photovoltaic energy generation.

A second object of the invention is to propose a photovoltaic energy generation solution which allows flexible generation, adapting to various requirements of use, such as to the variable needs of a motor for example or of an arbitrary electrical network.

For this purpose, the invention relies on a photovoltaic energy generation device, characterized in that it comprises at least one brick comprising a lower terminal and an upper terminal, between which are arranged two cells, each comprising a photovoltaic cell, comprising one or more elementary photovoltaic cell(s), and a storage element connected to the terminals of the photovoltaic cell, and at least three cell switches, so as to be able to dispose the said two cells in series or in parallel.

The at least one brick can comprise a first branch extending between its lower and upper terminals and comprising in this order a cell and a cell switch, a second branch between its lower and upper terminals comprising in this order a cell switch and a cell, and a transverse branch comprising a cell switch and linking respectively the intermediate terminals disposed between the cell and the cell switch of each of the said two branches.

The at least one brick can comprise two additional cell switches disposed respectively on each of the two branches on the cell side with respect to their intermediate terminal.

The photovoltaic energy generation device can comprise a module comprising a lower terminal and an upper terminal, between which are disposed two bricks, linked by three branches and three switches disposed respectively between the two lower terminals of the two bricks between their two upper terminals, and between the upper terminal of the first lower brick and the lower terminal of the second upper brick, so as to be able to dispose the two bricks in series or in parallel.

The photovoltaic energy generation device can comprise a module comprising a lower terminal and an upper terminal, between which are disposed several sets of more than two bricks that are able to be disposed in series or in parallel, these sets being able to be disposed in series and/or in parallel between the two lower and upper terminals of the module with the aid of several switches.

The photovoltaic energy generation device can comprise a module comprising a lower terminal and an upper terminal, between which are disposed four bricks so as to form a superbrick, this superbrick comprising a first set comprising a first brick linked to the lower terminal of the module and linked to a second brick linked to the upper terminal of the module by way of three switches making it possible to dispose these two bricks in series or in parallel, and comprising a second set of two other bricks disposed between the two lower and upper terminals of the module in parallel with the first set of two bricks.

The photovoltaic energy generation device can comprise at least one distinct intermediate electrical link of the upper and lower terminals between the two sets of two bricks.

The photovoltaic energy generation device can comprise several modules disposed in series, and each module can comprise a lower terminal and an upper terminal between which several bricks in parallel, and/or several sets of two bricks interlinked in series and/or parallel, and/or several superbricks in parallel are disposed.

The photovoltaic energy generation device can comprise at least one H-bridge able to invert the voltage across the terminals of all or part of the photovoltaic energy generation device, and/or can comprise several subsets of cells and switches disposed between these subsets able to dispose two subsets in series or in parallel.

The photovoltaic energy generation device can comprise all or some of the following switchs:

a module switch connected in parallel with a module, and/or
  a parallel switch connected in parallel with a cell, and/or cell switches disposed in series with a cell, and/or
  at least one switch disposed in parallel with several modules, and/or
  switches for inverting the voltage across the terminals of all or part of the photovoltaic energy generation device and/or modifying the assemblage in series or in parallel of subsets of the photovoltaic energy generation device,
  and these switches can be controlled by at least one control circuit disposed at the level of a module or of a brick of the photovoltaic energy generation device.

The photovoltaic energy generation device can comprise at least one processing circuit at the level of a module or of a subset or of a brick and/or a central computer, which drives(drive) switches of the photovoltaic energy generation device by way of the control circuit.

The photovoltaic energy generation device can comprise one or more control circuit(s) and/or processing circuit powered electrically directly by at least one cell of the photovoltaic energy generation device.

The photovoltaic energy generation device can comprise a sensor for measuring the current at the level of a cell, and/or a sensor for measuring the voltage across the terminals of a cell and/or across the terminals of a cell switch, and/or a sensor for measuring the temperature of a cell and/or for impedance spectrometry measurement.

The photovoltaic energy generation device can comprise an electronic card comprising all or some of the following components:
  terminals for a link with cells of the photovoltaic energy generation device,
  cell switches,
  a module switch connected in parallel with a module,
  a parallel switch connected in parallel with a cell,
  at least one switch disposed in parallel with several bricks or modules or subsets,
  switches for inverting the voltage across the terminals of all or part of the photovoltaic energy generation device and/or modifying the assemblage in series or in parallel of subsets of the photovoltaic energy generation device,
  sensors for measuring a quantity characteristic of the state of cells,
  a control circuit for the cell switches,
  a processing circuit.

The photovoltaic energy generation device can comprise several transistors fulfilling the function of switches and/or the storage element can comprise at least one capacitor.

The invention also pertains to a method for managing a photovoltaic energy generation device such as previously described, characterized in that it comprises a step of determining the position of the cell switches of at least one brick of the photovoltaic energy generation device to dispose its two cells in series or in, parallel and to maintain its two cells in an operating state in. a range around an optimal operating point.

The method for managing a photovoltaic energy generation device can comprise a step of positioning at least one cell switch to maintain the associated cell in an operating state in a range of plus or minus 5% around an optimal operating point.

The method for managing a photovoltaic energy generation device can comprise a step of charging of a storage element by a photovoltaic cell during its disconnection from the remainder of the device.

The method for managing a photovoltaic energy generation device can comprise a step of comparing the actual state of a cell with an optimal operating state, stored previously in an electronic memory, or a step of searching for the optimal operating conditions of the cell.

The method for managing a photovoltaic energy generation device can comprise the implementation of the following steps:
  measurement of a quantity representative of the state of a cell and transmission of the measured quantity a at least one computer;
  determination of the position of a cell switch and/or module switch and/or parallel switch and/or a switch for placing bricks in series or parallel by taking into account the measured quantity;
  transmission of a command for opening or closing a switch as a function of the previous determination.

The method for managing a photovoltaic energy generation device can comprise a step consisting in diagnosing a failure and/or an at-risk state of a cell, by recognizing defective cells, such as overheating subsequent to a situation of short-circuit, ingress of moisture, electrical arcing, flame, insulation defect, on the basis of the quantity measured at the level of a cell, so as to disconnect or discard from the overall operation of the photovoltaic energy generation device the cell concerned, by opening or closing at least brick switch.

The method of management of photovoltaic energy generation device can implement the following steps:
  mutual balancing of the bricks and/or modules and/or cells, using by priority the bricks and/or modules and/or cells whose voltage is the highest; and/or
  balancing of the bricks and/or modules and/or cells by modifying the mean rate of use of the bricks and/or modules and/or cells, but without using the same bricks and/or modules and/or cells permanently, so that the voltage of the bricks and/or modules and/or cells balances.

The method for managing a photovoltaic energy generation device can comprise a step of regulating the output voltage of the photovoltaic energy generation device which comprises a step of opening/closing switches of the photovoltaic energy generation device so as to follow an imposed output voltage setpoint, especially a time-varying setpoint such as of sinusoidal form.

The method for managing a photovoltaic energy generation device can comprise a step of computing the number of bricks and/or subsets of the photovoltaic energy generation device to be disposed in parallel or in series.

The invention also pertains to a photovoltaic energy generation device comprising several modules, characterized in that a module comprises at least one cell and at least one cell switch associated with the cell, so as to be able to disconnect it from the remainder of the photovoltaic energy generation device, this cell comprising a photovoltaic cell, comprising one or more elementary photovoltaic cell(s), and a storage element connected across the terminals of the photovoltaic cell.

Each module can comprise a lower terminal suitable for connection with a lower module and an upper terminal suitable for connection with an upper module, and can comprise a module comprising at least one branch between its lower terminal and its upper terminal comprising a cell and a cell switch disposed in series.

The photovoltaic energy generation device can comprise an arrangement of bricks comprising two parallel vertical branches comprising respectively a cell and at least one cell switch, and at least one cell switch and a cell, and comprising a transverse branch linking the two intermediate terminals of the two vertical branches and comprising a cell switch.

The photovoltaic energy generation device can comprise at least one sensor for measuring a quantity characteristic of the state of a cell, and comprise, at the level of a module, a control circuit for at least one cell switch to control it as a function of the quantity characteristic of the state of the cell.

The photovoltaic energy generation device can comprise a control circuit for at least one cell switch directly supplied electrically by at least one cell of a module of the photovoltaic energy generation device.

The control circuit for at least one cell switch can be powered by at least one cell in proximity to the cell switch that it drives.

The photovoltaic energy generation device can comprise several modules disposed in series each comprising several cells disposed in parallel and/or series, each cell being associated with at least one cell switch and each cell comprising a photovoltaic cell, comprising one or more elementary photovoltaic cell(s), and a storage element connected across the terminals of the photovoltaic cell.

The photovoltaic energy generation device can comprise several cells each associated with at least one cell switch, controlled by one or more control circuit(s) supplied electrically directly by at least one cell of a module of the photovoltaic energy generation device.

The photovoltaic energy generation device can comprise a sensor for measuring the current at the level of a cell, and/or a sensor for measuring the voltage across the terminals of a cell and/or across the terminals of a cell switch, and/or a sensor for measuring the temperature of a cell and/or for impedance spectrometry measurement.

The photovoltaic energy generation device can comprise at least one module switch connected in parallel with a module or at least one module each cell of which is associated with a parallel switch connected in parallel with the cell and a cell switch disposed in series, and/or at least one switch disposed in parallel with several modules.

The photovoltaic energy generation device can comprise at least one processing circuit at the level of a module and/or a central computer, which drives(drive) cell switches or module switches by way of a control circuit.

The photovoltaic energy generation device can comprise a central computer and a communication bus linking the various modules comprising at least one cell switch to the central computer by way of a galvanic isolation.

The photovoltaic energy generation device can comprise an electronic card comprising:
  terminals for a link with cells of the photovoltaic energy generation device, and
  cell switches for one or more modules, and
  sensors for measuring a quantity characteristic of the state of cells and/or a control circuit for the cell switches.

The photovoltaic energy generation device can comprise at least one H-bridge able to invert the voltage across the terminals of all or some of the photovoltaic energy generation device.

The photovoltaic energy generation device can comprise several subsets of cells and switches disposed between these subsets able to dispose two subsets in series or in parallel.

The photovoltaic energy generation device can comprise switches to invert the voltage across the terminals of all or some of the photovoltaic energy generation device and/or modify the assemblage in series or in parallel of sub-sets of the photovoltaic energy generation device, and these switches can be controlled by at least one control circuit dis-posed at the level of a module of the photovoltaic energy generation device.

The cell switch and/or module switch can be a transistor.

The storage element can comprise at least one capacitor.

The photovoltaic energy generation device can comprise three columns each comprising several modules disposed in series so as to provide a three-phase output.

The invention also pertains to a method for managing a photovoltaic energy generation device which comprises a step of determining the position of at least one cell switch so as to maintain the photovoltaic cell in an operating state in a range around an optimal operating point.

The position of at least one cell switch can maintain the cell in an operating state in a range of plus or minus 5% around an optimal operating point.

The method for managing a photovoltaic energy generation device can comprise the following steps:
  when the voltage across the terminals of a cell exceeds an optimal voltage corresponding to the optimal operating point, increased by a predefined percentage, at least one cell switch is closed so as to allow its use to produce a voltage and a current towards the output of the device, and/or
  when the voltage across the terminals of a cell falls below this optimal voltage decreased by a predefined percentage, at least one cell switch is opened, so that said cell no longer participates in the production of voltage and current at the output of the device.

The method for managing a photovoltaic energy generation device can comprise a step of charging of a storage element by a photovoltaic cell during its disconnection from the remainder of the device.

The method for managing a photovoltaic energy generation device can comprise a step of comparing the actual state of a cell with an optimal operating state, stored previously in an electronic memory, or a step of searching for the optimal operating conditions of the cell.

The method for managing a photovoltaic energy generation device can comprise the implementation of the following steps:
  measurement of a quantity representative of the state of a cell and transmission of the measured quantity to at least one computer;
  determination of the position of a cell switch and/or module switch by taking into account the measured quantity;
  transmission of a command for opening or closing a cell switch and/or module switch as a function of the preceding determination.

The method for managing a photovoltaic energy generation device can comprise a step consisting in diagnosing a failure and/or an at-risk state of a cell, by recognizing defective cells, such as overheating subsequent to a situation of short-circuit, ingress of moisture, electrical arcing, flame, isolation defect, on the basis of the quantity measured at the level of a cell, so as to disconnect or discard from the overall operation of the photovoltaic energy generation device the cell concerned, by opening its cell switch and/or by closing the module switch concerned.

The photovoltaic energy generation device management method can implement the following steps:
  mutual balancing of the modules and/or cells, using by priority the modules and/or cells whose voltage is the highest; and/or
  balancing of the modules and/or cells by modifying the mean rate of use of the modules and/or cells, but without using the same modules and/or cells permanently, so that the voltage of the modules and/or cells balances.

The method for managing a photovoltaic energy generation device can comprise a step of supplying electrical power to a control circuit of a cell switch on the basis of at least one cell of the photovoltaic energy generation device.

The method for managing a photovoltaic energy generation device can comprise a step of supplying electrical power to all the other electronic components internal to the photovoltaic energy generation device requiring power supply by at least one cell of the photovoltaic energy generation device.

The method for managing a photovoltaic energy generation device can comprise a step of communication by carrier current between a processing circuit of a module and that of another module or a central computer or a load.

The method for managing a photovoltaic energy generation device can comprise a step of regulating the output voltage of the photovoltaic energy generation device which comprises a step of opening/closing cell switches of the photovoltaic energy generation device so as to follow an imposed output voltage setpoint.

The method for managing a photovoltaic energy generation device can comprise a step of disconnecting all the cells of the photovoltaic energy generation device in case of prolonged shutdown of the photovoltaic energy generation device or of incident.

The method for managing a photovoltaic energy generation device can comprise a step of diagnosing the operation of all or some of the cell switches and/or module switches and/or parallel switches.

The method for managing a photovoltaic energy generation device can comprise a step of computing the number of subsets of the photovoltaic energy generation device to be disposed in parallel or in series.

The method for managing a photovoltaic energy generation device can comprise a step of identifying the characteristics of at least one photovoltaic cell and/or of the sunshine by opening over a predefined period at least one cell switch so as to measure the no-load voltage of the photovoltaic cell or by closing at least one cell switch and a parallel switch or module switch in such a way as to short-circuit the photovoltaic cell so as to measure the short-circuit current of the said photovoltaic cell.

These objects, characteristics and advantages of the present invention will be set forth in detail in the following description of particular embodiments given without limiting effect in conjunction with the attached figures among which:

FIG. 1 schematically represents the use of a photovoltaic energy generation device according to a prior art.

Figure 6:
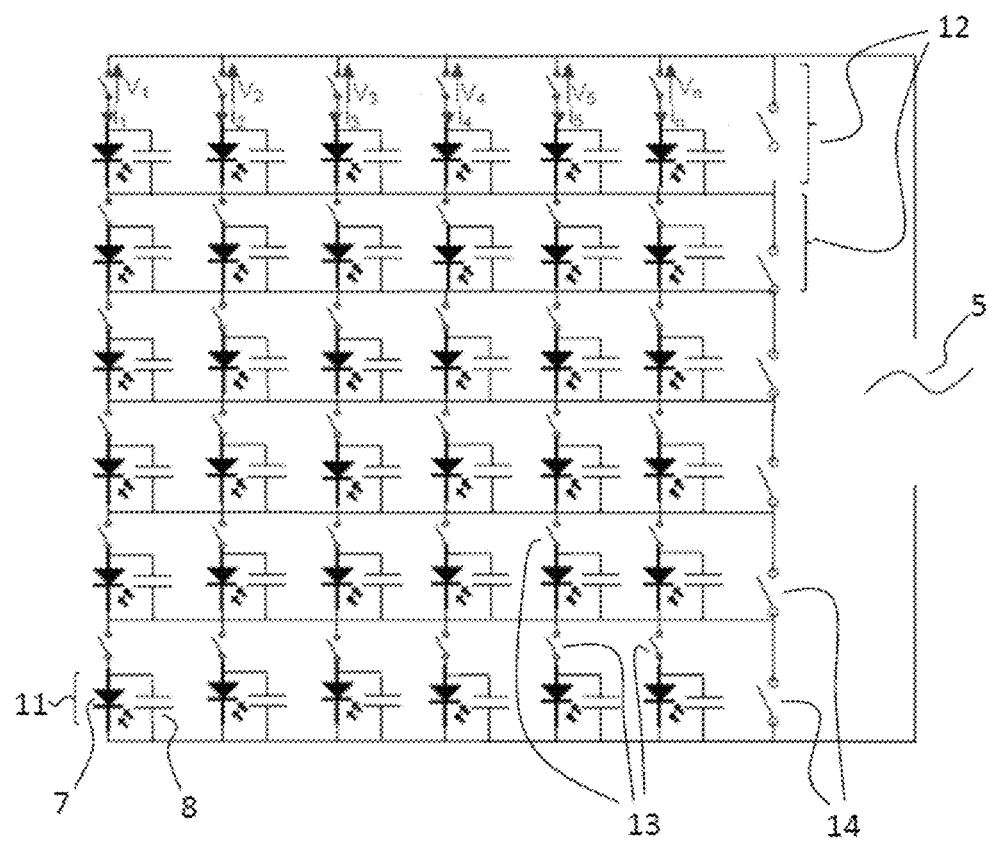

FIG. 6 schematically represents a photovoltaic energy generation device according to one embodiment of the invention.

Figure 7:
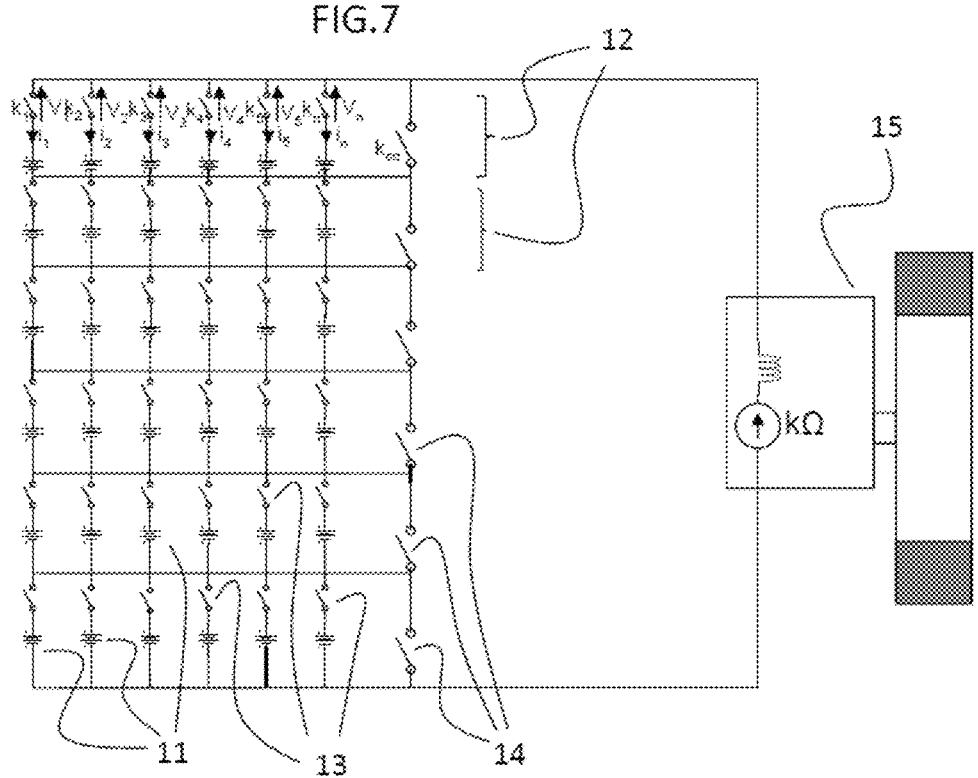

FIG. 7 represents another schematic illustration of the same photovoltaic energy generation device according to one embodiment of the invention.

Figure 8:
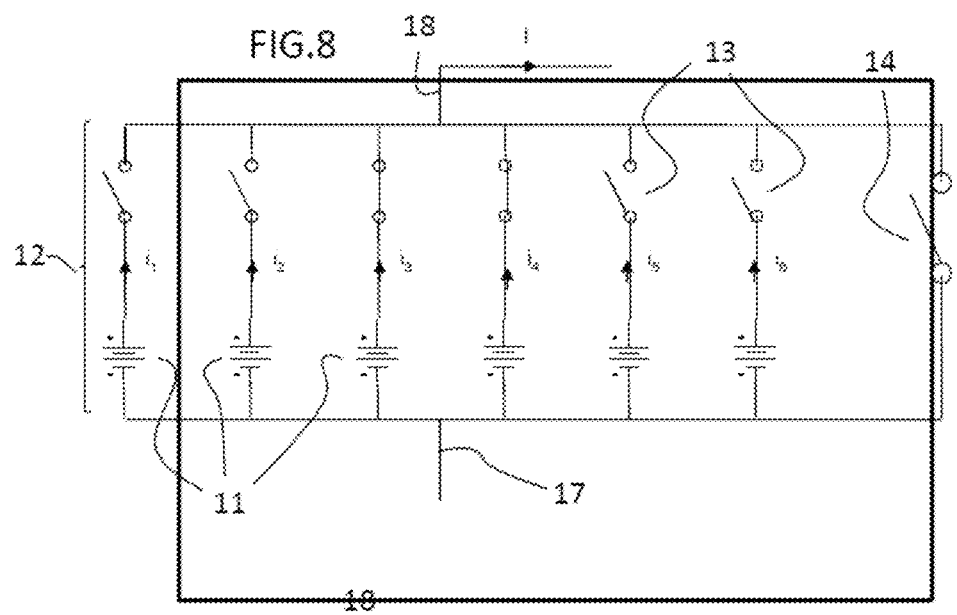

FIG. 8 schematically represents a module of the photovoltaic energy generation device according to the embodiment of the invention.

Figure 9:
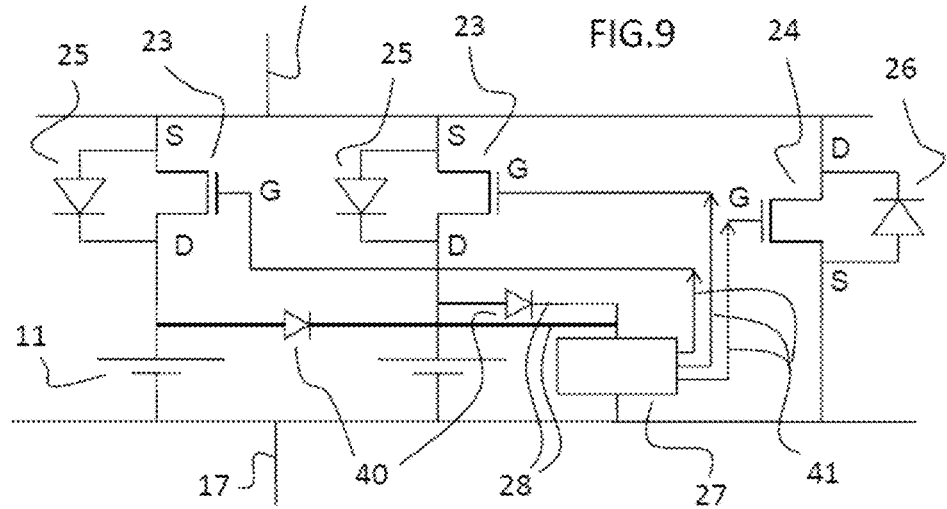

FIG. 9 illustrates more precisely the electrical layout chosen for implementing the module illustrated in FIG. 8.

Figure 10:
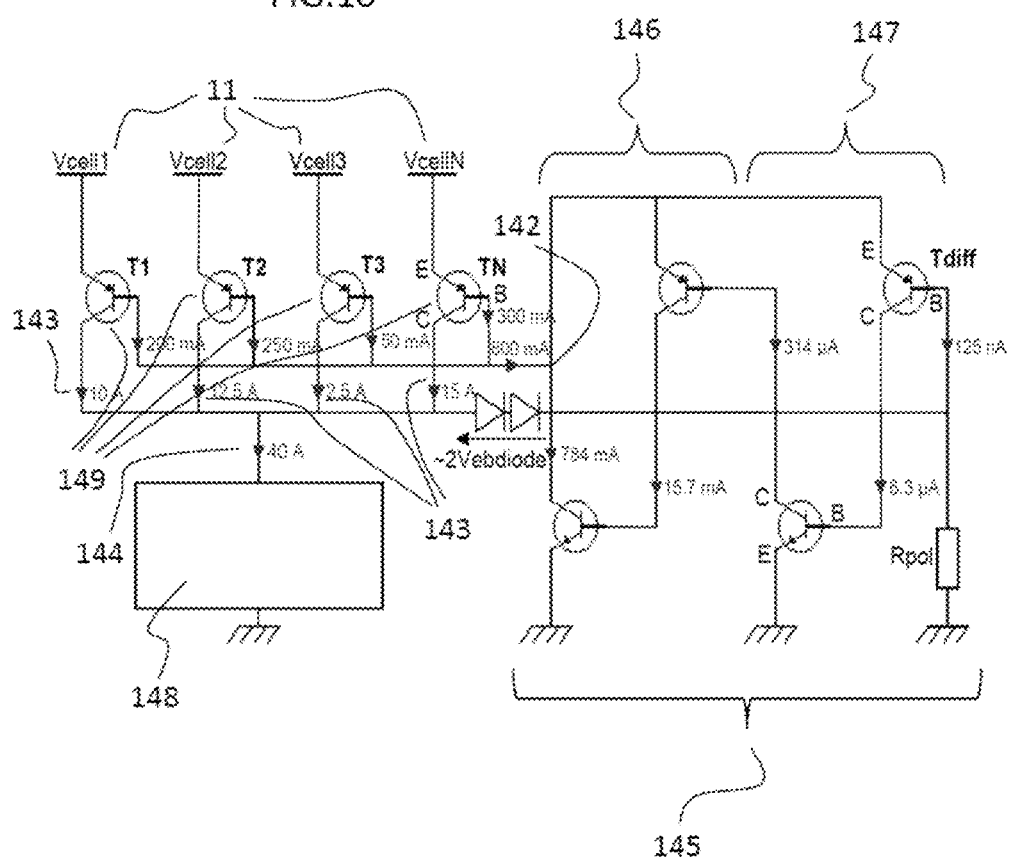

FIG. 10 illustrates the electrical layout for implementing the module illustrated in FIG. 8 according to a variant embodiment.

Figure 11:
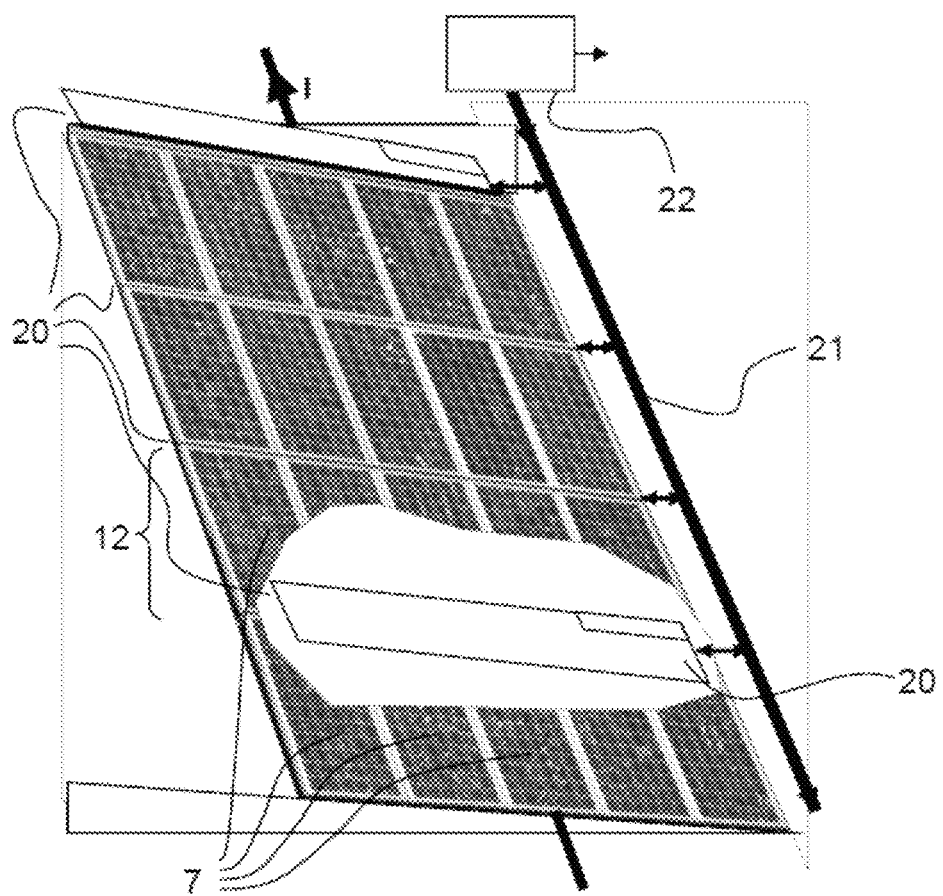

FIG. 11 represents the physical implementation of the electrical functions of the invention in the architecture of a photovoltaic energy generation device according to one embodiment of the invention.

FIG. 12 illustrates more precisely the components present on each electronic card of the embodiment of the invention.

Figure 13A:
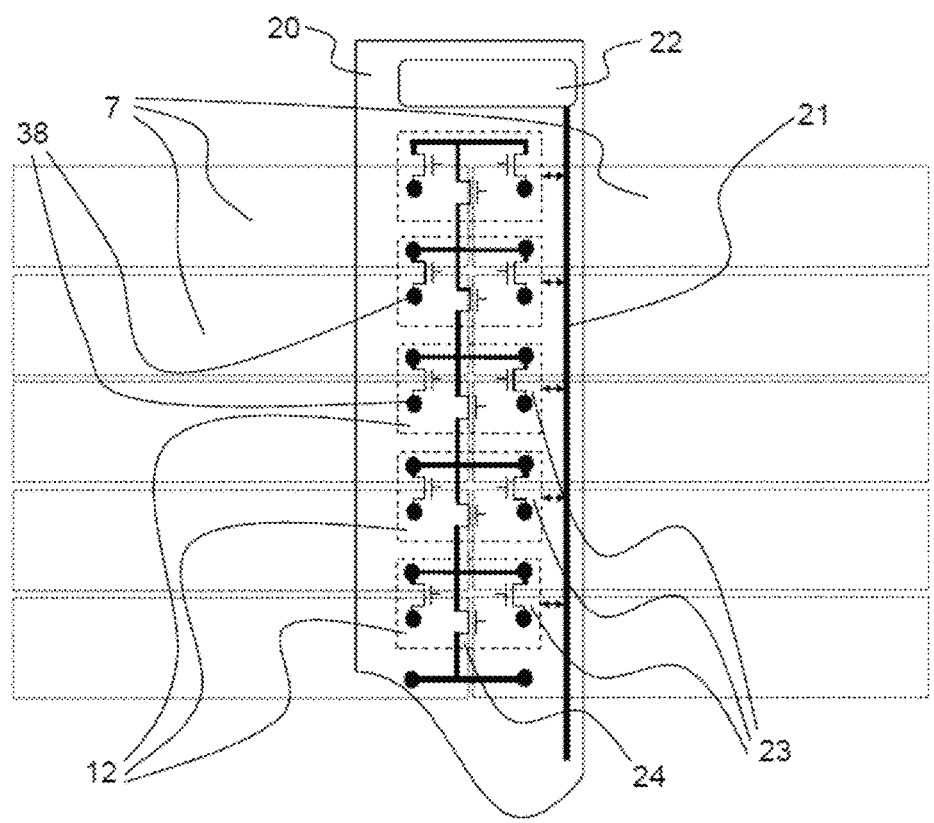

FIGS. 13a to 13c illustrate a variant embodiment of the embodiment of the invention.

Figure 14:
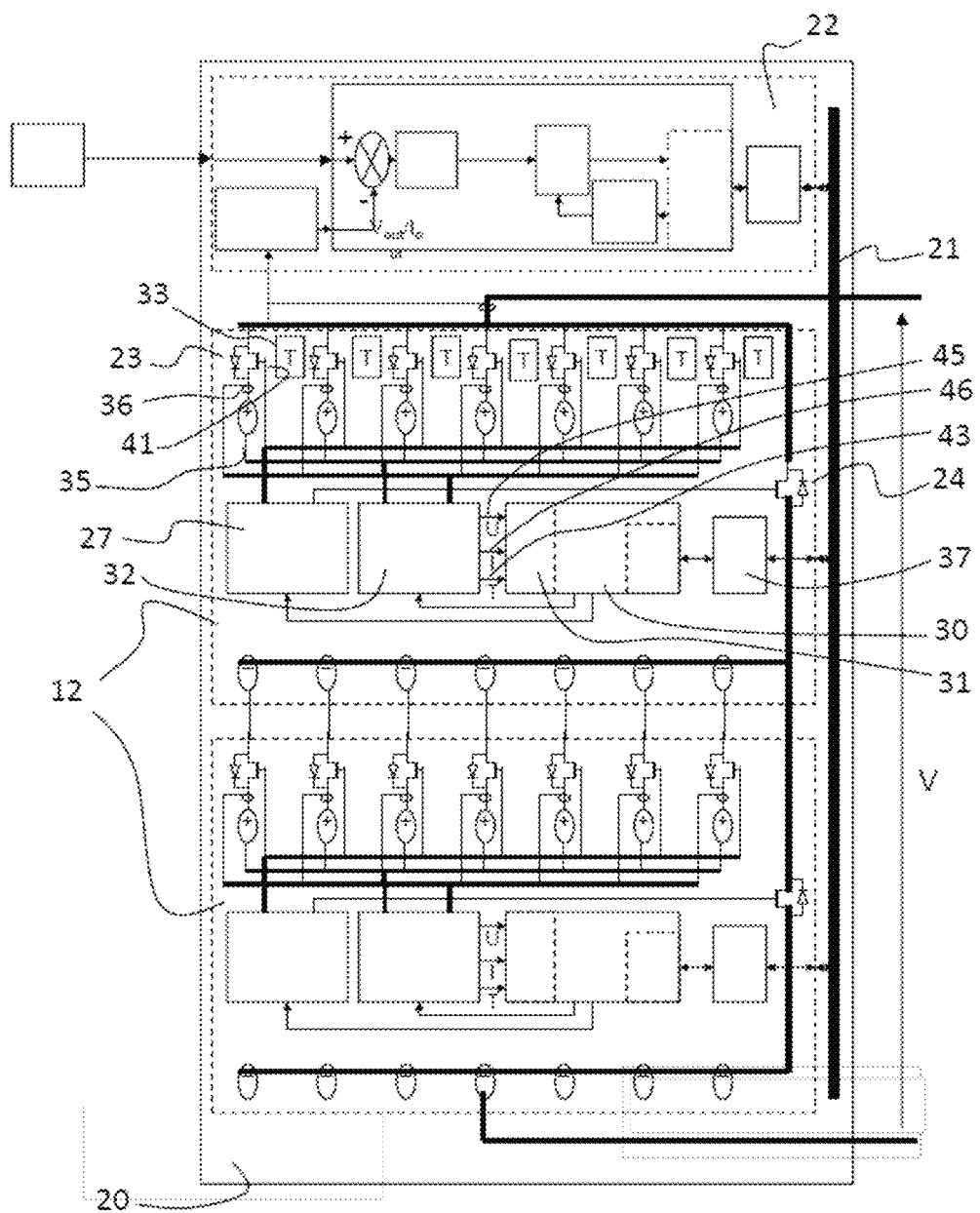

FIG. 14 represents in a more detailed manner the architecture of the electronic card according to this variant embodiment of the embodiment of the invention.

Figure 15:
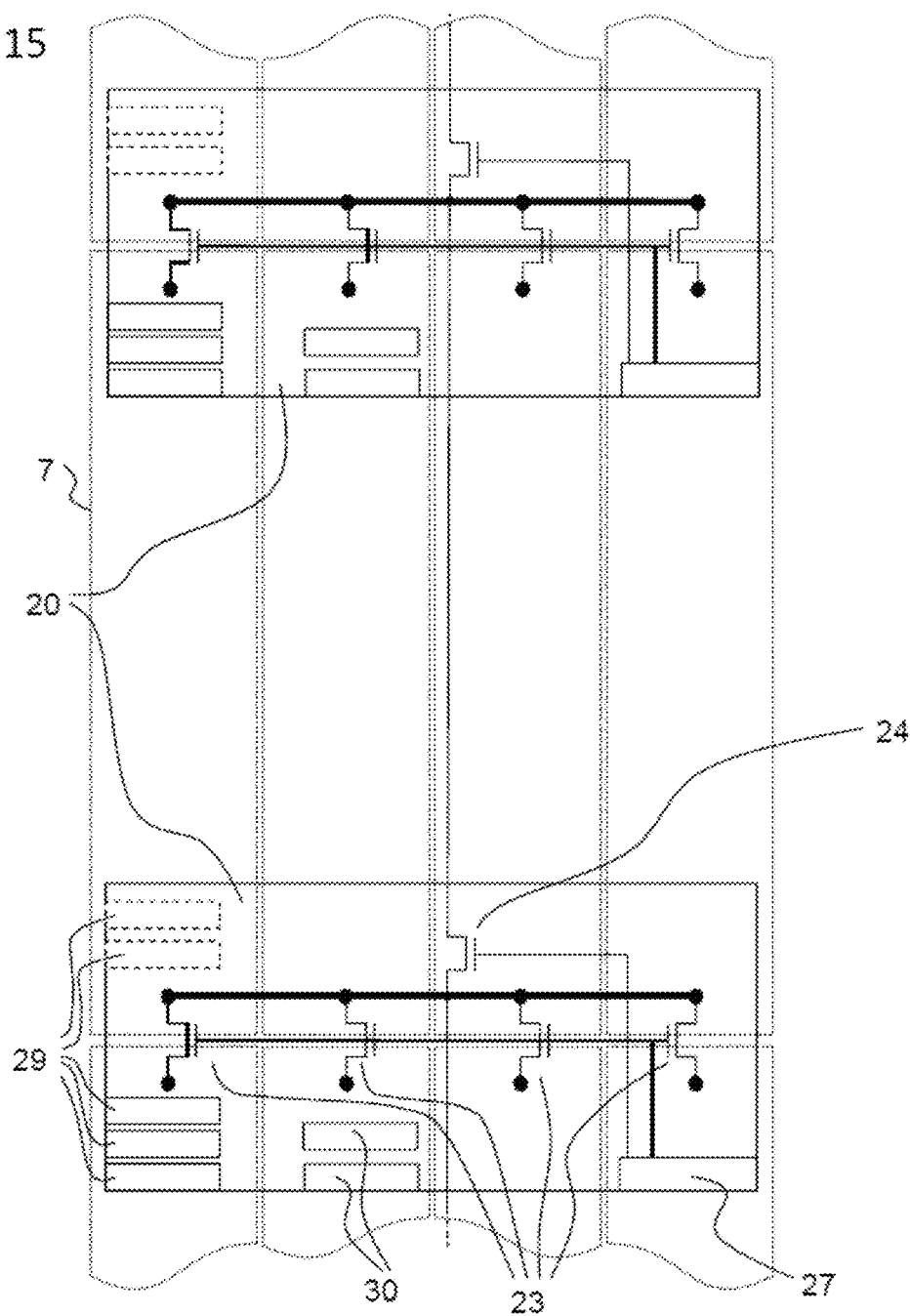

FIG. 15 illustrates a second variant embodiment of the embodiment of the invention.

FIG. 16 represents in a more detailed manner the architecture of the electronic card associated with a module according to this second variant embodiment of the embodiment of the invention.

Figure 17A:
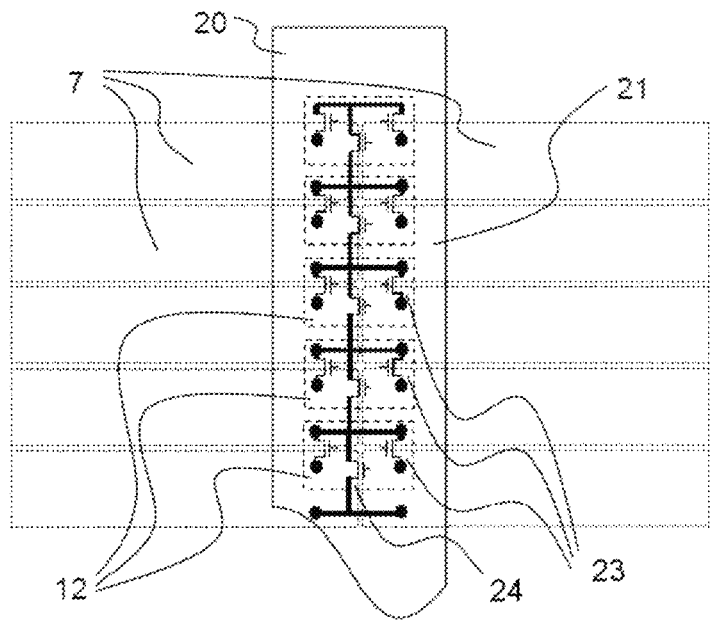
Figure 17B:
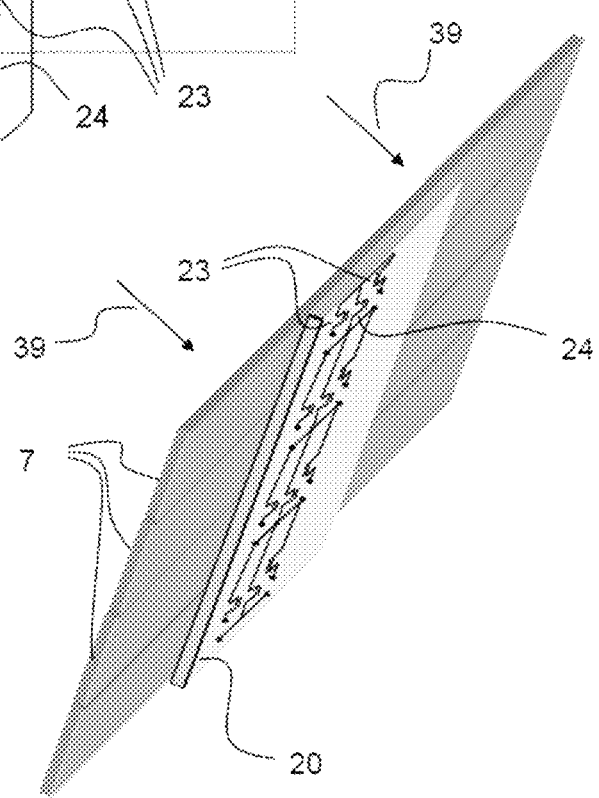

FIGS. 17a and 17b illustrate a third variant embodiment of the embodiment of the invention.

Figure 18:
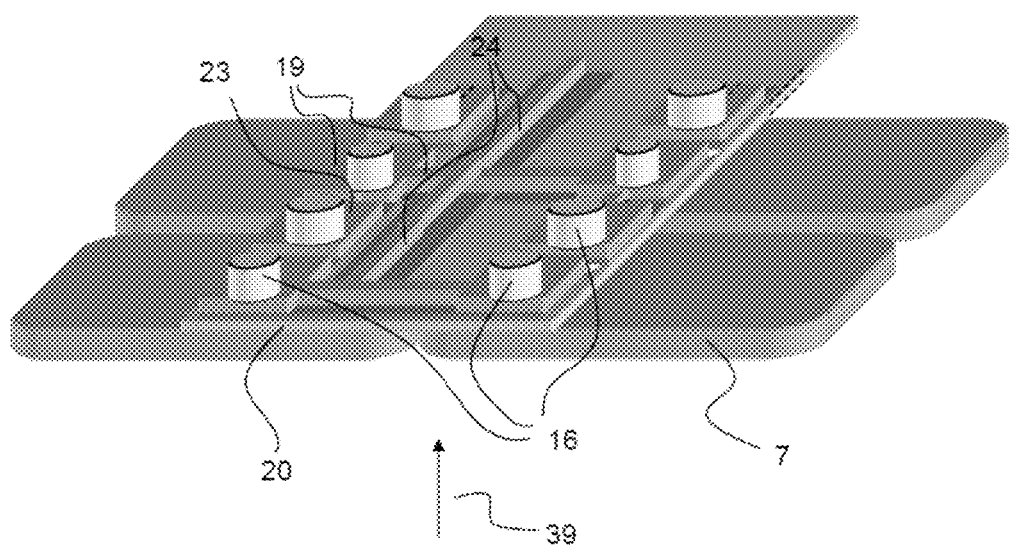

FIG. 18 illustrates a variant embodiment of an electronic card of the embodiment of the invention.

Figure 19:
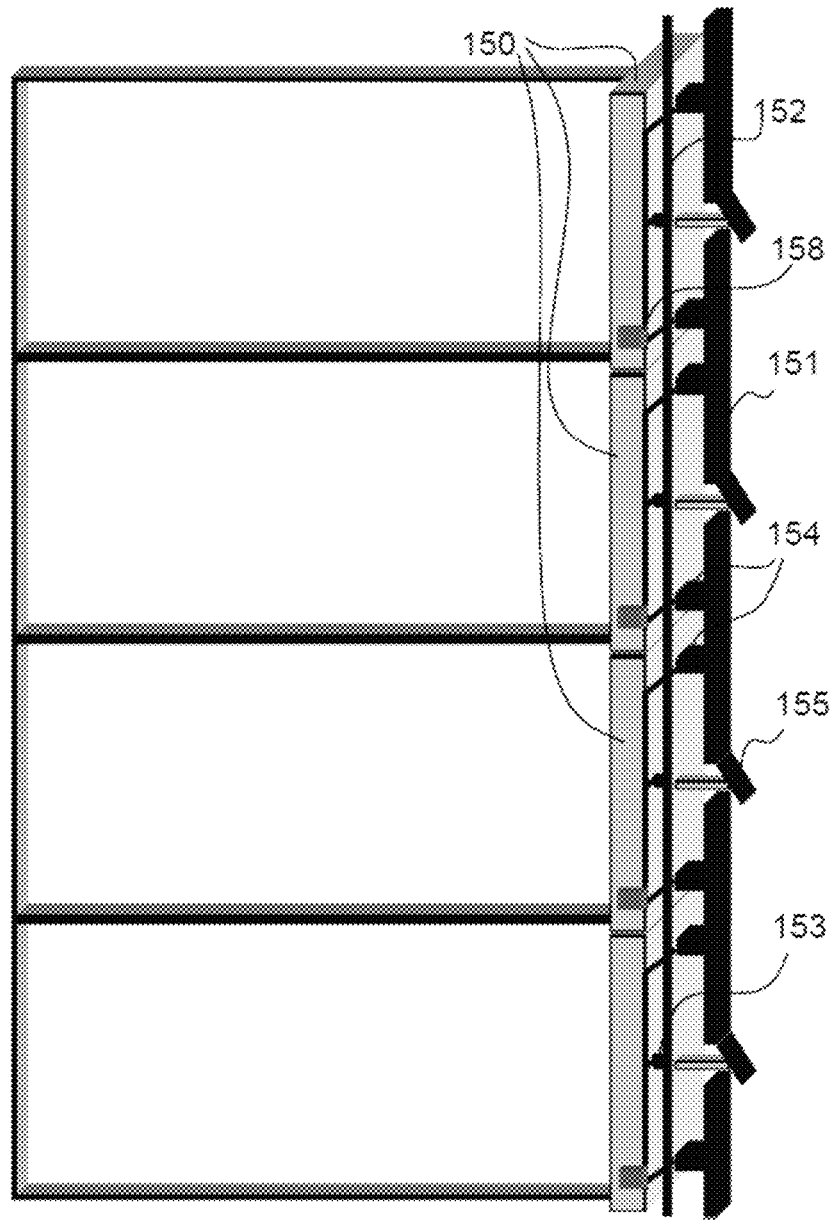

FIG. 19 illustrates an embodiment of a frame incorporating a photovoltaic energy generation device according to the invention.

Figure 20:
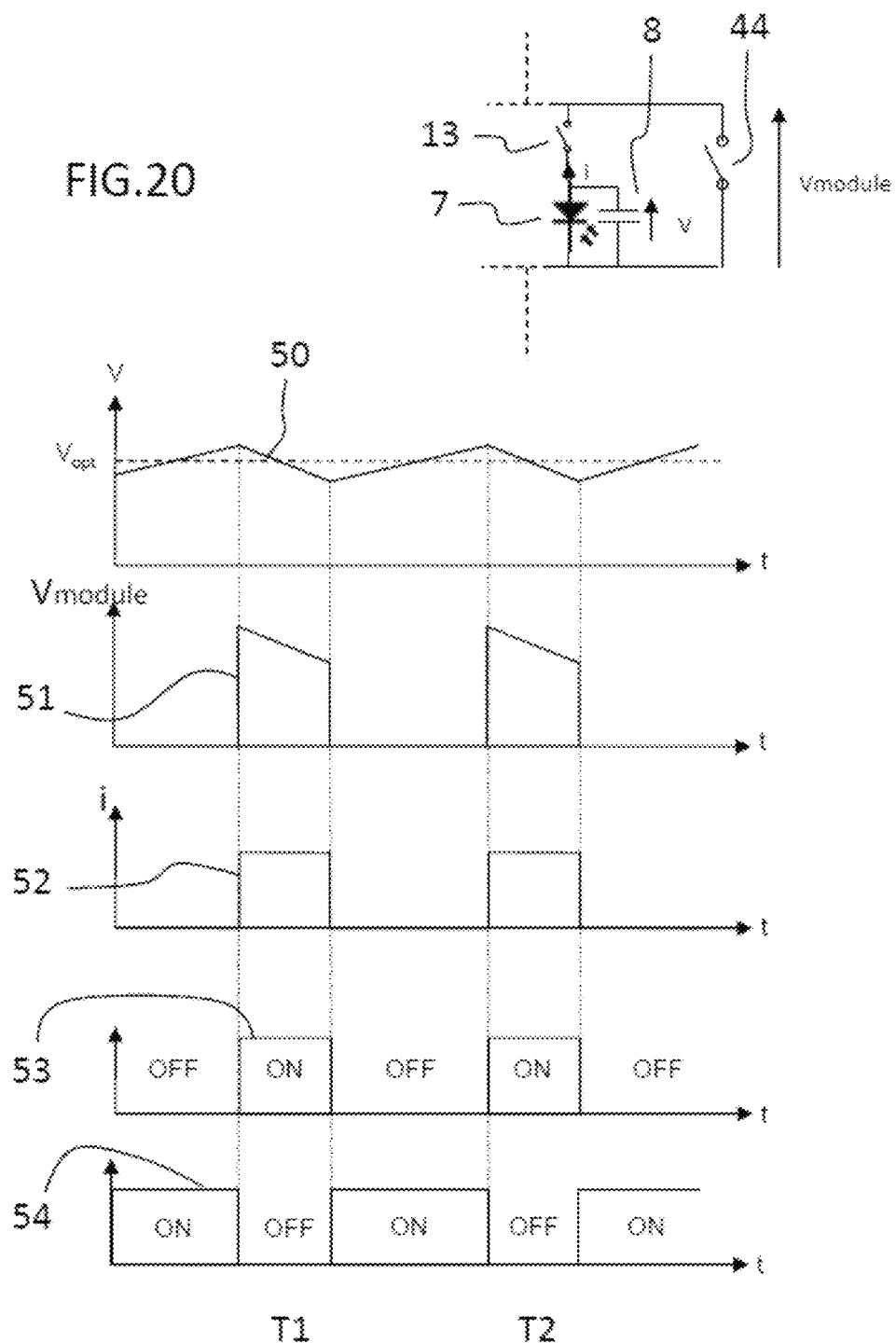

FIG. 20 illustrates the steps of a method for managing a cell of a photovoltaic energy generation device according to one embodiment of the invention.

Figure 21:
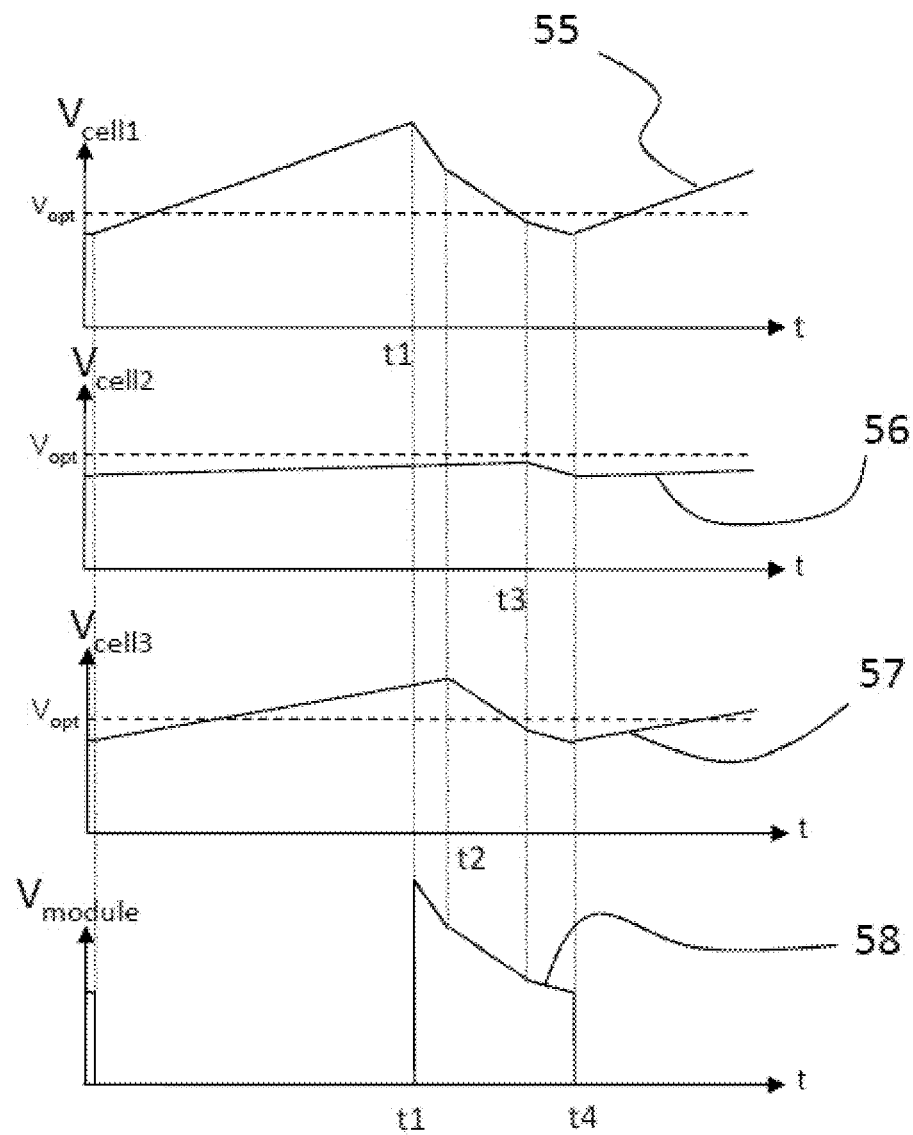

FIG. 21 illustrates the steps of a method for managing a module of a photovoltaic energy generation device according to one embodiment of the invention.

Figure 22:
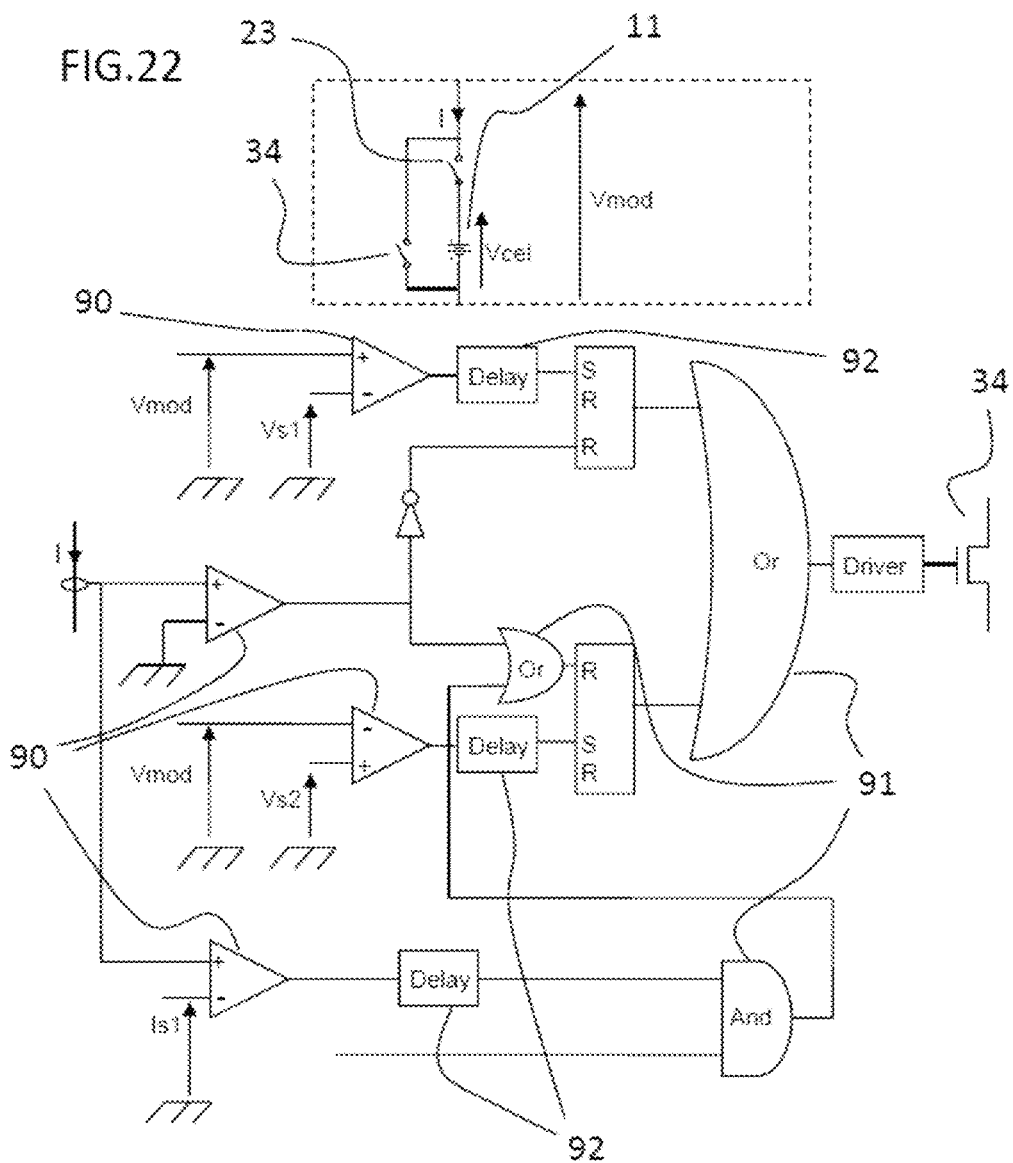

FIG. 22 illustrates the principle of driving a parallel transistor according to one embodiment of the invention.

Figure 23:
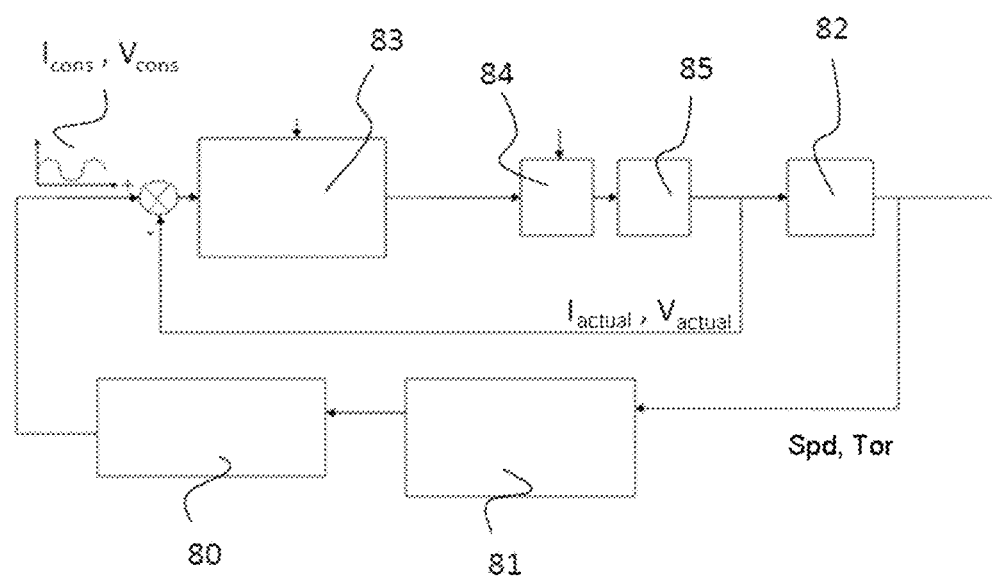

FIG. 23 illustrates an embodiment of a slaved control of the photovoltaic energy generation device according to the invention.

Figure 24:
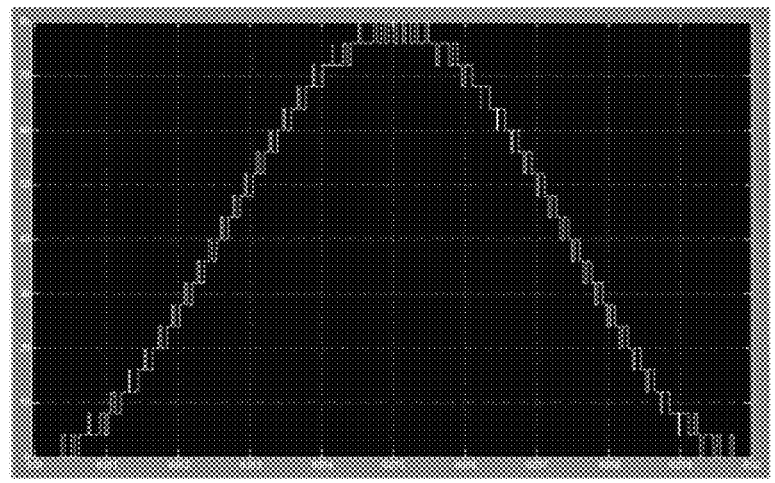

FIG. 24 represents an exemplary voltage which can be provided by the photovoltaic energy generation device according to the invention.

Figure 25:
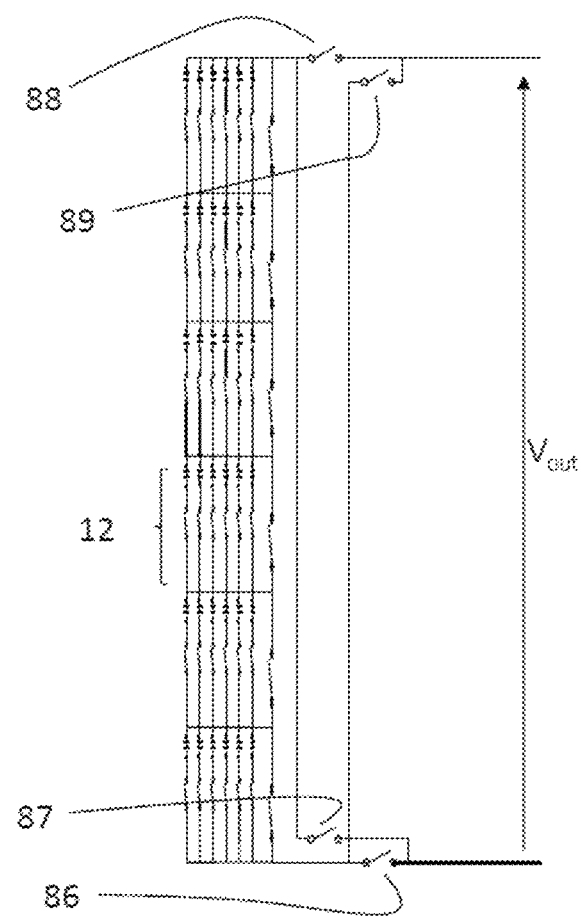

FIG. 25 represents an embodiment of a photovoltaic energy generation device according to the invention exhibiting an H-bridge.

Figure 26:
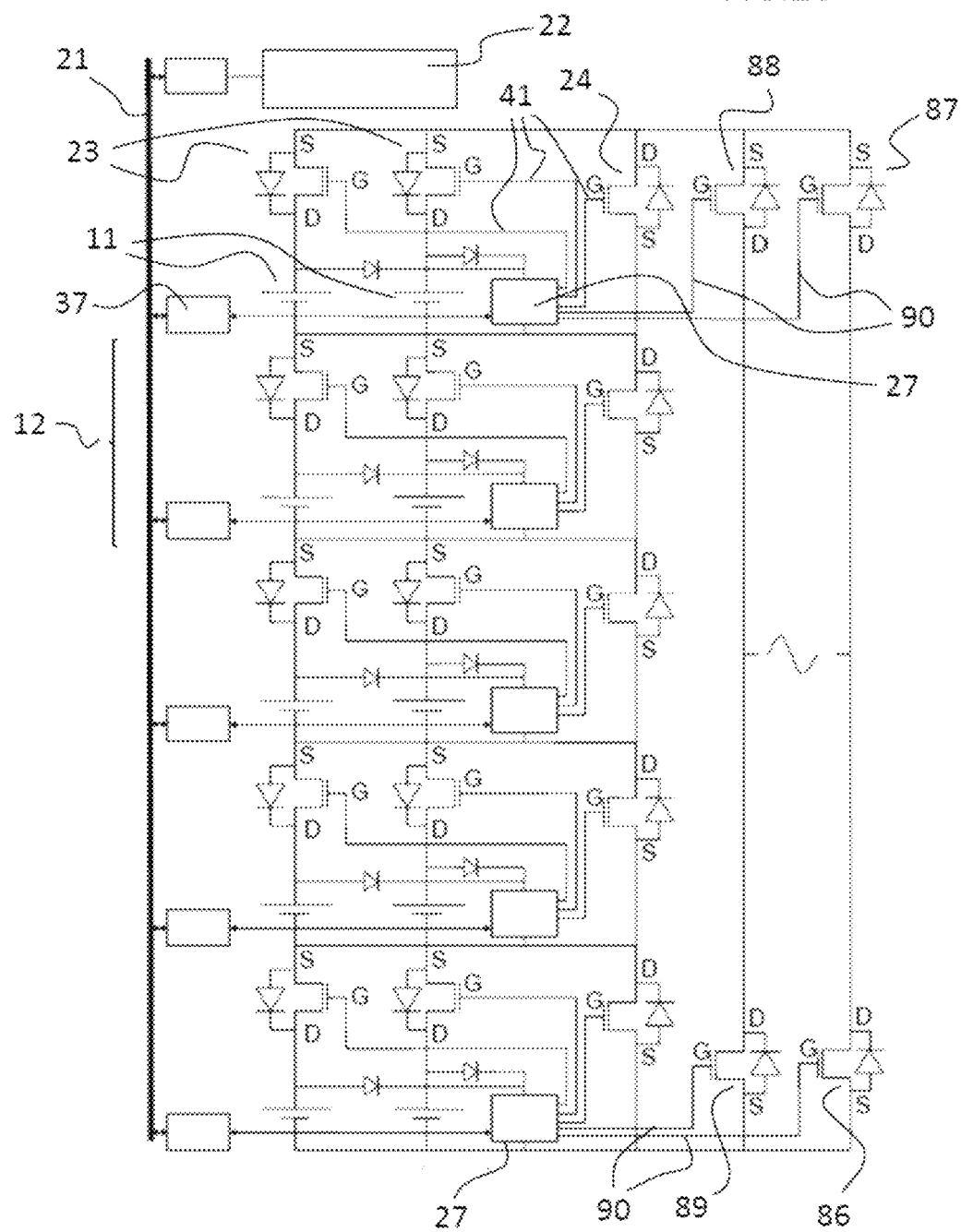

FIG. 26 represents in a more detailed manner the architecture of a photovoltaic energy generation device exhibiting an H-bridge according to one embodiment of the invention.

Figure 27:
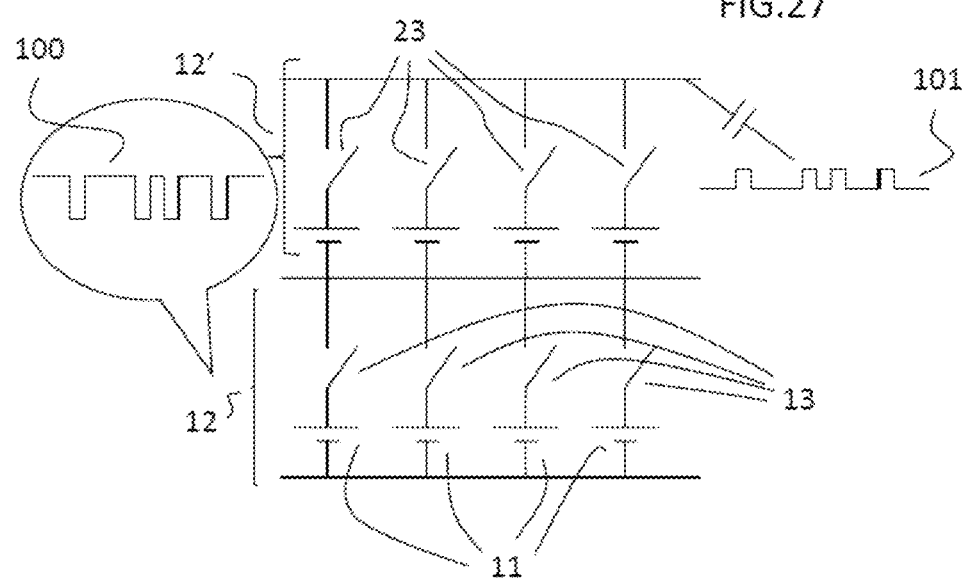

FIG. 27 schematically illustrates the implementation of the principle of communication by carrier current within the photovoltaic energy generation device according to one embodiment of the invention.

Figure 28:
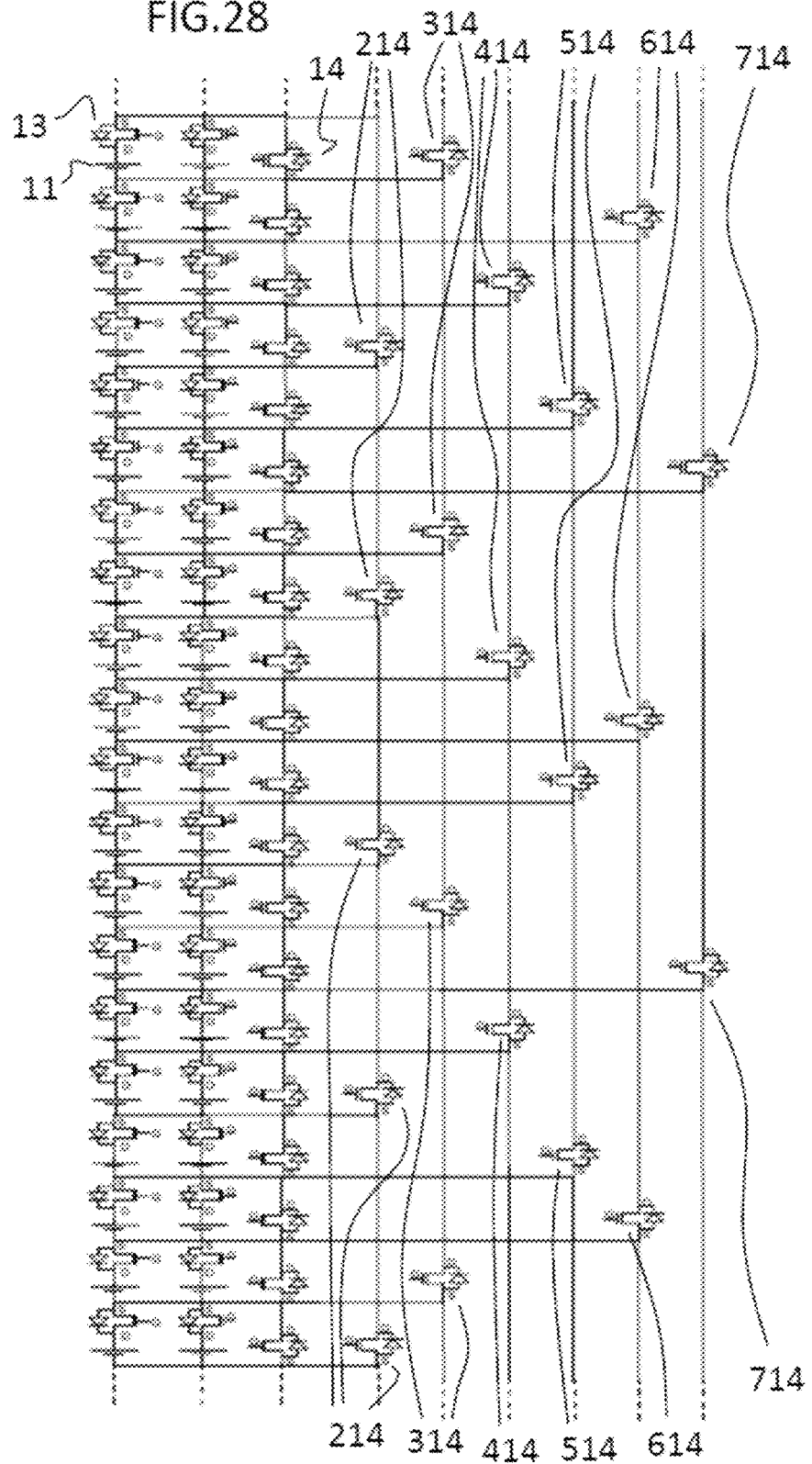
Figure 29:
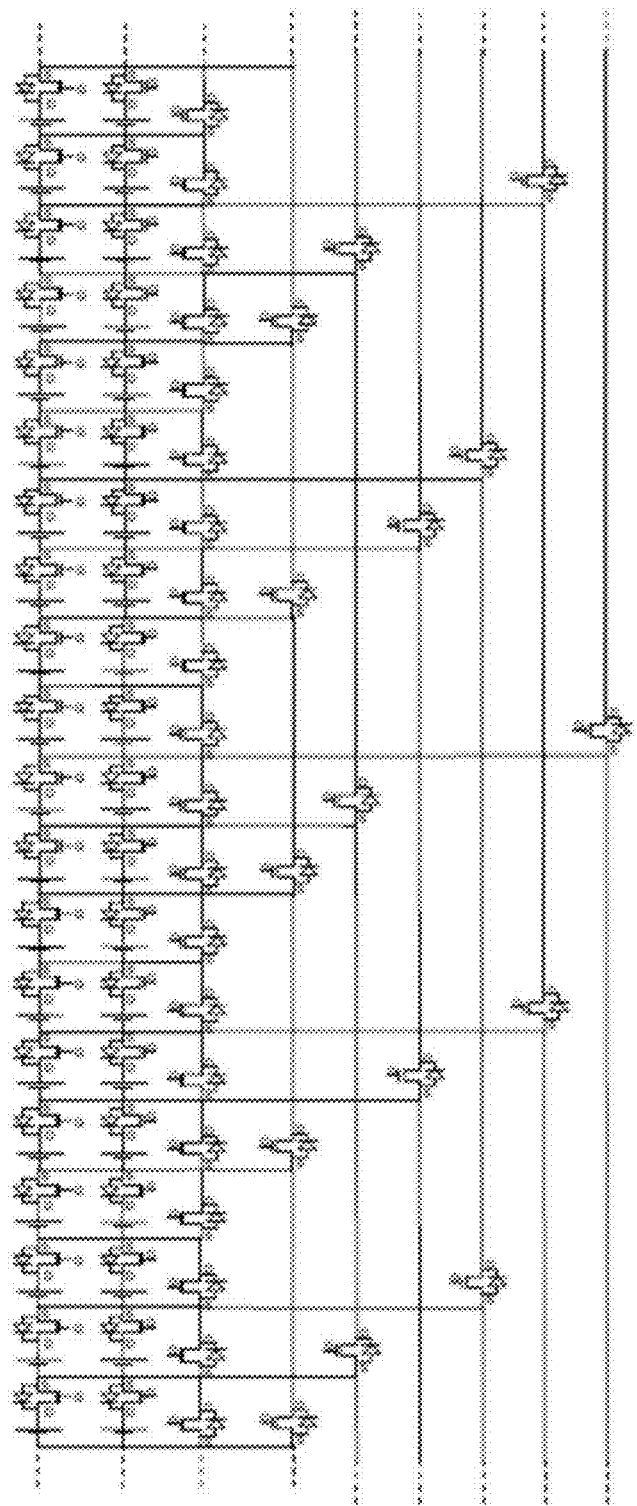
Figure 30:
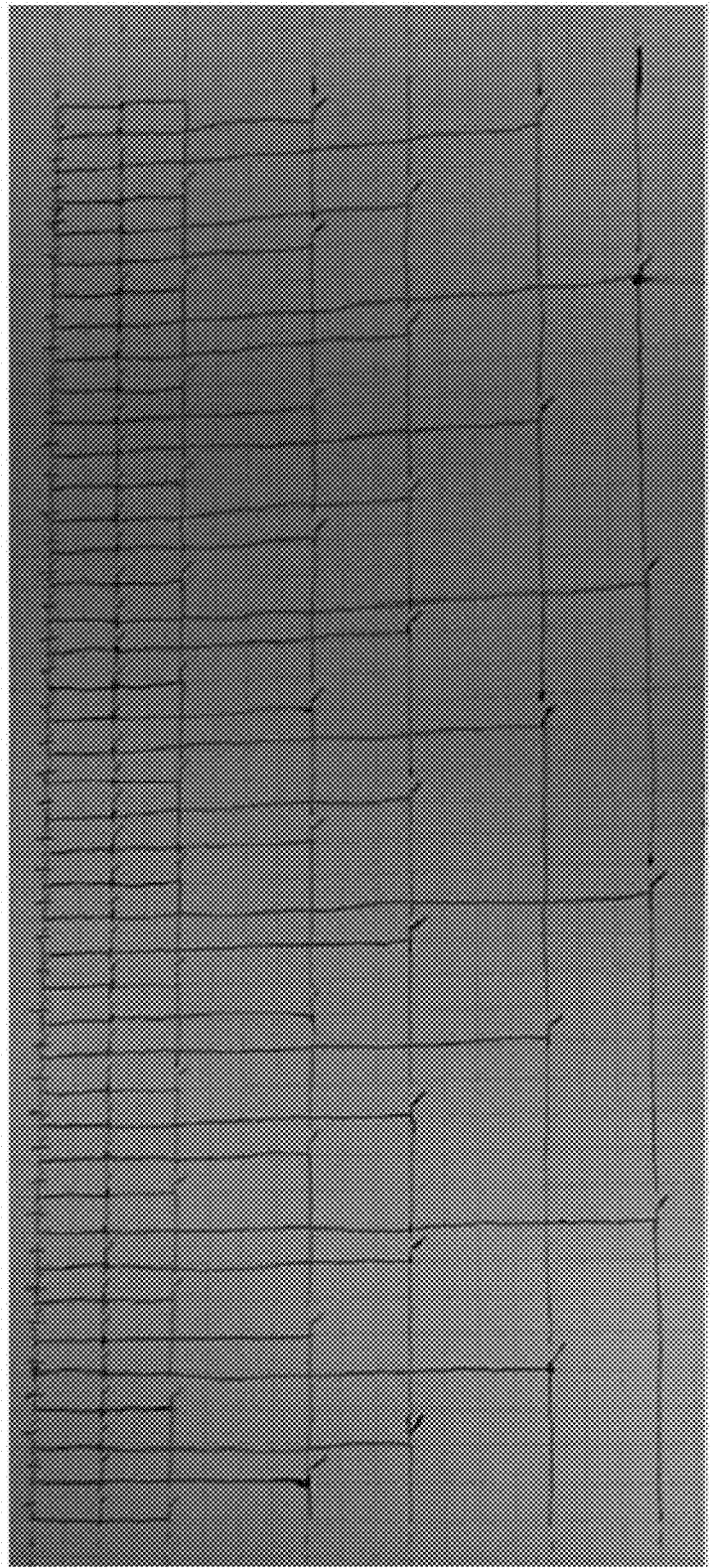

FIGS. 28 to 30 illustrate three variant embodiments of a photovoltaic energy generation device with several distinct parallel switches according to one embodiment of the invention.

Figure 31:
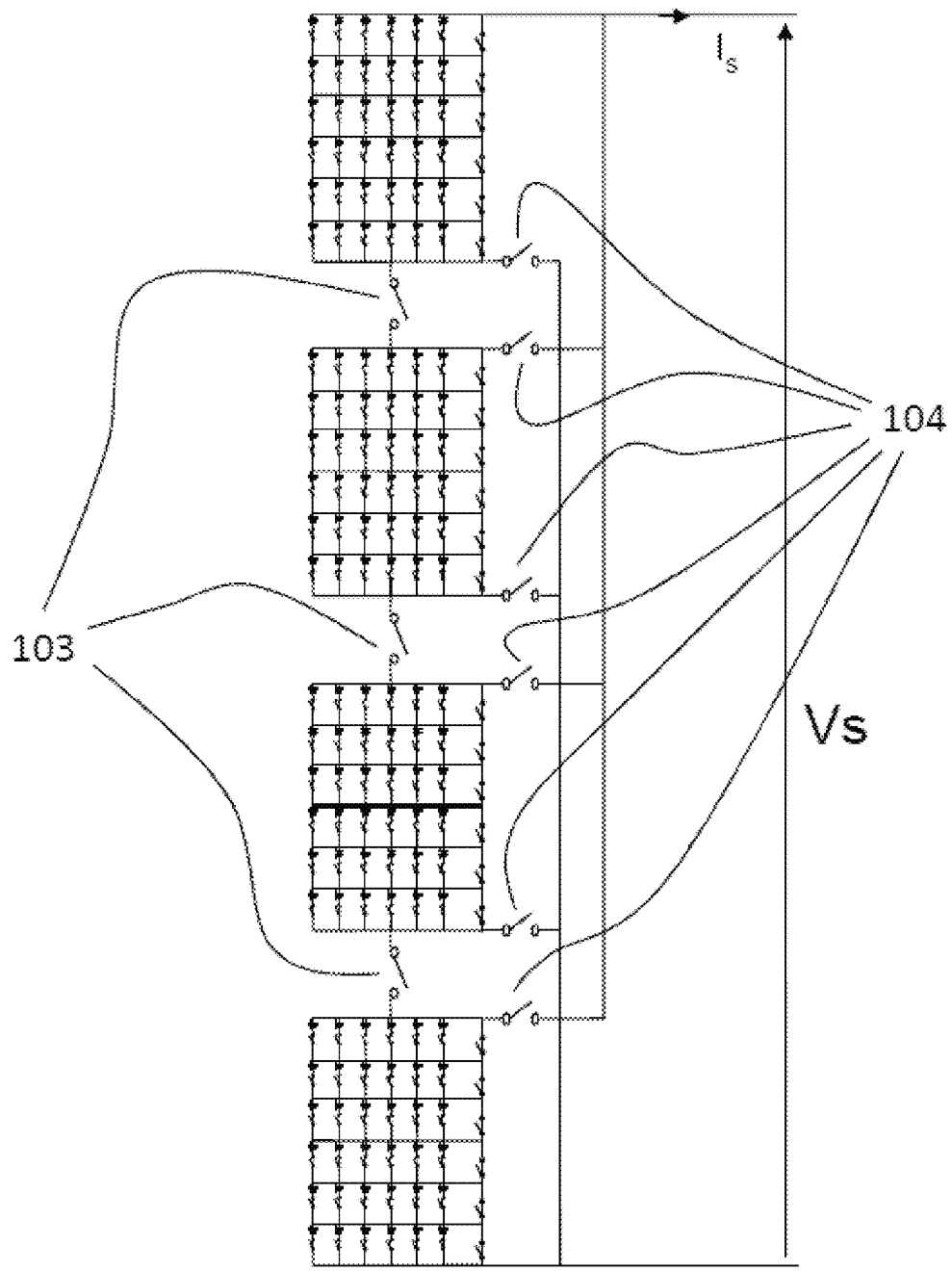

FIG. 31 illustrates an embodiment of the invention, in which the photovoltaic energy generation device is separated into several parts.

Figure 32:
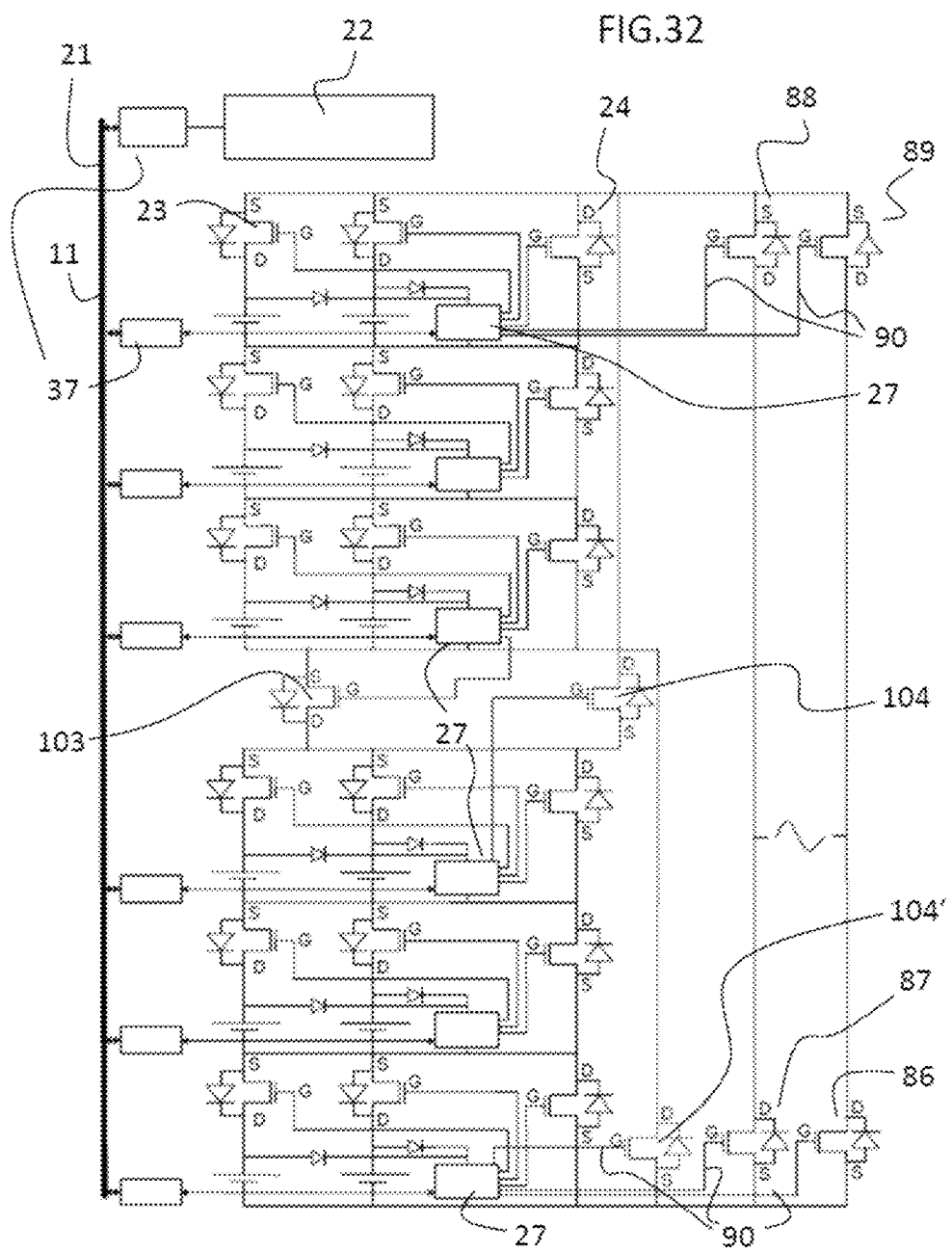

FIG. 32 represents in a more detailed manner the architecture of a photovoltaic energy generation device separated into several parts and exhibiting an H-bridge according to one embodiment of the invention.

Figure 33:
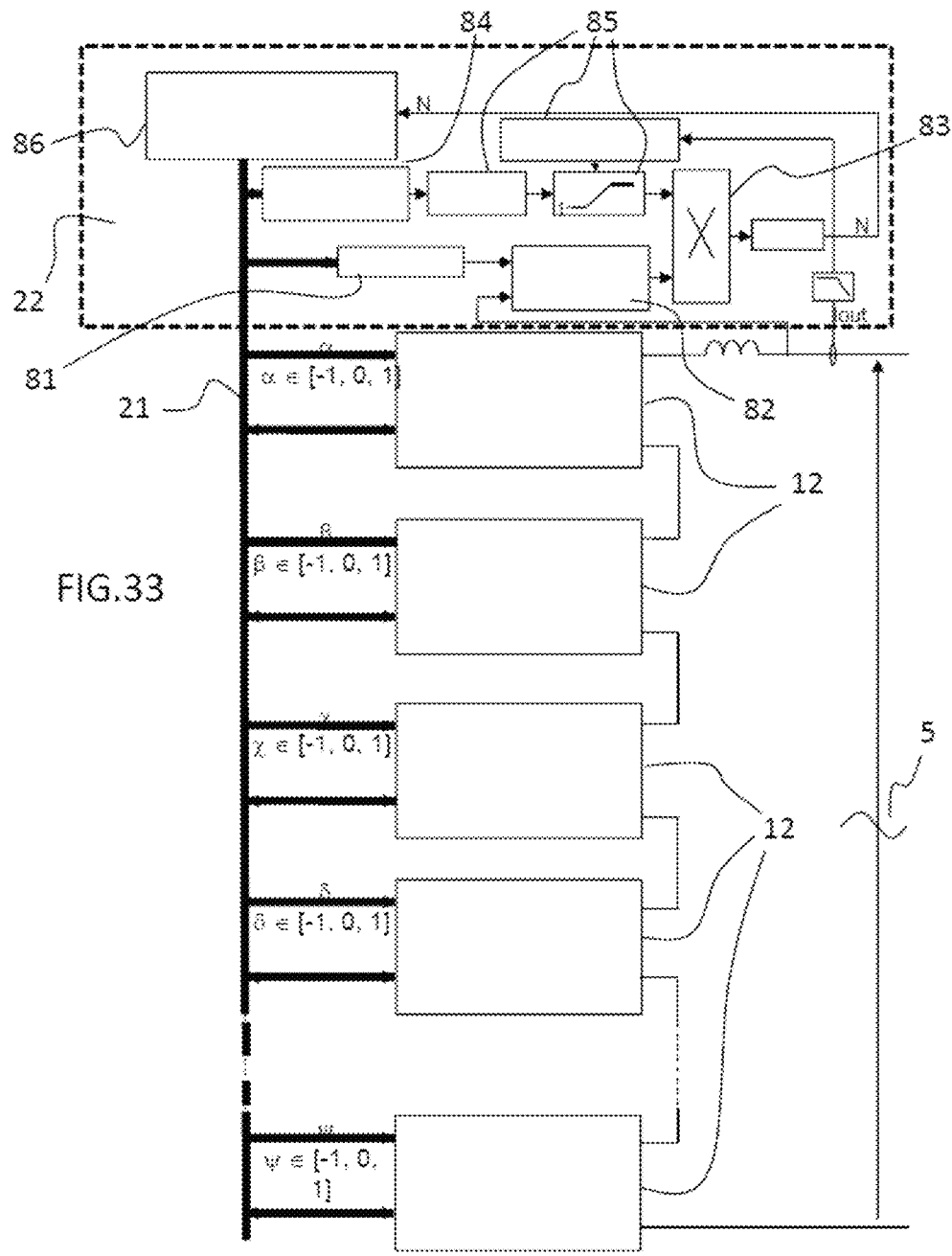

FIG. 33 represents the architecture of a computer implementing a method for managing a photovoltaic energy generation device according to one embodiment of the invention.

Figure 34:
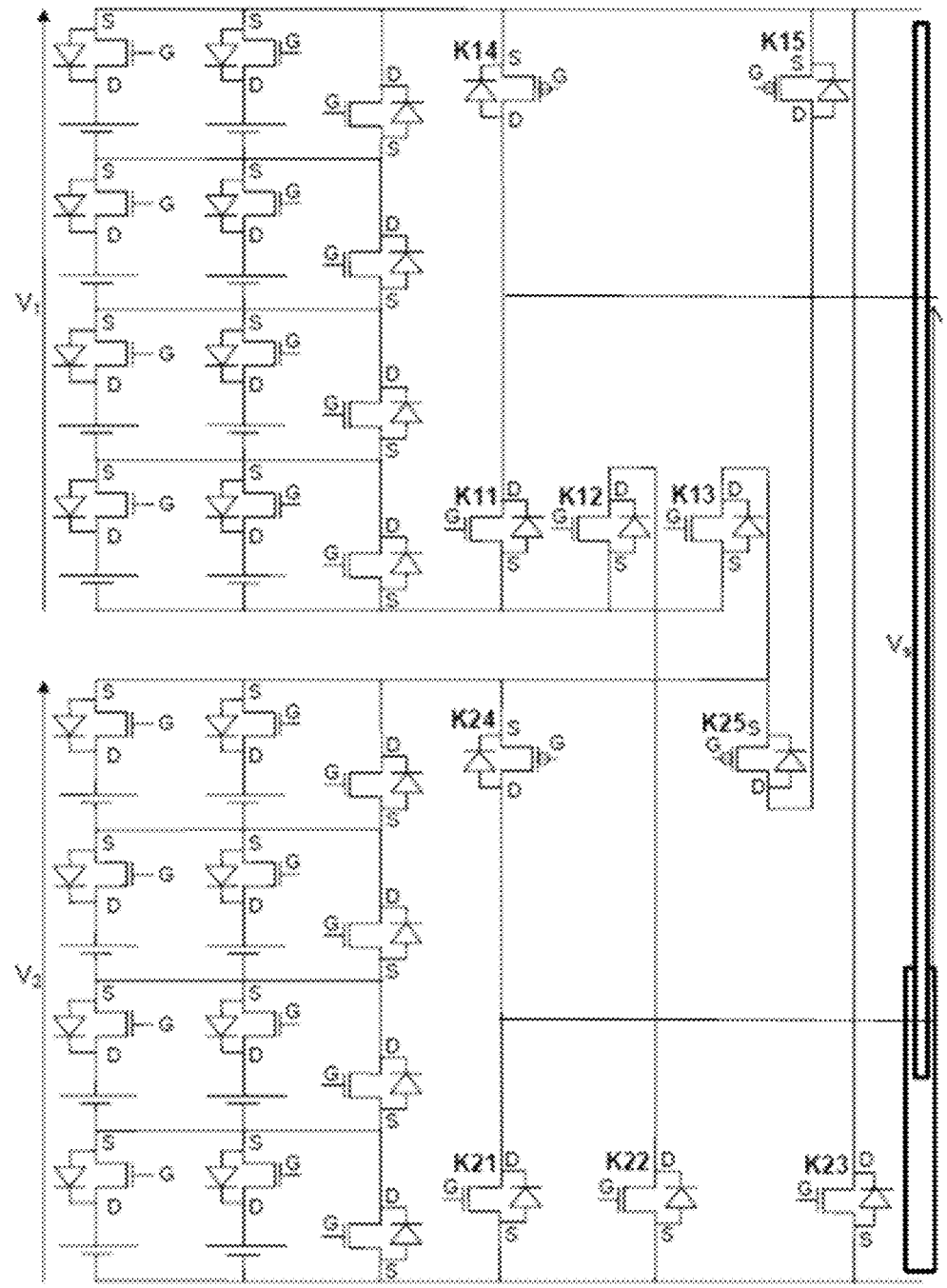

FIG. 34 represents in a more detailed manner a variant architecture of a photovoltaic energy generation device separated into several parts and exhibiting an H-bridge according to one embodiment of the invention.

Figure 35:
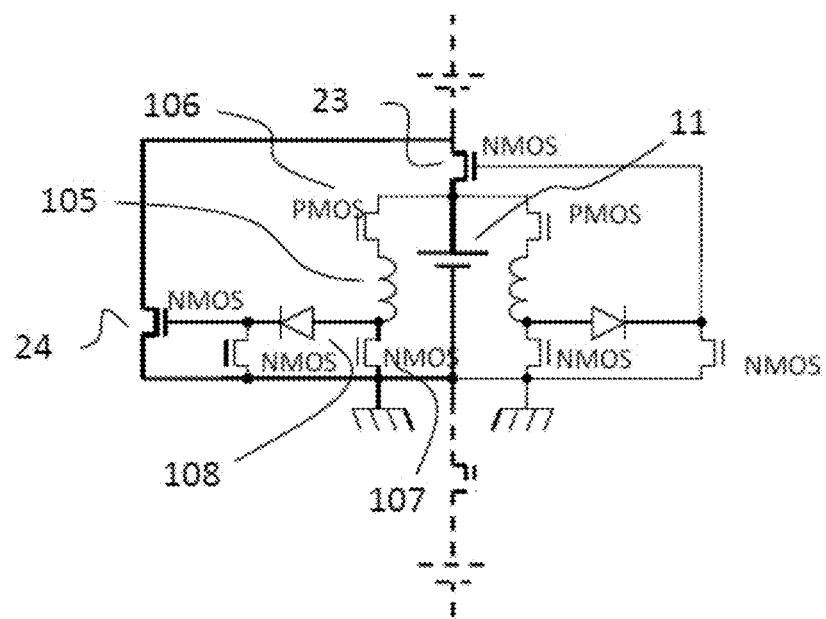

FIG. 35 illustrates a solution for the driving of the series and parallel transistors on the basis of a relatively low voltage arising from the cells.

Figure 36:
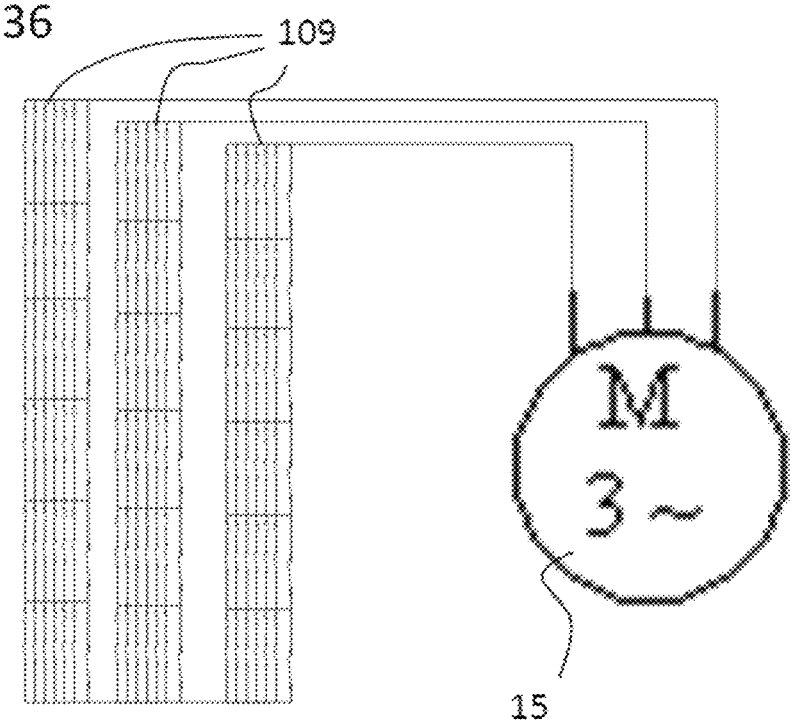

FIG. 36 illustrates a photovoltaic energy generation device comprising three columns according to one embodiment of the invention adapted for delivering three independent voltages with possible inversion of sign.

Figure 37:
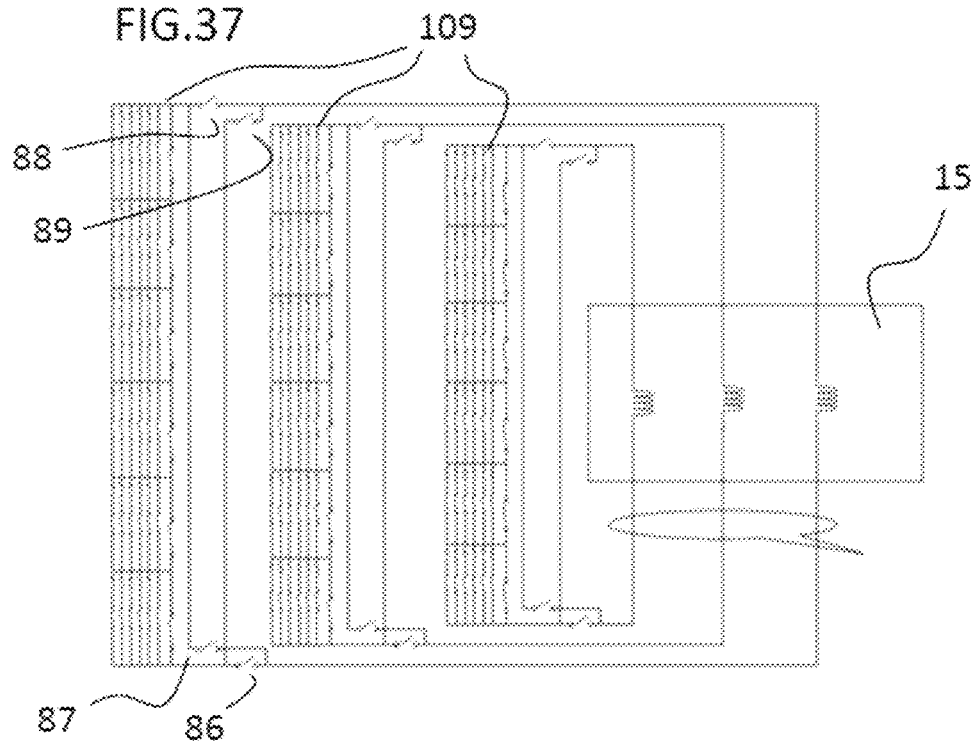

FIG. 37 illustrates a variant embodiment of the photovoltaic energy generation device of FIG. 36 adapted for delivering a three-phase voltage.

Figure 38:
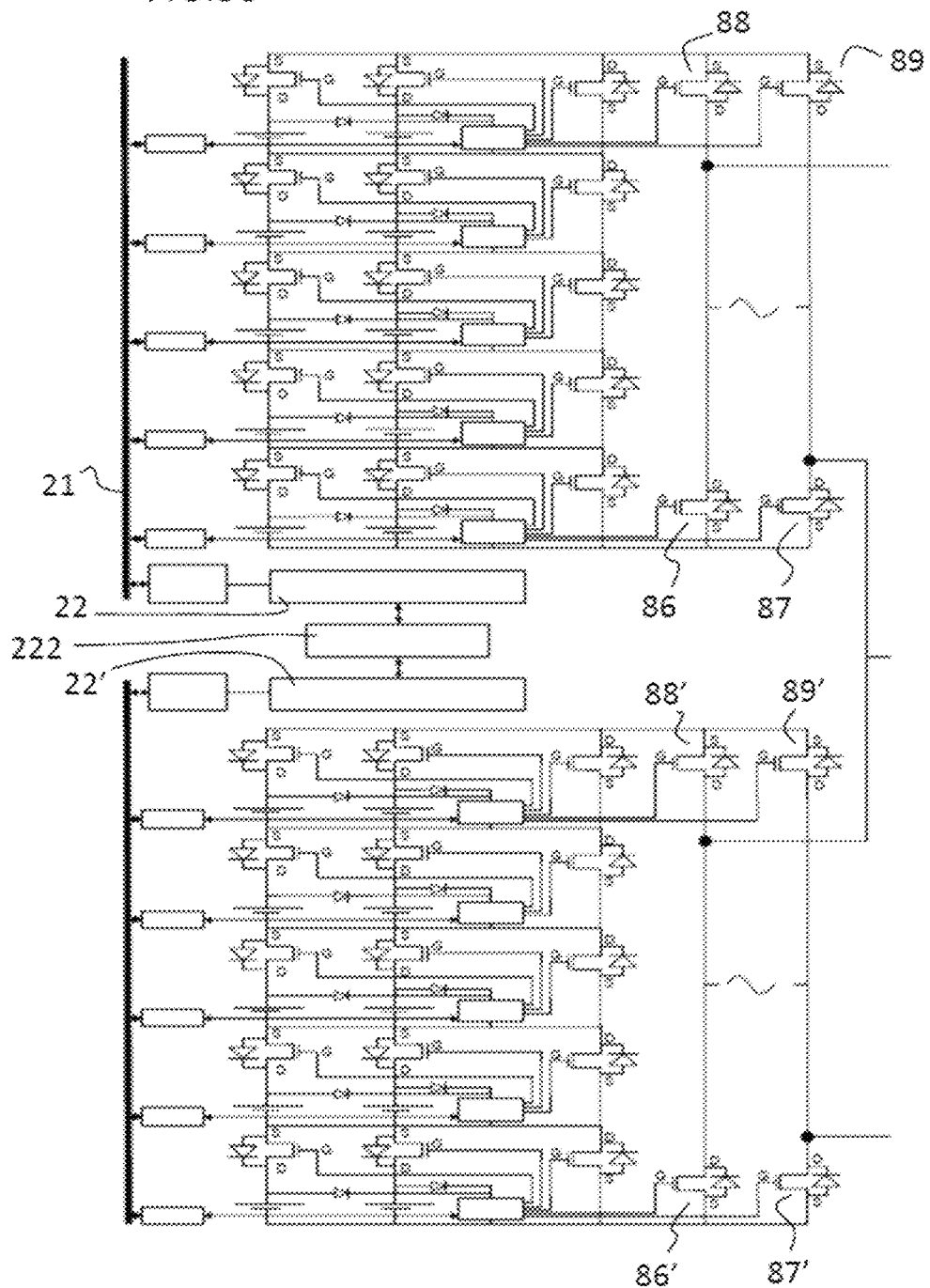

FIG. 38 represents in detail an architecture of a photovoltaic energy generation device delivering a three-phase voltage according to one embodiment of the invention.

Figure 39:
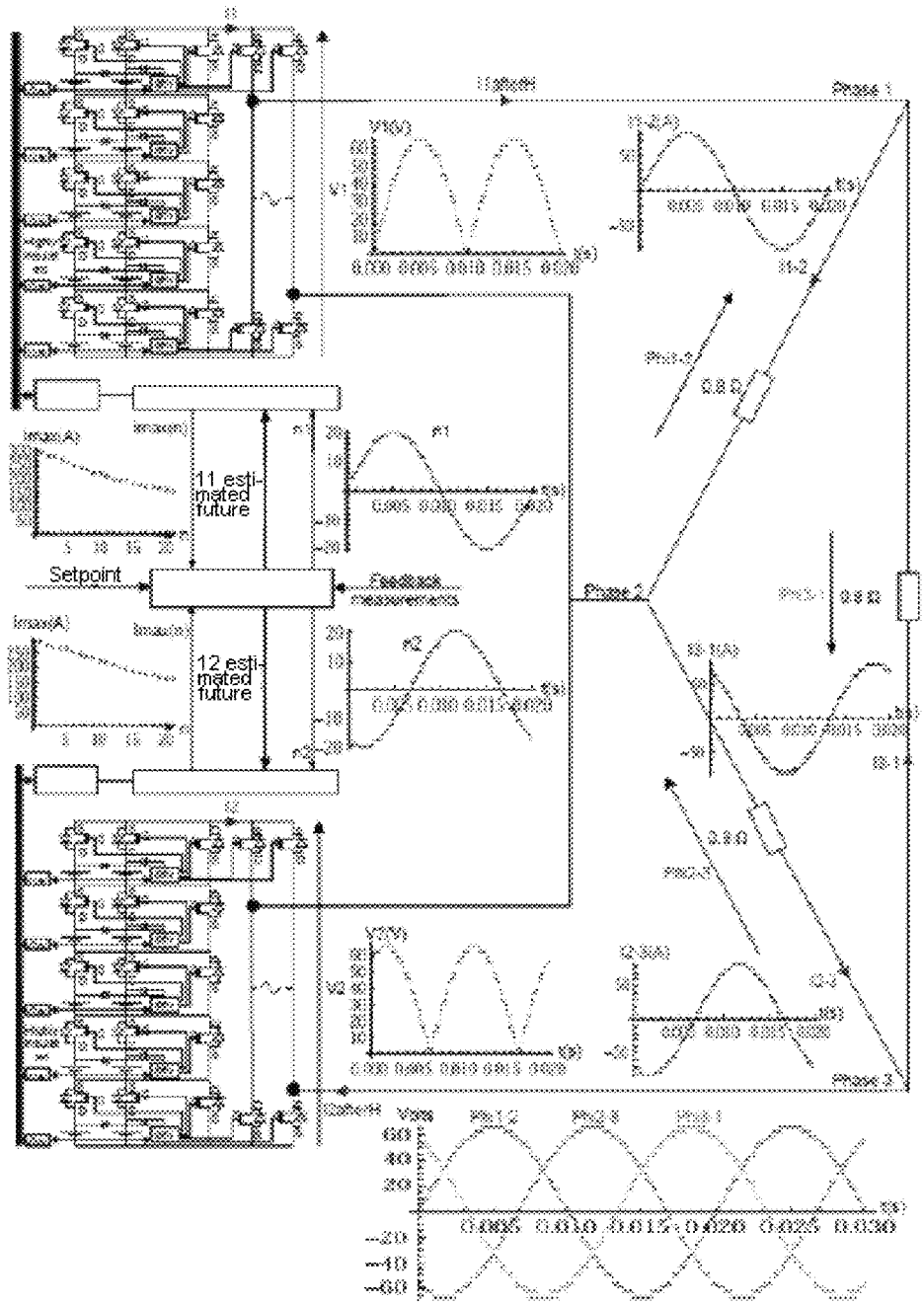

FIG. 39 represents an exemplary operation of the photovoltaic energy generation device of FIG. 38 delivering a three-phase voltage.

Figure 40:
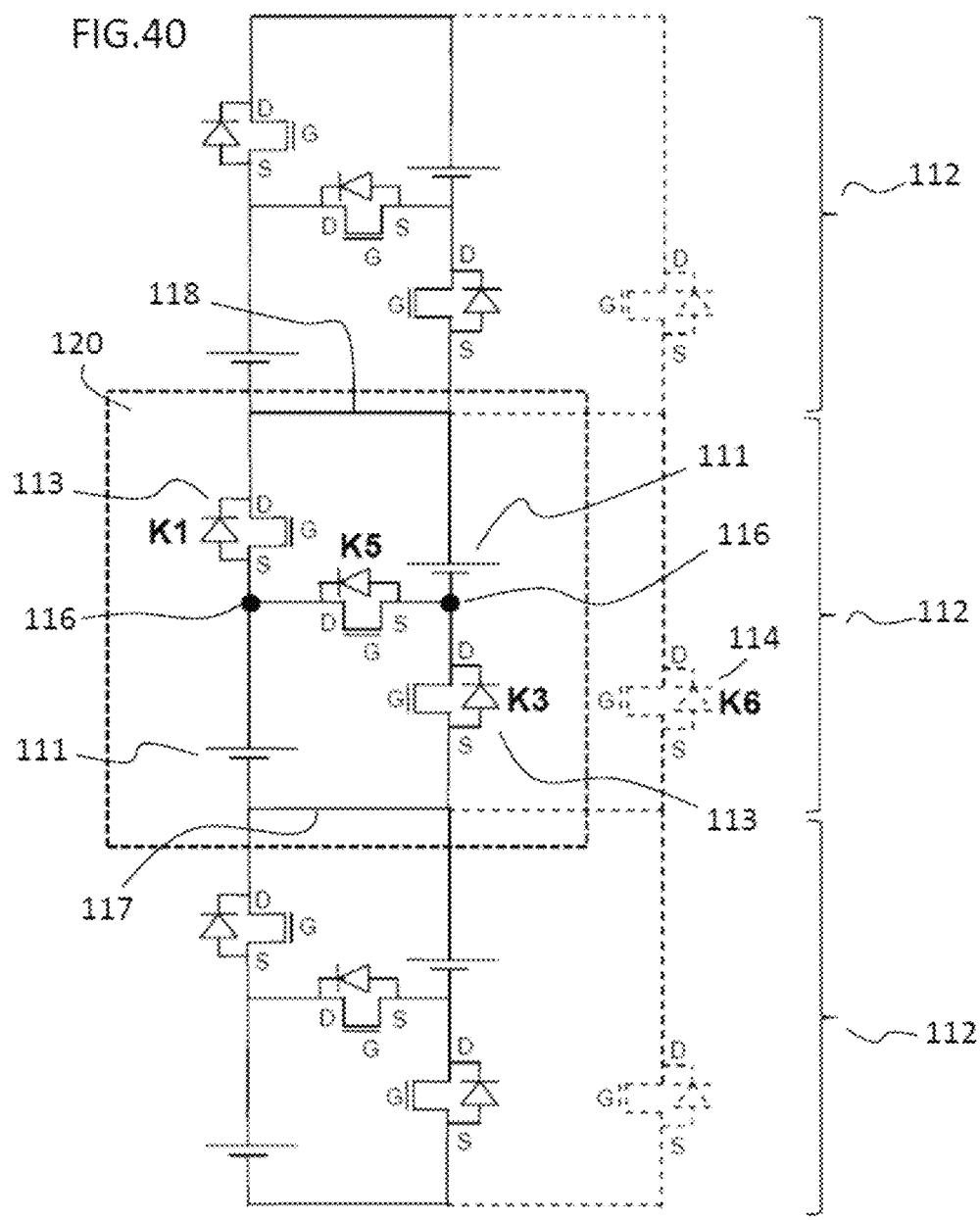

FIG. 40 illustrates an embodiment of the invention enabling cells of modules to be placed in series or parallel.

Figure 41:
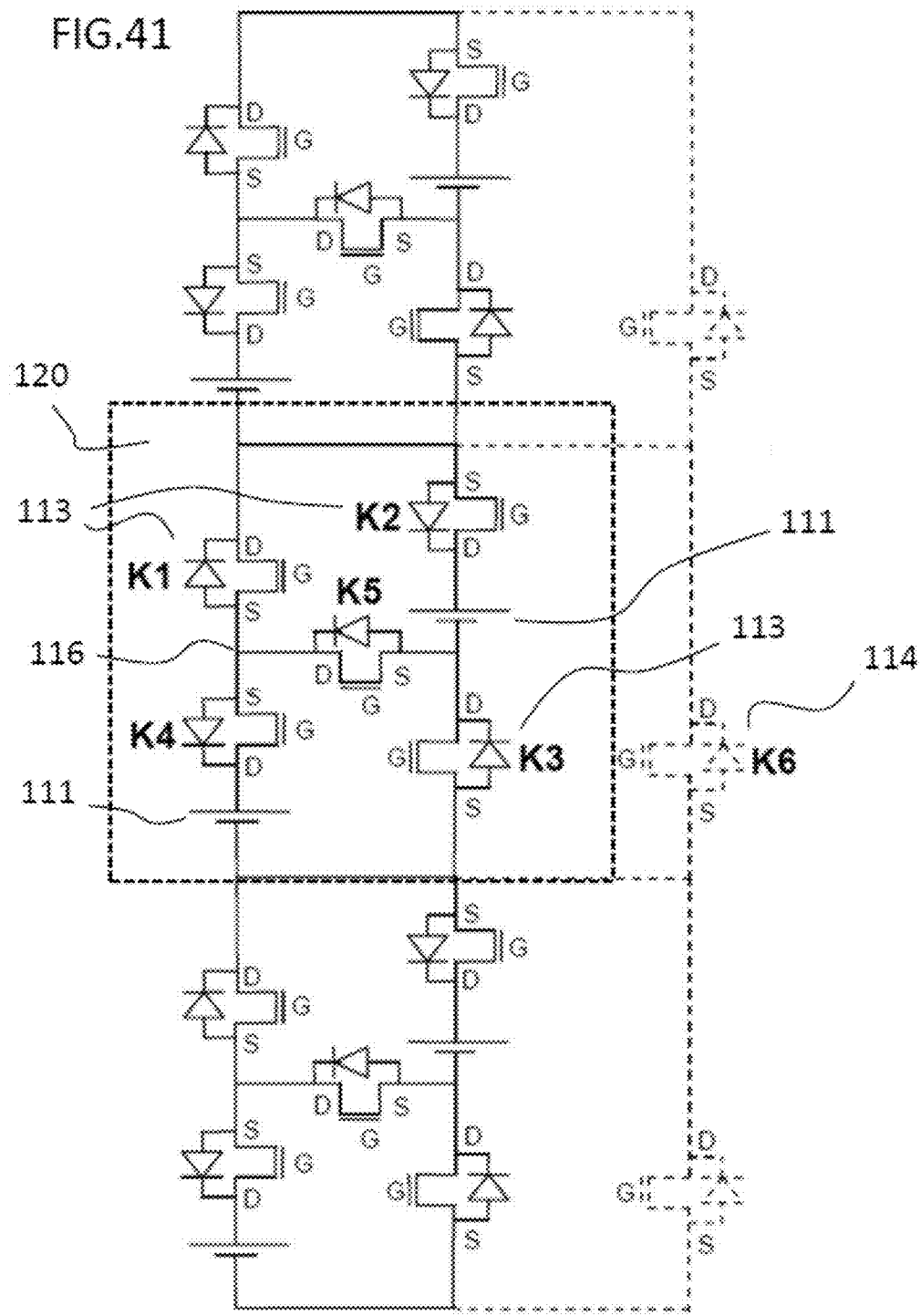

FIG. 41 illustrates a variant of the previous embodiment.

Figure 42:
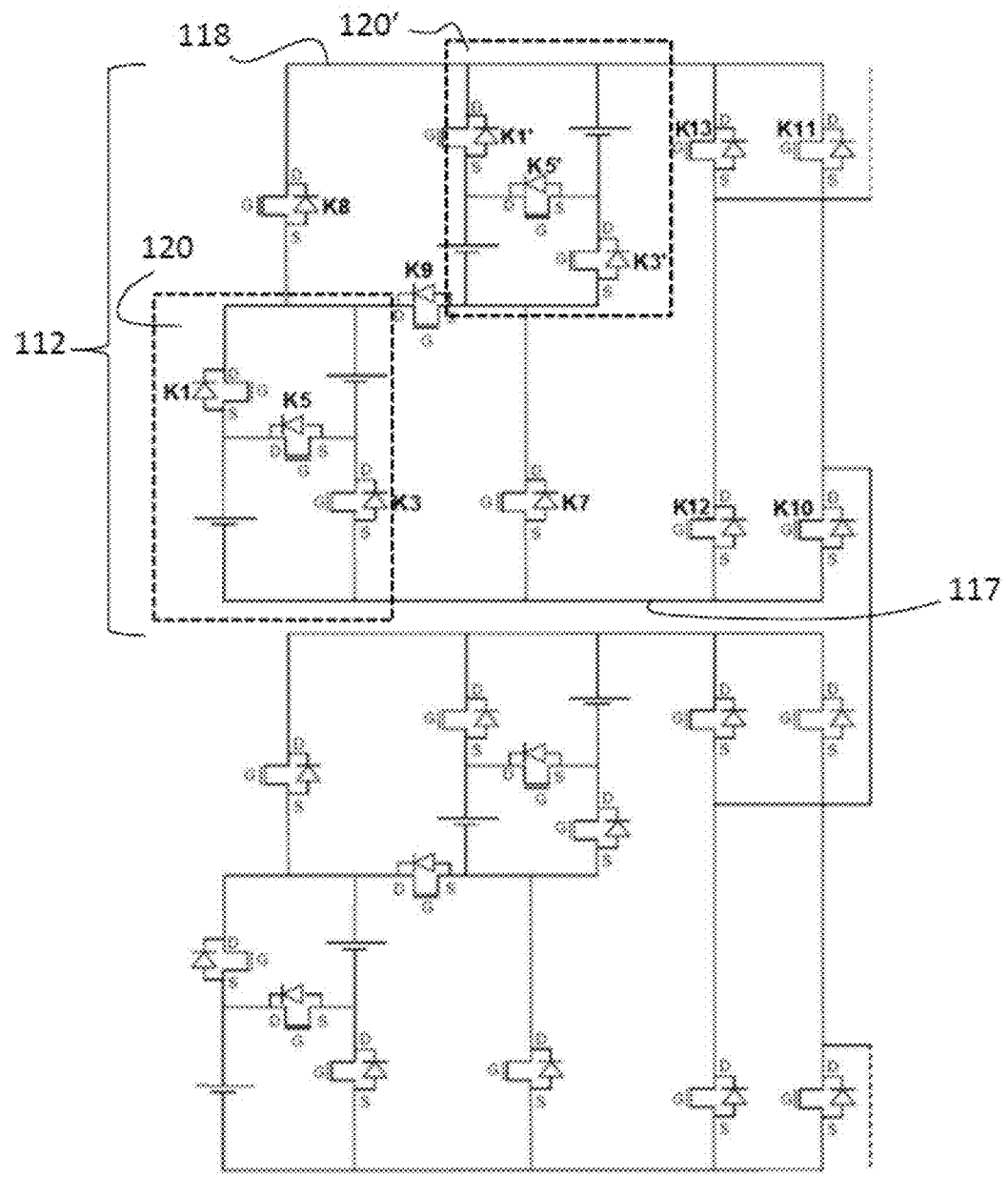

FIG. 42 illustrates another embodiment of the invention enabling cells of modules to be placed in series or parallel.

Figure 43:
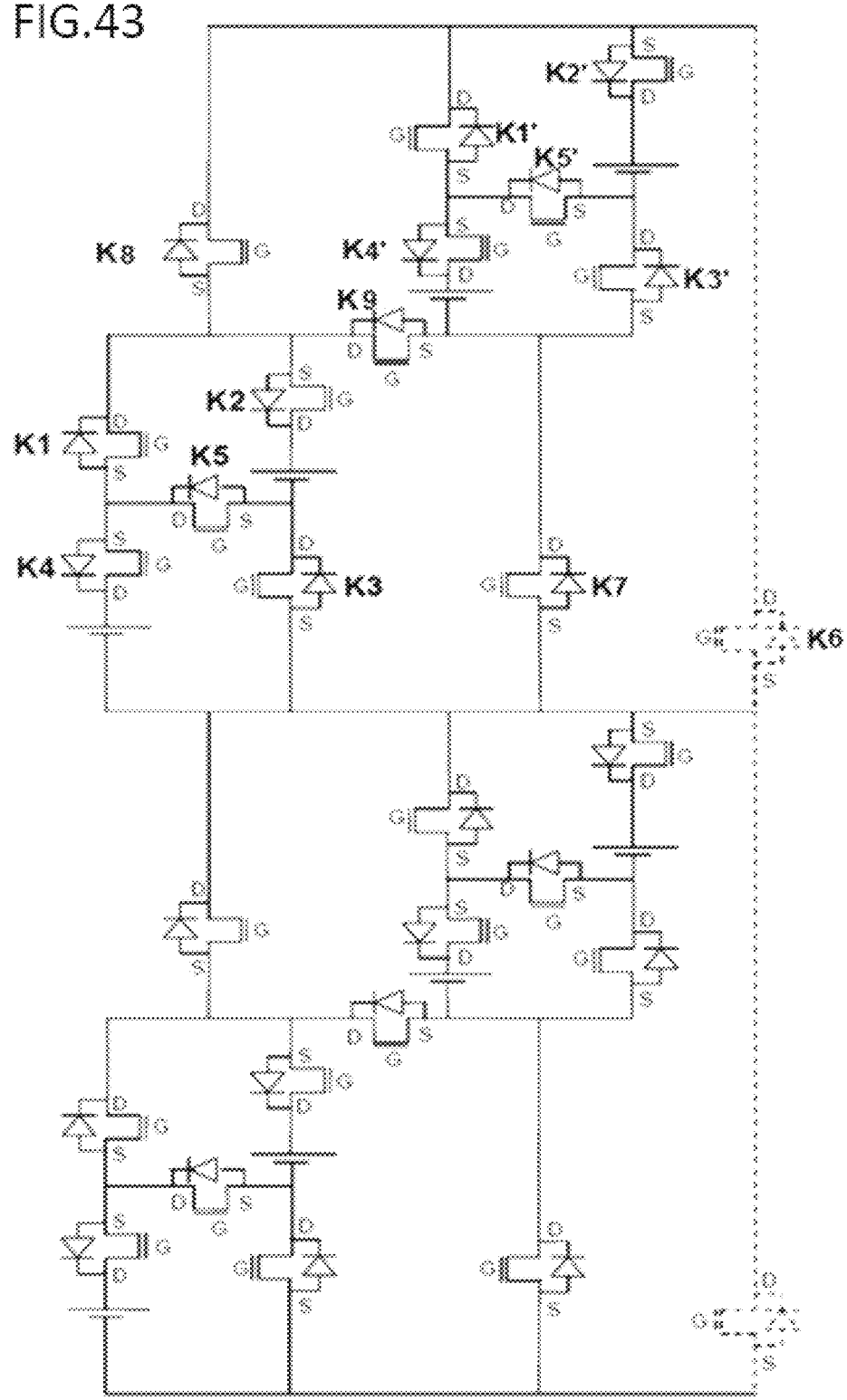

FIG. 43 illustrates a variant of the previous embodiment.

Figure 44:
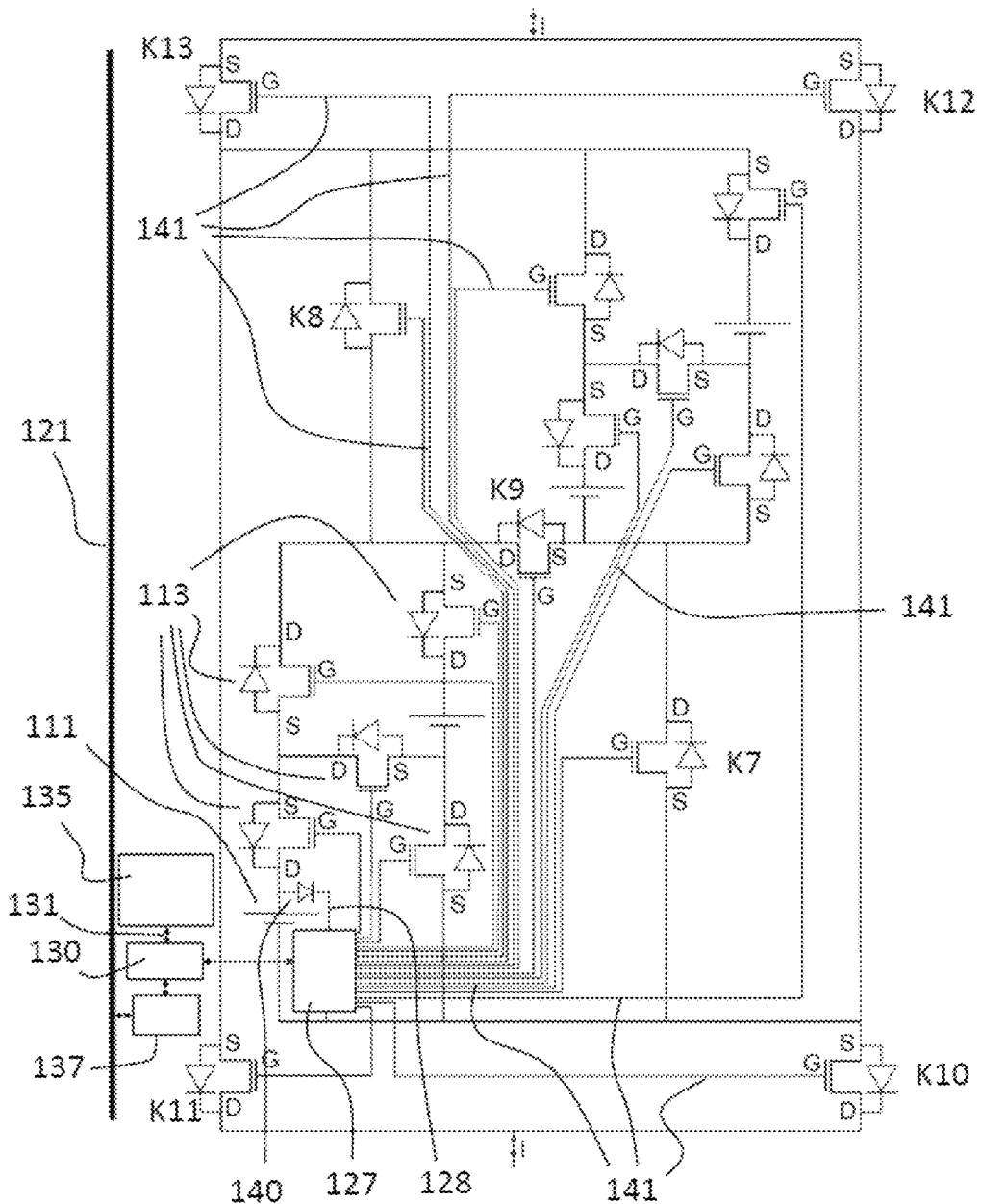

FIG. 44 illustrates the elements for management of the variant of the previous embodiment.

Figure 45:
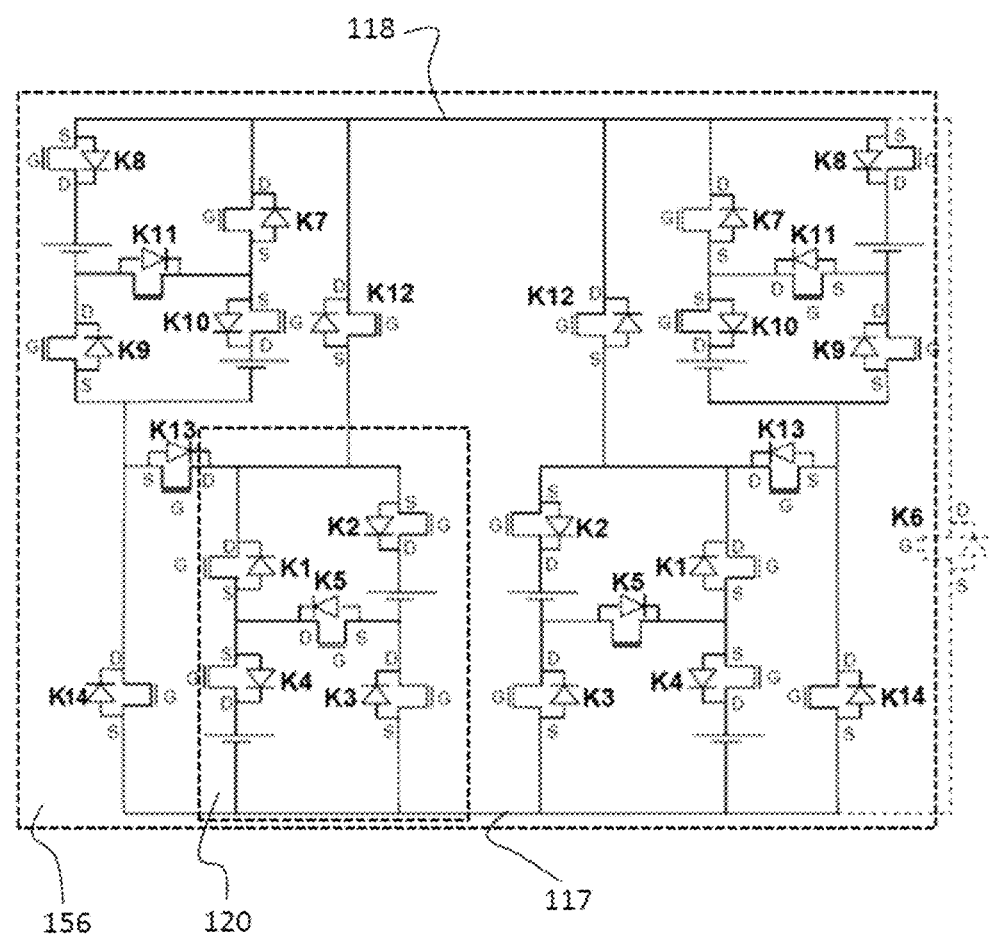
Figure 46:
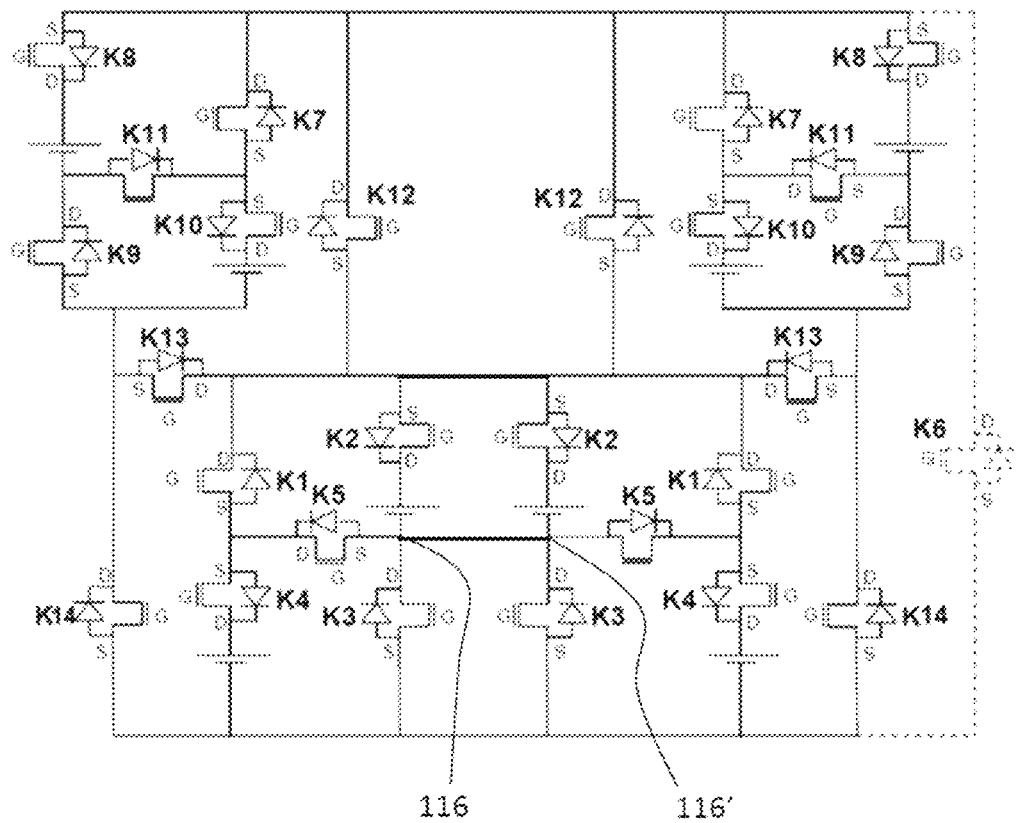

FIGS. 45 and 46 illustrate another embodiment of the invention enabling cells of modules to be placed in series or parallel.

In the subsequent description, the photovoltaic cell taking the form of an indissociable assembly of minimum surface area for photovoltaic energy production will be called an elementary photovoltaic cell 2.

A set of one or more elementary photovoltaic cell(s) will be called a photovoltaic cell 7. In the case of a multitude of elementary photovoltaic cells, they will be able to be associated according to any electrical layout, in series and/or parallel, in such a photovoltaic cell. Next, the association of a photovoltaic cell 7 with an electrical storage element 8, linked to its terminals, which can be of any type, for example capacitive, will be called a cell 11.

In the following figures, the same references will be used for identical or similar elements in each embodiment of the invention, for the sake of simplifying the description.

Figure 2:
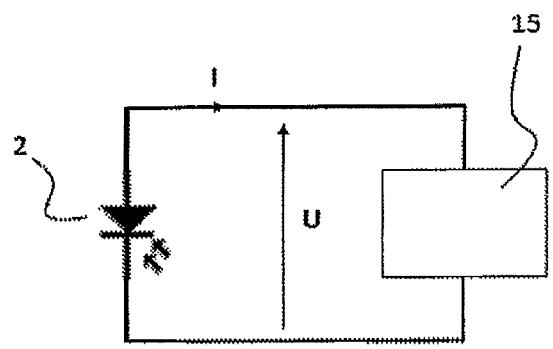
FIG. 2 represents the electrical layout of an elementary photovoltaic cell connected to a load.
Figure 3:
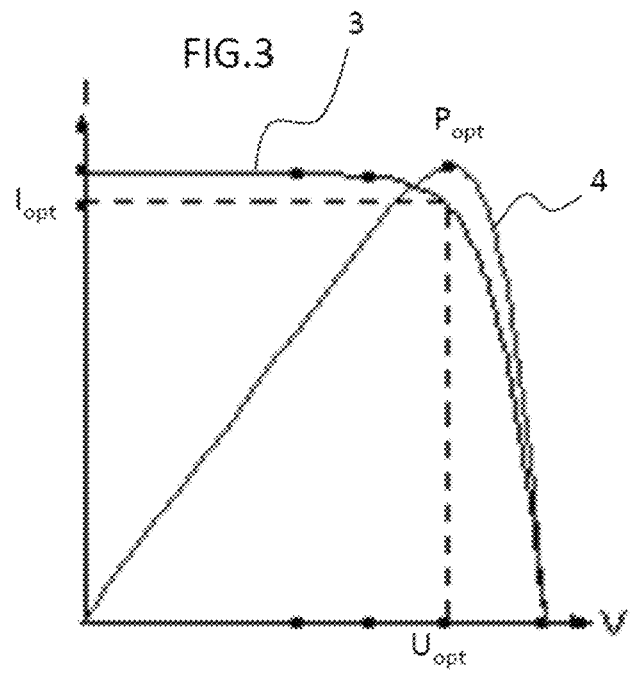
FIG. 3 represents the evolution of the current and of the power provided by a photovoltaic cell as a function of the voltage across its terminals.

FIG. 2 schematically represents the electrical circuit equivalent to an elementary photovoltaic cell 2 linked to a load 15. FIG. 3 represents the curve 3 of evolution of the current I at the terminals of the elementary photovoltaic cell as a function of the voltage V, as well as the curve 4 of evolution of the power provided by the elementary photovoltaic cell, defined by the formula P=V×I as a function of the voltage V. It follows therefrom that there exists an optimal operating point $P_{opt}$, for which the power provided by the elementary photovoltaic cell, defined by the formula $P_{opt}=U_{opt} \times I_{opt}$, is a maximum. As recalled in the preamble, photovoltaic energy generation devices comprise numerous photovoltaic cells which do not all operate under these optimal operating conditions. The embodiments of the invention which will be described make it possible to improve the photovoltaic energy generation performance in particular by allowing a maximum of elementary photovoltaic cells to operate at or in proximity to their optimal operating point.

Figure 4:
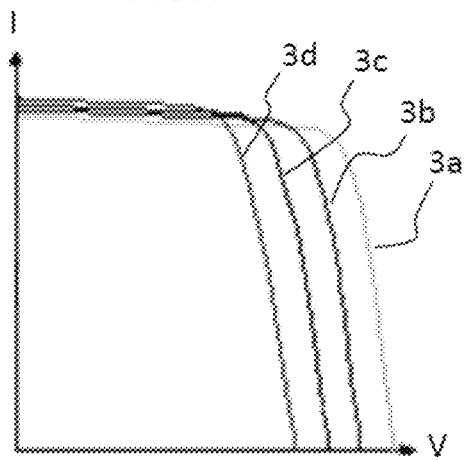
FIG. 4 represents the evolution of the current as a function of the voltage across the terminals of a photovoltaic cell for various temperatures.

As a supplement, FIG. 4 illustrates four curves 3a, 3b, 3c, 3d of evolution of the current I at the terminals of the elementary photovoltaic cell as a function of the voltage V for respectively a temperature of the cell equal to 0° C., 25° C., 50° C. and 75° C. This figure shows that these curves depend on the temperature, and it follows from this that the optimal operating point mentioned hereinabove also depends on the temperature.

Figure 5:
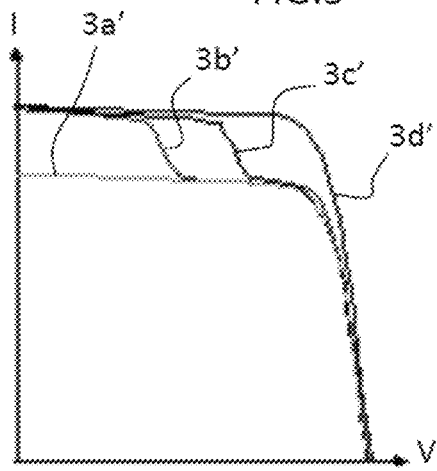
FIG. 5 represents the evolution of the current as a function of the voltage across the terminals of a photovoltaic cell for various lightings.

FIG. 5 illustrates four curves 3a', 3b', 3c', 3d' of evolution of the current I at the terminals of a photovoltaic energy generation device as a function of the voltage V for respectively four different illuminations. Curve 3d' represents a maximum illumination of 1000 W/m², whereas curve 3a' represents the curve for an illumination of 800 W/m² for the device as a whole. Curves 3b' and 3c' represent intermediate situations for which just a part of the surface of the photovoltaic energy device receives only 800 W/m² and not 1000 W/m², for example when a part of the device is shaded, this part being more considerable in the case of curve 3b' than in that of curve 3c'.

FIG. 6 schematically represents an embodiment of the invention in which a photovoltaic energy generation device comprises a multitude of cells 11, formed by a photovoltaic cell 7 and a storage element 8, organized into several modules 12 or stage. Moreover, each cell 11 is associated with its own switch 13, disposed in series, which makes it possible to disconnect the cell from the remainder of the photovoltaic energy generation device by its opening: accordingly, we shall call it a "cell switch 13" subsequently. Moreover each module 12 also comprises a switch 14 in parallel with the cells 11 of the module 12, thus making it possible to short-circuit the module as a whole: accordingly, we shall call it a "module switch 14" subsequently. The use of such a structure for a photovoltaic energy generator makes it possible to circumvent the intermediate converters used in the prior art, for example for a link with the mains 5, as is apparent in this FIG. 6. This manner of operation will be explained subsequently.

FIG. 7 also schematically represents the same embodiment of the invention, in which the representation of the cell 11 has been simplified with respect to FIG. 6. This simplification will be retained in the following figures so as to streamline them. The cell 11 does, however, retain the same structure as that described hereinabove. Moreover, the energy generation device is illustrated here in a different use, to supply a load 15, such as a motor. In this variant of use, neither is there any need for an intermediate converter between the energy generation device and the load 15.

According to an advantageous aspect of the invention, one or more measurement sensors are incorporated at the level of all or some of the cells of the photovoltaic energy generation device, in addition to the switch represented, so as to make it possible, by way of a control device for these switches, to use or not use certain cells as a function of their state and of the needs, as a function of the measurements performed. This allows optimization of the photovoltaic energy generation device.

FIG. 8 illustrates in greater detail a module 12 of the photovoltaic energy generation device according to the embodiment of the invention. It comprises a lower terminal 17, linked to a lower neighbor module, and an upper terminal 18 for a series link with the upper neighbor module. According to this example, this module comprises six cells 11 disposed in parallel. Naturally, it could as a variant comprise any other number of cells. More precisely, the module firstly comprises six parallel branches disposed between its upper 18 and lower 17 terminals, on which are disposed a cell 11 and a cell switch 13, which is able to disconnect or not disconnect the cell from one of the two terminals 17, 18. It comprises a seventh branch on which is disposed a module switch 14, in parallel with the cells, able to shunt the cells. In the example illustrated, only the third and fourth cells are used since their respective cell switches 13 are closed, whereas all the other cell switches are open.

Moreover, the module switch 14 is open so as to place the module 12 in its normal operating configuration.

FIG. 9 illustrates more precisely the electrical lay-out chosen for implementing the layout explained herein-above, with reference to FIG. 5. In this FIG. 9, only two cell switches 13 are represented so as to simplify the figure. The various switches 13, 14 are embodied with the aid of power transistors 23, 24, preferably transistors of NMOS type, which afford a gain in conductivity in their passing state with respect to PMOS transistors which could as a variant be used. As a variant, it is also possible to use other types of transistors such as bipolars, FET, JFET, IGBT, etc. It is also possible to place several transistors in parallel so as to better ensure the passage of the current. Naturally, there therefore exist at least as many cell transistors 23 as cell switches 13, and a module transistor 24 to form the module switch 14. All these transistors 23, 24 are associated with diodes 25, 26 mounted in parallel, which are incorporated into the transistors if they are NMOS discrete power transistors or as a variant are distinct diodes, to represent their characteristic of allowing the current to pass in the reverse direction. Finally, a control circuit 27, generally called a "driver", is supplied electrically through links 28 allowing it to recover a voltage difference corresponding substantially to the voltage of the cell of largest voltage, slightly decreased by a voltage drop (for example close to 0.6 V) at the level of the diodes 40 disposed on the links 28. The function of this control circuit is to generate control signals 41 towards the various transistors 23, 24 to actuate them, thus fulfilling a function of control of the switches. In a similar manner, not represented for reasons of clarity of the figures, all the electronic components of the module can be supplied according to the same solution, such as a computer making it possible to estimate the state of the switches, an optional communication system, etc.

The manner of operation of this device will now be explained. During its use in a circuit similar to that of FIG. 7, in the customary operating configuration, at least one of the cell transistors 23 is closed, whereas the module transistor 24 is open, thereby allowing the cells 11 associated with the closed cell transistors 23 to deliver a voltage and a current which passes through the closed transistors and which will ultimately contribute to the power supply for the load 15. A current flows from the lower terminal 17 to the upper terminal 18. On the other hand, if all the cell transistors 23 are open and the module transistor 24 is closed, the current will pass through this module transistor and the cells of the module are isolated, do not participate in the generation of the supply current. In the case where all the transistors 23, 24 are open, the current of the photovoltaic energy generation device, will pass through the reverse diode 26 associated with the module transistor 24, and the voltage across the terminals 17, 18 of the module remains equal to about −0.6 V (the voltage of the upper terminal 18 is about 0.6 V lower than that of the lower terminal 17: this voltage drop originates from the reverse diode 26 associated with the module transistor 26). Finally, it is avoided to position a cell transistor 23 closed while the module transistor 24 is also closed, so as not to short-circuit the cell 11, for safety reasons. Thus, for any passage of the cell transistors 23 that are closed to a situation where the module transistor 24 is closed, or vice versa, there will preferably be undertaken an intermediate step of opening all the transistors, for a short period of a few nanoseconds for example.

Moreover, upon the opening of a cell switch, the storage element associated with the photovoltaic cell will charge, while enabling the photovoltaic cell to be maintained around its optimal operating point.

It is beneficial to note that the voltage of a module remains low, even when all the transistors are open, thereby making it possible to use inexpensive transistors supporting relatively low voltages, and whose resistance in the passing state is very low, thereby inducing few losses. This will hold true in particular if the cells 11 exhibit a voltage of less than 40 V.

FIG. 10 illustrates a variant embodiment of the previous electrical layout for implementing the same principle differently, making it possible in particular to obtain a local power supply for the electronic components 148 of the circuit on the basis of the voltage stored by the cells of the module considered, or indeed of a neighbor module. For the sake of simplification, the electronic components are not detailed, but they comprise at least one control circuit and switches, as explained hereinabove. In this variant, a bipolar PNP transistor 149 is associated with each cell 11 of the module. All these transistors 149 are controlled by one and the same current of a terminal 142 of a control device 145. This results, at the output 143 of each transistor, in a current whose strength depends on the voltage of each cell 11, that is to say on the state of each cell 11. These currents are added together so as to power the electronic components through a resulting cur-rent 144. The control of the transistors 149 is such that the final supply current 144 attains a desired value. The solution makes it possible to invoke the various cells of the module as a function of their state, of their available voltage.

This solution avoids moreover having the voltage drop between the voltage available at the level of the module and that actually utilizable by the electronic components, as in the embodiment described hereinabove with reference to FIG. 9, on account of the use of diodes. This voltage drop may in particular be troublesome in an embodiment for which the cells were low-voltage cells, of value 1.5 V for example.

The control device 145 comprises an amplification device comprising two amplification stages 146 and 147 according to this embodiment so as to make it possible to implement the control of the power supply device described hereinabove without requiring too considerable a power, which would engender a voltage drop at the level of the module, this being avoided in this embodiment. Accordingly, a first very low current is tapped off from the module, at the level of a first transistor Tdiff, and then amplified by an amplification cascade, so as to attain the desired control value on the terminal 142. The control current on the terminal 142 adjusts itself automatically as a function of the demand in terms of current of the electronic components 148, thereby limiting it to what is strictly necessary and in real time and thus limiting the mean consumption related to this control.

The numerical values illustrate an exemplary implementation making it possible to attain a supply current of 40 A by tapping off a current of 125 nA for its control.

According to the embodiment of the invention, each cell moreover comprises at least one sensor for measuring a quantity characteristic of the state of the cell. This measurement sensor can for example measure the voltage and/or the current and/or the temperature at the level of the cell concerned. Each measurement sensor is moreover linked by a communication device to an intelligent device, local and/or remote, such as a computer of microcontroller type, which receives the measured values and implements a method for managing the photovoltaic energy generation device, which will be described in greater detail subsequently, so as to determine an optimized mode of operation of the photovoltaic energy generation device, by taking account of the measurements performed. This optimized operation in fact consists in determining the switches 13, 14 which have to be open and closed. This configuration of the various switches of the photovoltaic energy generation device can be modified in real time. This solution thus makes it possible for example to discard the defective cells, to steer the current within the heart of each module, to balance each of the cells of the photovoltaic energy generation device in real time. As a remark, the mean current demanded by a load 15 powered by the photovoltaic energy generation device is in general much lower than the peak current demanded during heaviest consumption, thereby allowing the photovoltaic energy generation device to operate satisfactorily most of the time with a relatively considerable number of disconnected cells, that is to say whose associated cell switch 13 is open, or indeed of disconnected modules, that is to say whose associated module switch 14 is closed, if for example a module is considered to be defective as a whole.

FIGS. 11 to 13 represent possible examples of physical embodiment of the electrical functions added by the invention in the architecture of a photovoltaic energy generation device according to one embodiment of the invention.

FIGS. 11 and 12 illustrate a first embodiment in which an electronic card 20, which comprises the components explained previously, is added for each module of the photovoltaic energy generation device. This electronic card takes the form of a printed circuit positioned under the surface of each module, under the photovoltaic cells 7, which thus fulfil a function of protecting the electronic cards against outside assault, such as originating from dirt, rain, etc. Thus, the photovoltaic energy generation device comprises an electronic card 20 for each module. The boards of photovoltaic cells can be plugged directly into the electronic card 20 via connectors or have soldered electrical connections, so as to electrically link the photovoltaic cells to the electronic cards through connections 38. The storage elements, not represented, can extend under a considerable portion of the photovoltaic surface or simply take the form of a component of reduced size soldered onto the electronic card according to use (simple filtering of the voltage or mass storage). The electronic cards 20 can be incorporated into the photovoltaic panel or be attached to the support structure of the photovoltaic panel. For example, in the case of incorporation into a roofing supported by a framework, the electronic cards 20 can be disposed and fixed on the framework battens or rafters which will bear the photovoltaic panels which serve at the same time as covering for the roofing.

Thereafter, according to the embodiment represented in FIGS. 11 and 12, each electronic card is linked by a communication bus 21 to a central computer 22, which receives the measurements performed locally within a module of the photovoltaic energy generation device and implements a method for managing the photovoltaic energy generation device, comprising in particular the transmission of commands for opening and/or closing the switches of the photovoltaic energy generation device. This transfer of data by the communication bus 21 may require optional multiplexing and digitization of the data, as well as galvanic isolation (by transformer or optocoupler). Moreover, a control circuit 27 is placed on each electronic card and constitutes an intermediate element between the computer 22 and the switches, allowing the adaptation of the voltage transmitted to the transistors 23, 24 forming the function of switches for the implementation of the commands of the computer. These control circuits 27 can moreover incorporate safety functions so as to avoid for example closing a module switch 14 while the cell switches 13 are closed, to avoid any short-circuit.

FIG. 12 illustrates more precisely the components present on each electronic card, which comprises measurement sensors 29, for measuring the temperature, the voltage, and the current, one or more processing circuits 30 for estimating the state of each cell for example, determining the relevance of using or not using each cell, etc. The electronic card 20 moreover comprises a control circuit 27 allowing the actuation of the various transistors 23, 24, forming the switches 13, 14. Finally, it comprises a communication interface linking with the communication device so as to communicate with the central computer 22.

FIGS. 13a and 13b illustrate a variant embodiment in which the electronic functions of each electronic card of the embodiment described hereinabove are grouped together on a single electronic card 20, to which the cells are linked electrically by connections 38. FIG. 13a represents a view from underneath, making it possible to see the distribution of the modules 12 on the card 20. In the case of incorporation into a roofing supported by a framework, the electronic card 20 can be disposed and fixed on a batten or a rafter of the framework, which will bear the photovoltaic panels which serve at the same time as covering for the roofing. The card 20 can be split into several pieces and stretch over several battens or rafter 42 of the roofing, as is apparent more particularly in FIG. 13c, and these pieces can be linked electrically by cables like the communication bus 21 and a power cable 47 for placement in series. To ensure the leaktightness of the roof, the photovoltaic panels can rest on a support such that a leaktight overlap exists between the panels. During the construction of the support structure of the installation, such as a framework, provision may be made on the card 20 for a photovoltaic cells wiring number that is greater than the number of photovoltaic cells installed at the outset so as to be able in the future to increase the number of photovoltaic cells of the installation. The photovoltaic cells not installed at the outset will simply be shunted by the module switch.

FIG. 13b represents a rear perspective view, making it possible to distinguish various photovoltaic cells 7, as well as certain electronic components like cell transistors 23, represented summarily in a non-exhaustive manner so as to simplify the representation of the electronic card 20 disposed under the surface of the photovoltaic cells, opposite from their upper face receiving a light flux 39. The electronic card 20 comprises all the components explained previously. The communication bus 21 extends over the entire length of the card as far as the central computer 22, positioned towards a free end of the electronic card 20. This communication bus 21 can be physically isolated from the electronics of the modules by establishing a printed-circuit band dedicated to the communication bus, separated from the electronic components of the various modules, by separating for example their earths, and/or by maintaining a safety distance between the two parts. Only the elements for communication between these two parts, such as transformers or opto-couplers, will remain straddling these two parts to ensure communication while guaranteeing galvanic isolation.

FIG. 14 represents in a more detailed manner the architecture of the electronic card 20 associated with two modules 12, each comprising seven cells in this example. For each cell, a cell transistor 23 is provided, in series with the cell, and a module transistor 24, in parallel, is provided for each module 12, as explained previously. Moreover, a temperature sensor 33, a voltage sensor 35 and a current sensor 36 are provided for each cell. The measurements performed by these three sensors 33, 35, 36 are transmitted to a local processing circuit 30 via a multiplexer 32 by respectively three communication pathways 43, 45, 46. As a remark, the connections have been simplified in the figures for the sake of clarity, but there is in reality a ribbon of wires to obtain a connection to each sensor and to each voltage. Moreover, the voltage of the module is also advantageously measured so as to deduce therefrom the voltages present at the level of the transistors. The processing circuit 30 thus receives these data at the level of a communication input 31 performing a digitization, of "ADC input" type; or as a variant, these signals arrive already digitized, this digitization being carried out at the level of the multiplexer 32. According to a possible embodiment, the processing circuit 30 can be a microcontroller having a number of input/output sufficient to interrogate the assembly of sensors. All the transistors 23, 24 are driven by a power control circuit 27 which transmits control signals 41 to them, under the orders of the processing circuit 30. Finally, the processing circuit 30 is linked to the central computer 22 by the communication bus 21 and by way of an interface 37 forming a galvanic isolation. All these components associated with a single module are supplied through the voltage of at least one of the cells of the module 12. As has been described, each module 12 of the photovoltaic energy generation device has its own intelligence by virtue of its processing circuit 30 and thus participates in the method for managing the photovoltaic energy generation device, in cooperation with the central computer 22 which drives the assembly of modules. Said computer will be described in greater detail subsequently, with reference to FIG. 23.

Moreover, according to an advantageous embodiment, all the power components associated with a module are supplied directly through the voltage available at the level of the corresponding module, in particular the control circuit 27 for the transistors, described previously. Such a control circuit, powered by its associated module, is then electrically isolated from the other modules and/or the electrical potentials outside the module. Such an embodiment exhibits the advantage of eliminating the risk of driving a certain transistor with a very different potential from that of the stage, which could lead to its destruction or to its short circuiting. Moreover, this solution affords the additional advantage of allowing a reduction in the connections between the components of the control circuit and the power supply source, since it is possible to group them together a short distance from one another and from the voltage source, in particular by positioning the transistors as close as possible to the cells to be connected. Finally, the use of very short connections also greatly reduces any risk of short-circuit, for example between two modules.

Likewise, a communication device powered by the stage can make it possible to communicate with the other stages and/or with a central system via a highly insulated tie to avoid electrical risks (short circuits between stages, deterioration of the central system placed at a potential differing greatly by a few kV from that of a stage of the photovoltaic energy generation device, electrical risk for the repairer). In contradistinction to a pulse transformer which would make it possible to control the power transistors through a galvanic isolation, the use of a communication device powered by the module makes it possible to interpret the signals received (decoding of the address, of the information), to code the signals to be transmitted and to pool the communication lines whereas the pulse transformer makes it possible merely to set the power transistor "on" or "off" with an individualized connection line to each transistor. The communication device may for example be an I2C interface present in numerous microcontrollers, that is read back to a pooled communication bus for each stage via a galvanic isolation.

In the example described hereinabove, the method for managing the photovoltaic energy generation device is implemented through the cooperation of a local processing circuit 30, disposed at the level of each module, and of a central computer 22. All of the photovoltaic energy generation device management functions will therefore be able to be implemented by this combination. Several embodiments can thus be contemplated, by shifting certain management functions from the local level to the central level or vice versa.

FIGS. 15 to 17 illustrate a second variant embodiment in which the method for managing the photovoltaic energy generation device is implemented locally only, at the level of each module, or indeed cell. This exhibits the advantage of allowing more reactive driving of the various switches of avoiding the obligation to provide galvanic isolation between the electronic cards 20 and a central computer 22 and complex coding of the information to be transferred. FIG. 15 illustrates such a variant, in which each electronic card 20 comprises measurement sensors 29, for measuring the temperature, the voltage, and the current, one or more processing circuits 30 for estimating the state of each cell for example, determining the relevance of using or not using each cell, etc. The electronic card moreover comprises a control circuit 27 allowing the actuation of the various transistors 23, 24, forming the switches for cell and module.

FIG. 16 represents in a more detailed manner the architecture of the electronic card associated with a module 12, comprising six cells in this example. For each cell, a cell transistor 23 is provided, disposed in series with the cell, as has been explained previously. Furthermore, a temperature sensor 33, a voltage sensor 35 and a current sensor 36 are moreover arranged at the level of each cell. The measurements performed by these three sensors 33, 35, 36 are transmitted to a processing circuit 30 via a multiplexer 32 through respectively three communication pathways 43, 45, 46, or as a variant through one and the same pooled pathway. The processing circuit 30 thus receives these data at the level of a communication input 31 performing a digitization, of "ADC input" type. According to a possible embodiment, the processing circuit 30 can be a microcontroller having a sufficient number of input/output to interrogate all of the sensors. As a remark, the single module transistor 24 is replaced in this embodiment by several parallel switches formed by transistors 34: in this variant, a parallel transistor 34 is disposed in parallel with each cell so as to reduce to a minimum the length of the power paths when these transistors 34 are activated. Thus, it is apparent that in all the embodiments and their variants, the module switch 14 can be replaced with parallel switches 44 on each cell of the module, or indeed by any number of parallel switches, such as a parallel switch for one or two cells. All these transistors 23, 34 are driven by a control circuit 27, under the orders of the processing circuit 30.

FIGS. 17a and 17b illustrate a third variant embodiment, which is akin to that of FIGS. 13a and 13b, in which the electronic functions are grouped together on a single electronic card 20, and for which only a local processing at the level of each module is performed, without any link with a central computer. FIG. 17a represents a view from above, making it possible to see the distribution of the modules 12 on the card 20, whereas FIG. 17b represents a rear perspective view, making it possible to distinguish various cells 11, as well as certain electronic components such as cell transistors 23, represented summarily in a non-exhaustive manner so as to simplify the representation of the electronic card 20. However, the latter comprises all the components explained with reference to FIG. 16.

As a remark, it is ultimately possible to effect embodiments with various numbers of electronic cards 20, a card being able to contain the electronic circuits of the invention for one, two, or any number of modules. Moreover, it is also possible to provide for other embodiments in which part only of the electronic components presented previously are present, on an electronic card or not, or in which certain components are shared between cells and/or modules. For example, a circuit for control of switches and/or a processing circuit can be shared by several neighbor modules, for example for two or three neighbor modules, so as to retain an acceptable voltage supply.

In all cases, the electronic cards 20 are advantageously disposed in such a way as to dispose their connection terminals with the cells 11 as close as possible to the terminals of the cells so as to reduce to the maximum the length of the connections and therefore the associated losses. Likewise, on the printed circuit of the electronic card, the power paths are as short as possible with the highest possible conductor cross-section.

To increase the conductor cross-section, it is possible to strengthen the tracks of the printed circuit by soldering above a conducting wire or baton.

FIG. 18 illustrates such a solution, in which an electronic card 20 of printed circuit type is overlaid on a module of several cells 11. In this figure, only two modules of two cells are represented, for the sake of clarity of the figure, but the photovoltaic energy generation device comprises more than two modules each having more than two cells. As a remark, such a strengthening can fulfil the second function of evacuating the heat generated, in particular that dissipated by the power transistors; accordingly, its shape can exhibit a surface favouring this function, in the manner of a convector or radiator. Connectors 16 are rigged up on this board, so as to link the cells electrically to the electronics of the card (for example cells whose positive and negative terminals pass through the card and clamp the card and the strengthened power tracks via a nut which is screwed onto the terminals of the cell. A relatively elastic washer can be added between the card and the nut to compensate for the effects of thermal expansion and ensure good electrical contact over the duration. As a variant, simple soldering can ensure the electrical contact between the terminals of the cell and the power tracks of the PCB card. As is apparent in the figure, electrical conducting strengtheners 19 are added to the tracks of the printed circuit. These strengtheners also represent a potential thermal radiator soldered and/or glued to the tracks. As a supplement, holes, not represented, can be made through the electronic card 20 to facilitate the circulation of air and the cooling of the cells 11 and electronic components.

Ultimately, the structure thus described of a photovoltaic energy generation device is of modular type, and allows a physical implementation in the form of various independent and removable housings, which each correspond to a set of cells and therefore each comprise several elementary photovoltaic cells, which can be connected together, by way of a communication bus and of a power bus. Each housing can comprise an arbitrary sub-part of the overall device, which can range from one module to several modules.

FIG. 19 schematically illustrates such an approach in which the various housings 150, each comprising photovoltaic panels of several photovoltaic cells, are linked by a removable link to a communication bus 152 by way of a connector 153, in a highly galvanically isolated manner, and to a power bus 151 by a power connector 154 which allows them a series link with the adjacent housings. A locking/unlocking device 158 is associated with a switch system making it possible to automatically cut the connections to the communication bus and to the power bus when it is actuated to remove a housing 150. The connection is replaced with a short-circuit, via for example the mechanical or electrical switch 155, when the housing is removed so as not to cut the connection between the remaining housings. Accordingly, a start of locking or of unlocking by actuation of a lever or handle of the locking/unlocking device is detected and an item of information is transmitted to the device's global management system, such as a central computer. In the case of unlocking of a housing, the computer discards it immediately from the overall operation of the device and imposes on it a zero voltage across its terminals, thereby ensuring the safety of the future manipulations and allowing its secure storage. The connections with the power and communication buses are thereafter automatically cut, by a switch, in a mechanical or electrical manner. The previous operations are performed in a reversible manner in case of introduction of a housing into the frame.

This construction exhibits the advantage of simplified physical management of the photovoltaic energy generation device. Each subset included in each housing is managed in an independent or semi-independent manner by virtue of the architecture described in the embodiments presented previously. It is thus possible to precisely ascertain the state of each housing, and to be able to intervene on a given housing in case of failure, so as to change a module or indeed a cell, or to be able to exchange it if necessary, without penalizing the whole device.

This physical assemblage can thus be disposed on the framework of a building, the various housings being distributed on the surface of the roof. This architecture makes it possible to easily add or remove subsets, i.e. photovoltaic panels, to or from the overall device, whose linking and management is thereafter carried out automatically in an optimal manner. It therefore makes it possible to afford user-friendly and convenient upgradability of a photovoltaic energy generation device.

The invention also pertains to a method for managing a photovoltaic energy generation device such as described previously. This method consists in optimizing the power produced by the device while complying with a first constraint imposed by the available sunshine and a second constraint related to the specific demand of the load connected to the device. Naturally, the first constraint takes priority over the second in case of incompatibility, since the photovoltaic energy generation device is automatically bound in its production capacity to sunshine, this implying that in the worst case, it will not be able to satisfy a need going beyond its maximum capacity.

The photovoltaic energy generation method comprises a step consisting in determining the position of the cell switches as a function of the operating state of the photovoltaic cells concerned, more precisely as a function of their state with respect to their optimal regime. Accordingly, when the voltage across the terminals of a cell exceeds the optimal voltage, presented previously with reference to FIG. 6, increased by a predefined percentage, the cell is then used in a priority manner, that is to say its cell switch is closed so as to allow its use to produce a voltage and a current towards the output of the device. This use of the cell, which induces provision of a current by the photovoltaic cell and by its associated storage element, tends to cause the voltage across the terminals of the photovoltaic cell to decrease, thereby preventing this voltage from climbing too far and straying too far from the ideal operating voltage. On the contrary, when this voltage across the terminals of a cell falls below this optimal voltage decreased by a predefined percentage, the cell is then no longer used, that is to say the cell switch is opened, so that said cell no longer participates in the production of voltage and current at the output of the device. During this disconnection of a cell from the remainder of the device, its energy production is utilized for charging the storage element which is associated therewith and the voltage across its terminals rises.

This mechanism, illustrated by FIG. 20, thus comprises the setting up of cycles of opening and closing of the cell switch 13, as represented by the curve 53, as a function of the state of the associated cell, that is to say of the operating conditions of its photovoltaic cell 7 with respect to the optimal conditions, so that these operating conditions always remain in a range close to the ideal conditions, preferably in a range of plus or minus 5% of the optimal conditions, advantageously of 2.5% of these conditions. This optimization can be done on each elementary photovoltaic cell in the case where each is individually associated with a cell switch, that is to say in the case where a photovoltaic cell 7 comprises just a single elementary photovoltaic cell. As a variant, this optimization can be done on several elementary photovoltaic cells. Curve 54 represents the state of the parallel switch 44 associated with the cell considered, which is open when the cell switch 13 is closed and vice versa. Curve 52 illustrates the current i at the terminals of the photovoltaic cell 7, which forms step changes similar to those of curve 53: the current takes a non-zero value upon the closing of the cell switch, illustrated by the "ON" label of curve 53, for the periods T1, T2 represented. During these periods, the photovoltaic cell 7 is used and its voltage V falls as is visible on curve 50, before rising when the cell switch is opened. The voltage V across the terminals of the photovoltaic cell 7 does indeed oscillate around the optimal voltage $V_{opt}$. The voltage Vmodule across the terminals of the module, represented by curve 51, takes a zero value when the cell switch 13 is open, since the cell is shunted by the parallel switch 44 which is closed, and then a value equal to that of the cell during the periods T1, T2 of use of the latter.

As a remark, disconnecting a cell of lower voltage from the remainder of the device, whether this is because this cell is situated in a shaded zone or for any other reason, makes it possible to avoid it also having a harmful influence on all the other cells, which can be more easily maintained in their optimal operating state. Indeed, a shaded cell would run the risk of behaving as a load in relation to the remainder of the energy generation device, and therefore of dissipating energy produced while running the risk of overheating and of necessitating a reduction in overall current provided in order to reduce this risk.

This method of photovoltaic energy generation management therefore comprises a step of determining the operating conditions of a photovoltaic cell.

Accordingly, the method comprises a step of measuring at least one quantity at the level of a cell of the photovoltaic energy generation device, representative of the state of the cell, such as the voltage and/or the current, and optionally the temperature. As a remark, this or these measurements are advantageously performed locally, by one or more sensors, as mentioned previously.

According to a first embodiment, only the voltage across the terminals of the cell is measured. The current can be deduced by analysing the variation in voltage across the terminals of the storage element in a phase of charging of this element, when the cell switch 13 is open, since this current is related to the voltage. For a capacitance C, the current is related to this voltage by the well known formula of i=C dV/dt.

Thereafter, this (or these) measurement is utilized by a computer of a processing circuit, which is advantageously local, that is to say positioned for example on an electronic card in proximity to the cell, as has been described previously. As a variant, the measured quantity is transmitted to a central computer.

This computer implements a method for comparing the actual state of the cell with an optimal operating state, on the basis of this measurement. Accordingly, a first embodiment is based on the prior storage of the optimal values in an electronic memory associated with the computer, such as the storage of the optimal operating voltage as a function of temperature for example. A second embodiment is based on the periodic search, optionally in real time, for the optimal operating conditions. Accordingly, a solution can consist in letting the operating conditions of a cell evolve slightly so as to verify whether or not this is accompanied by an increase in the power provided by the cell. If the power increases, then the evolution is continued in the same direction. On the other hand, if it decreases, the reverse evolution is set up. This principle ends up culminating through successive iterations at the optimal operating point and then making it possible to continue the management method described previously, so as to remain around this point.

Ultimately, the method for managing an energy generation device therefore comprises the implementation of the following steps:
  transmission of the measured quantity to at least one computer;
  determination of the position of a cell switch and/or module switch by taking into account the measured quantity;
  transmission of a command for opening or closing a cell switch and/or module switch as a function of the preceding determination.

The photovoltaic energy generation device management method thus makes it possible to determine at each instant the position of several switches of cells and/or modules, so as to maintain each cell and module under optimal conditions.

The method can moreover comprise an intermediate step consisting in diagnosing a failure and/or an at-risk state of a cell, by recognizing defective cells, for example overheating subsequent to a situation of short-circuit, ingress of moisture, electrical arcing, flame, isolation defect, etc., on the basis of the quantity measured at the level of a cell, so as to disconnect or discard from the overall operation of the photovoltaic energy generation device the cells concerned, by opening for example their cell switch, or by closing the module switch concerned.

Thus, returning to the example illustrated in FIG. 8, it is apparent that cells 1, 2, 5, and 6 have been discarded. In a photovoltaic energy generation device comprising a considerable number of cells and modules, it is easy to discard a significant number of them, for example 10% of the total number of cells, without penalizing the use of the photovoltaic energy generation device since the current demanded is generally less than the maximum current available, used solely in a situation of consumption peak. Otherwise, in case of a spike in consumption, it will always be possible to call momentarily upon the discarded cells to meet the more considerable need.

As a remark, in case of a spike in current, the storage elements associated with the cells also deliver a current complementary to that produced by the photovoltaic cells, thus participating in the overall optimization of the energy production since the energy produced by the cells, even while they are disconnected, is ultimately utilized. The storage elements thus fulfil a buffer role, allowing the retrieval with a stagger of all the energy produced under optimal conditions. They also avoid overly heavy variations in voltage across the terminals of the cells during the operations of connection and disconnection by actuation of their cell switch, allow continuous evolution of their voltage. Accordingly, they are sized so as to maintain a weak variation in the voltage across the terminals of the cell relative to its continuous component $\Delta V/V$, for example less than 5%, thereby allowing a cell to remain close to its optimal conditions, its voltage variation remaining negligible.

The photovoltaic energy generation device management method comprises a step of diagnosing a cell including a step of estimating the state of a cell, which can comprise by way of nonlimiting example one or more measurements of current, voltage, temperature, impedance spectrometry or the like at the level of at least one cell, all or some of the cells of the photovoltaic energy generation device. Accordingly, the measured quantity can be compared with predefined thresholds. The driving of each cell transistor then depends on this estimated state of the cell, and makes it possible for example to disconnect a cell if it causes an abnormal temperature or a current to appear or if it provides a current which is the reverse to the other cells.

This diagnosis step can comprise the identification of the characteristics of at least one photovoltaic cell and/or of the sunshine by opening over a sufficiently long predefined period at least one cell switch so as to measure the no-load voltage of the photovoltaic cell or by closing at least one cell switch and a parallel switch or module switch in such a way as to short-circuit the photovoltaic cell so as to measure the short-circuit current of the said photovoltaic cell.

The method for managing the generation of photovoltaic energy has been described for optimizing the operation of a particular cell of the device. However, the various cells of the device are interdependent and it is useful to also consider them in a global manner.

In particular, it is advantageous to avoid imbalances within one and the same module without which it will not be easy to keep all the cells of the module in their optimal operating condition. Such an imbalance can for example arise if part of the cells is shaded for example. In such a case, the storage elements associated with these various cells are charged at different speeds and the voltages across the terminals of these cells can differ, when the cell switches are open. To compensate these imbalances, the management method can apply the principle described previously, in conjunction with FIG. 20, but in a time-staggered manner for each cell.

FIG. 21 illustrates more precisely a possible embodiment for compensating the imbalance of three cells of one and the same module. At an instant t1, the voltage across the terminals of the first cell, represented by the curve 55, attains a threshold value beyond its optimal operating voltage, and its cell switch passes from the open to closed state, to use the cell. The voltage of the module, represented by the curve 58, then passes from a zero value to the value of the voltage of this first cell. The other two cells which are in shaded positions, and whose voltage is lower, remain unused and their voltage continues to increase, while that of the first cell decreases. The voltage of the module, represented by the curve 58, then decreases, like that of the first cell. At the instant t2, the voltage of the module becomes close to that across the terminals of the third cell, represented by the curve 57, and the cell switch of the latter passes from the open to closed state. Likewise, at the instant t3, the voltage of the module becomes close to that across the terminals of the second cell, represented by the curve 56, and its cell switch passes from the open to closed state. At each addition of an extra cell, at the instants t2 and t3, the slope of the decrease in the voltage of the module is modified, this decrease slows down because more and more cells contribute to the provision of the output current. This progressive connection of the various cells avoids moreover the risks of short-circuits between the cells, with respect to a solution which would consist in connecting at the same time the cells of the module of different voltage. At an instant t4, the voltage of the module falls below a threshold beneath the optimal voltage of the three cells and their switches are then opened simultaneously. The photovoltaic generation device management computer then takes account of the actual voltage of each cell, of their optimal voltage, and also of the voltage of the module.

In this global approach, the computer can compute one and the same global optimal voltage value per module, by taking account of the temperature and optionally of the global sunshine. As a variant, it is possible to compute more precisely an optimal voltage value specific to each module, by taking account of the temperature and optionally of the sunshine at the level of each module. In this case, each module is used in a different manner, is turned to account as a function of its own situation, like its sunshine, the state of its cells, optionally their failure, or indeed their technology if several generations of modules are used (for example if failed modules have been replaced with more recent modules, or if an existing installation has been enlarged by the addition of more recent modules), etc.

Moreover, the photovoltaic energy generation device management method can implement a cyclic modification of the use of the cells, so that all or some of the cells of the photovoltaic energy generation device pass from a normal operating state to a disconnected state and vice versa, according to a determined duty ratio which can be fixed or variable. The operating cycles of the various cells can be staggered over time to obtain at each instant a substantially equivalent number of active cells for example, guaranteeing at each instant a sufficient number of active cells to satisfy the current demanded.

The solution adopted in fact amounts to determining the output current of the photovoltaic energy generation device so that the cells operate to the maximum in their optimal operating point. This current is in fact determined by the sunshine received by the photovoltaic cells. It is impressed on the load linked to the device. However, numerous means are implemented to also get as close as possible to the need of this load in terms of current and voltage, while remaining under the optimal operating conditions of the photovoltaic cells, as will be detailed subsequently.

Thus, the photovoltaic energy generation device management method implements the following steps:
- mutual balancing of the modules and/or cells, using by priority the modules and/or cells whose voltage is the highest when the photovoltaic energy generation device is connected to a load;
- balancing of the modules and/or cells by modifying the mean rate of use of the modules and/or cells, but without using the same modules and/or cells permanently, so that the voltage of the modules and/or cells balances.

The implementation of the method for managing the photovoltaic energy generation device described hereinabove can be implemented by a local and/or remote computer, as has been explained earlier. This computer can comprise one or more microprocessors.

As a remark, the implementation of the method locally, without recourse to a central computer, exhibits the following advantages:
- as the measurement or measurements and their analysis are done locally and independently of the other modules, the reaction can be very fast. It is faster than the embodiment with a central computer which would require a communication by a link with galvanic isolation, with firstly a serial coding which would induce a first lag, and then the transfer by a bus whose restricted bitrate would involve a second lag;
- in the case where a module comprises its own computer, a thorough processing of the measurements can be done, so as thus to reach a precise diagnosis of each cell.

The photovoltaic energy generation device management method can comprise the following specific steps in the case where the management of a cell is entirely local:
- as soon as the failure rate of the cells of one and the same stage attains a threshold, a command orders the opening of all the cells and the activation of a shunt, potentially placed in each of the cells, so as to disable the stage;
- when a cell has failed, for example when there exists a leakage of current, overheating, when it is overly discharged (this being for example detected by crossing below a voltage threshold) or overly charged (this being for example detected by an overshooting of a voltage threshold or of an acceptable number of ampere hours), it is disconnected by opening its series transistor;
- when a cell heats up, it can be connected/disconnected according to a duty ratio, in such a way as to limit its temperature rise. This objective can be achieved by servocontrol of the duty ratio as a function of the temperature measured at the level of the cell;
- if a disconnected cell sees the voltage of the stage fall sufficiently below 0V (a few −100 mV for example), then it closes its parallel transistor (no risk of short-circuiting the cells placed in parallel since the voltage itself crosses through zero: typically when all the cells of the same stage are disconnected and a current is consumed on the photovoltaic energy generation device or when their sunshine/performance is not sufficient to maintain a positive voltage on the stage). A small lag can be provided between the detection of the crossing of the voltage below the threshold and the command of the parallel transistor so that the neighbour cells have also had time to detect the crossing of the threshold;
- upon the application of a recharging current to the photovoltaic energy generation device, if a disconnected cell sees the outside voltage rise above the maximum voltage that a cell can attain on charge, then it closes its parallel transistor (no risks of short-circuiting the cells placed in parallel since in order that the voltage can go beyond this threshold, it is necessary that all the cells of the stage be open);
- if a cell sees too high a current, and this may in particular happen when there are no longer enough cells in parallel to provide the current demanded or to accept the current afforded, then the series transistor of the cell is opened, thereby eliminating the risk of deterioration of the cell. If subsequent to this disconnection, the remaining active cells placed in parallel see too high a current, they will also disconnect themselves;
- when all the cells of a stage are disconnected, and if a current is consumed on the photovoltaic energy generation device, then the voltage at the level of the stage will drop and tend to be negative: at that moment, each of the cells will activate its parallel transistor which will take over for the flow of the current in the photovoltaic energy generation device;
- when all the cells of a stage are disconnected, and if a recharging current is afforded to the photovoltaic energy generation device, then the voltage of the stage will rise and overshoot the maximum charging voltage of a cell: in this case, the cells will trigger the closure of their parallel transistor;
- to be certain that all the cells have properly detected the voltage threshold overshoot, it is possible to intentionally place a small delay on the control of the parallel switch at the level of each cell so as to properly allow the voltage to progress before returning it to zero through this closure;
- if a cell has disconnected subsequent to too considerable a discharge (crossing below a voltage threshold), it may decide to reactivate as soon as the voltage of the stage tends to approach that of the cell (case where the parallel switch has not been activated). If the parallel switch had been activated, then the decision to deactivate it may be made on the basis of a detection of a current in the shunt, which is in the direction of a recharging current or of a discharging current that is below a threshold. The opening of the parallel switch must then allow the voltage of the stage to exit from a zero voltage unless the cell/cells placed in parallel keep their parallel switch closed for another reason. If the voltage of the stage does not succeed in varying after a certain time, then the parallel switch is reactivated to prevent the parallel switches of the cells placed in parallel from supporting the whole of the current for too long. If on the other hand the voltage is no longer zero (or close to 0), then the in-series cell switch is activated;
- if a cell has disconnected subsequent to too considerable a charge (crossing above a voltage threshold), it may decide to reactivate as soon as the voltage of the stage tends to be lower than that of the cell (case where the parallel switch has not been activated). If the parallel switch had been activated, then the decision to deactivate it may be made on the basis of a detection of a current in the parallel shunt circuit which is in the direction of a discharging current. The opening of the parallel switch is then followed by a closing of the cell switch, a small lag between the opening of the parallel switch and the activation of the series cell switch can be provided so as to allow time for all the cells to detect the discharging current;

if a cell has disconnected subsequent to too considerable a current and if the parallel switch has not been activated, this signifies that the cells placed in parallel have been able to support the current and maintain the voltage, then the cell can attempt to reconnect as soon as the voltage of the stage is sufficiently close to the voltage of the cell;

if a cell has disconnected subsequent to too considerable a current and if the parallel switch has been activated, it is probable that the neighbour cells were either overly charged, or overly discharged and no longer participated in the amassing of the current. In this case, as soon as the current which flows in the parallel switch goes below a threshold or becomes of opposite sign to the current which caused the deactivation of the cell (and supposedly the neighbour cells), then it is opened. If a charging current is present, then the cell switch is activated as soon as the voltage approaches the voltage of the cell, and if the voltage does not succeed in rising after a certain time, the parallel switch is reactivated (it is assumed that a cell placed in parallel has not re-opened its parallel switch and it cannot be allowed a considerable current for too long). If a discharging current is present and if the voltage of the stage begins to drop, then the series switch is closed (that is to say as soon as it is certain that the parallel switch of all the cells placed in parallel is open, otherwise it would not have been possible for the voltage to fall), a small lag between the opening of the parallel switch (and then the detection of the voltage drop) and the activation of the cell switch can be provided so as to allow time for all the cells to detect the discharging current and then the voltage drop;

if a cell has disconnected subsequent to an irreparable failure of the latter, then the cell switch is no longer ever reactivated. On the other hand, the parallel switch which must close in certain cases must be able also to open. If the parallel switch has been activated subsequent to the detection of the passage of the voltage of the stage through a value below a threshold (a few −100 mV), then the latter can be re-opened when the current passing through it is below a threshold or a recharging current. If it has been activated subsequent to the detection of the passage of the voltage of the stage through a value greater than a threshold (maximum voltage that a cell can attain on charge) then it can be re-opened when the current passing it through is below a threshold or a discharging current. In fact it is assumed that what has caused the generalized closing of the parallel switches stems from the fact that the cells placed in parallel have attained their full charge or discharge or over-current and that if a contrary current or one that is below a threshold appears in the photovoltaic energy generation device, then the cells placed in parallel will reactivate. If the neighbor cells placed in parallel do not ever reconnect, then the voltage of the stage will pick up again, either beyond the normal maximum voltage or below the normal minimum voltage and again trigger the parallel switches of the cells of the stage;

if a cell has disconnected subsequent to a reparable failure, then the cell can be reconnected when the failure has disappeared (for example when its temperature has gone back down sufficiently or if the cell has been replaced). If the parallel switch had been activated, then the same process as in the previous point is followed.

The previous principles can be implemented in a similar manner on the basis of centralized management.

All these operations of the method for managing a photovoltaic energy generation device have been performed on the basis of an analysis by one or more microcontroller(s). As a variant, as the actions to be performed are simple, it is possible to use all or part of an asynchronous electronic circuit, without requiring a high-frequency clock to limit the energy consumption of the solution. In such a variant, the detection of a threshold would be done directly on an analogue measurement via a comparator and the action induced subsequent to a threshold crossing could be executed in an asynchronous manner via logic circuits, using for example flip-flops, registers.

FIG. 22 illustrates a possible implementation according to such an approach allowing the driving of a parallel transistor 34. In this implementation, measurement sensors, not represented, for measuring the voltage of a module Vmod, the voltage across the terminals of a cell Vcel, and the current I passing through a cell are used. These measured values are compared with three threshold values, two values of high Vs1 and low Vs2 thresholds for the voltage of the module, and a threshold value Is1 for the current. Four operational amplifiers 90 (or comparators) make it possible to compare these measured values with the thresholds explained, so as to determine, with the aid of several logic operators 91 and delay cells 92, a final decision regarding the opening or otherwise of the module transistor 34. The delay cells 92 of this circuit can, in addition to their function of delaying the reaction to a given event, ensure that the result of the comparison is stable over a certain duration, and take into account a transition only when the stability of the result of the comparison has been repeated over a predefined duration, so as to erase the scrambled measurements, for example subsequent to noise caused by the switching of neighbour modules or cells.

An advantage of this type of driving of a module transistor stems from the fact that there is no need to digitize the measured signals and that the reaction can be very fast, without however requiring very high-frequency sampling of the signals. Moreover all the operations can be done in parallel, this being very beneficial if it is desired that all the cells be able to react in a synchronous manner, to exhibit an opening or a closing of a transistor on the basis of the voltage of the stage common to all the cells of the stage, and not on a clock edge which would not be common to each cell of the stage since the same clock could not be shared without additional output on the cells. Such a synchronization can thus make it possible to reduce, or indeed eliminate, the risks of overlap between the closing of the cell transistors 23 and the parallel transistors 34.

Furthermore, the method for managing the photovoltaic energy generation device also implements an additional step of disconnecting all the possible cells during a prolonged shutdown of use of the photovoltaic energy generation device. This step affords considerable safety especially in the particular situations such as subsequent to an accident or to a fire. When a considerable number of cells are disconnected, and preferably all the cells, the risk of obtaining a considerable short-circuit between the cells, even in the case of a considerable incident, remains very low. Moreover, the isolation of the cells on shutdown prevents the cells from discharging through certain cells with the biggest leakage current or exhibiting defects.

According to an advantageous embodiment, the management method of the invention comprises a control of switches of cells and/or of modules so as to obtain an output voltage of predefined value, and/or an alternating output voltage according to a predefined setpoint.

Thus, the photovoltaic energy generation device management method also allows adaptation of the output voltage according to the desired use, for example to the need of an electrical load or of an electrical network. This adaptation comprises for example the restricted choice of a certain number of modules or of subsets to be used in series, the other modules remaining unused, when the total voltage required is less than the maximum voltage that can be delivered by the photovoltaic energy generation device.

The adaptation of the output voltage of the photovoltaic energy generation device of the invention can even take complex forms. Indeed, it is adapted for providing a sinusoidal output voltage, for example of 220 V at 50 Hz to adapt to a public electrical network, or for a synchronous or asynchronous motor. FIG. 23 represents an exemplary regulation of a photovoltaic energy generation device to obtain such a voltage output, implemented for example within the central computer 22 of the embodiment of FIG. 14. This regulation relies on a block 80 for computing a setpoint value of the electrical parameters desired at output of the photovoltaic energy generation device, comprising the setpoint voltage $V_{cons}$ and the setpoint current $I_{cons}$. As a remark, the setpoint can consist of a combination of these current and voltage values, such as for example their product $I_{cons} \times V_{cons}$. The block 80 for determining at least one setpoint value can rely on a vector control, taking into account the adjustment of the amplitude, of the frequency and optionally of the phase of the current/voltage parameter according to the type of motor to be supplied. Naturally, this principle also operates with simpler situations, such as a need for a DC voltage. Thereafter, the regulation block comprises a block 83 for correction, on the basis of the difference between the setpoint values $I_{cons}$, $V_{cons}$ and the corresponding actual values $I_{actual}$, $V_{actual}$, which transmits a need to a block 84 which determines the number of modules required in the photovoltaic energy generation device and optionally the particular cells of these modules to be used. According to a preferred embodiment, the choice of the cells to be used in the modules is made at the level of the modules on the basis of the locally measured parameters. Accordingly, this block 84 also receives the information regarding measurement of quantities performed at the level of the modules and cells of the photovoltaic energy generation device. Finally, a last block 85 implements the choice determined by the block 84, and dispatches in particular the commands required for the various switches of the photovoltaic energy generation device. This results at output in the actual values of the current $I_{actual}$ and of the voltage $V_{actual}$, which make it possible to attain the operating values, such as a speed Spd and a torque Tor transmitted by the block 82. Finally, a frequency-of-variation limiter and/or a low-pass filtering can act on the correction block 83, or on the return loop, to obtain an appropriate mean value, by limiting the cell switching frequencies, such as for example according to a frequency of 200 kHz for an output voltage of frequency 500 Hz.

Figure 1:
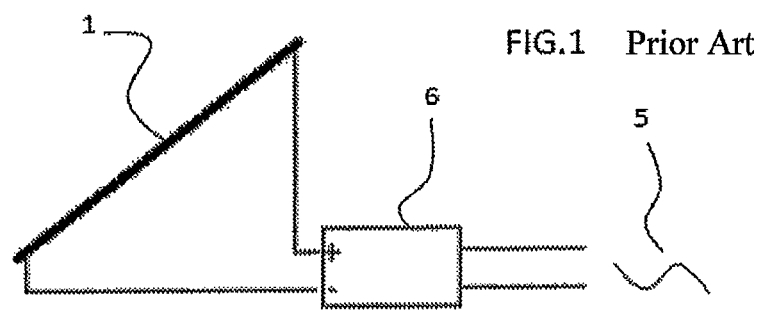

This functionality for regulating the output voltage of the photovoltaic energy generation device allows it to behave as a conversion structure of switched photovoltaic energy generation device type, which avoids the use of a DC/DC converter at the output of the photovoltaic energy generation device, to adjust the voltage to the needs of the application, and allows the use of the photovoltaic energy generation device according to the simplified layout of FIGS. 6 and 7, and no longer like that of FIG. 1 of the prior art.

FIG. 24 represents an exemplary voltage wave which can be provided by the photovoltaic energy generation device via a driving such as explained hereinabove, for a voltage setpoint of sinusoid type at 50 Hz, of peak amplitude 40 V and centred on 40 V, and for a photovoltaic energy generation device consisting of 20 modules of 4 volts each and whose switching frequency is limited to 10 kHz (i.e. 100 switchings per period).

To be able to generate a single-phase voltage centered on 0, it is necessary to be able to use either two columns and a differential voltage, or to add an H-bridge, such as illustrated in FIG. 25, which makes it possible to invert the voltage across the terminals of the photovoltaic energy generation device on the basis of four switches 86, 87, 88, 89, two 86, 87 at the level of a first terminal and two 88, 89 at the level of a second terminal. When the two switches 86, 88 are closed and the other two open, the output voltage $V_{out}$ is positive. On the contrary, when the two switches 87, 89 are closed and the other two open, the output voltage $V_{out}$ is negative.

FIG. 26 illustrates a more detailed implementation of the principle described in FIG. 25, on the basis of a photovoltaic energy generation device structure such as presented in FIG. 14, comprising by way of example five modules of two cells. For each cell 11, a cell transistor 23 is provided, in series with the cell, and a module transistor 24, in parallel, is provided for each module 12, as explained previously. Moreover, at least one sensor for measuring a quantity characteristic of a cell is present at the level of the module, not represented for the sake of simplification. A local control circuit 27, at the level of the module 12, drives the transistors 23, 24 through control signals 41, as has been explained previously, under the orders of a central computer 22 through the communication bus 21 and by way of an interface 37 forming a galvanic isolation. The photovoltaic energy generation device moreover comprises four switches 86, 87, 88, 89 such as presented hereinabove, which are transistors according to this embodiment, driven respectively by the control circuits 27 of the upper and lower extreme modules of the photovoltaic energy generation device, through control links 90.

As a remark, the method for managing the photovoltaic energy generation device implements an optimal switching of the switches 86, 87, 88, 89. For example, if the output voltage must be a sinusoidal voltage, the switching of the transistors is performed when the voltage passes through 0, so as to limit the switching losses. If a 50-Hz wave is desired at the output of the photovoltaic energy generation device, it is necessary to undertake 50 closings/openings per second of the transistors of the H-bridge.

Moreover, the method for managing the photovoltaic energy generation device also advantageously implements intelligent management of the transistors of the H-bridge similar to the steps envisaged for the management of the series transistors or module transistors. For example, it is also possible to associate with them a measurement of temperature or of voltage and/or current, and to take a decision to open a transistor if the measured quantity exceeds a certain threshold, for example in the case of overly high temperature. This measured quantity can naturally be transmitted to a local and/or remote processing circuit so as to implement this intelligent management.

The two extreme modules, upper and lower, of the photovoltaic energy generation device incorporate more numerous electronic components than the other modules. All these components are advantageously supplied electrically by the voltage available at the level of the module. In this case, the extreme modules are invoked more than the others.

Ultimately, the solution described previously exhibits numerous advantages, among which:

- it relies on a multitude of elementary switches, that is to say a multitude of transistors according to the preferred embodiment, spaced far apart, thereby making it possible easily to evacuate the energy dissipated by their operation, since this dissipated energy takes the form of a multitude of small amounts of energy that are scattered within the structure of the photovoltaic energy generation device;
- it makes it possible to perform real-time optimization of the operation of the cells of the photovoltaic energy generation device via dynamic steering;
- it makes it possible to disconnect failed cells;
- it makes it possible to adjust the output voltage of the photovoltaic energy generation device in a gentle manner (low-frequency switching <1000 Hz and with fairly low voltage settings, for example 4 V), without requiring high-frequency chopping of the full voltage of the photovoltaic energy generation device. It makes it possible to adjust a DC voltage desired for the driving of DC motors or for a link with an electrical distribution network.
- it makes it possible to individually isolate a cell of a module, by making it possible in particular to measure its no-load voltage even if the photovoltaic energy generation device is in operation;
- it makes it possible to isolate all the cells, for example subsequent to the detection of a major failure, making it possible to dismiss all electrical risks in respect of the user or people who will have to intervene, for example firemen in case of fire.

By measuring at one and the same time the voltage of the cells and the voltage of a module of the photovoltaic energy generation device, it is possible to deduce therefrom the voltages across the terminals of the power transistors. On the basis of these voltages and of the current passing through the cells or transistors of modules, it is possible, in certain configurations, to detect whether a transistor has failed. Thus, the photovoltaic energy generation device also implements a method for diagnosing the operation of all or some of the transistors which fulfill the essential functions of switches, which can comprise all or some of the following steps:

- if upon the opening of the transistors of cells, the voltage of the stage remains substantially equal to that of the cells while a current flows, this implies that at least one of the cell transistors no longer opens. To ascertain which, it suffices to investigate through which cell the current flows. Thus, the diagnosis method comprises a control step commanding the opening of all the transistors of cells of a module, the measurement of the voltage of the module, and in the case of a value close to the voltage of a cell, measurement of the current passing through each cell and classification of cell transistors as "failed" if a current flows therein. Hereinafter, the module transistor(s) associated with a module of which at least one of the cell transistors has failed (remains closed) is(are) no longer activated so as not to create any short-circuits. The method can comprise a complementary step of transmitting the data relating to the identity of the failed switches and/or of the maximum current that can be delivered by each module to a local and/or central unit. A user must be able to know which transistors have to be changed;
- if upon a command for opening the parallel transistors, the voltage of the stage remains substantially zero while a current flows, then at least one parallel transistor has not opened and has failed. The measurement of the current through each parallel transistor of the module (case for example of a transistor in parallel with each cell) makes it possible to determine the failed parallel transistor or transistors. The diagnosis method therefore comprises a control step for commanding the opening of the parallel transistors, for measuring the voltage and the current, for identifying the failed module transistors if the voltage is zero while a current flows. Hereinafter, the cell transistors associated with a module whose parallel transistor has failed (remains closed) are no longer activated so as not to create any short-circuits. The module concerned is no longer used until its module transistor or the parallel switches is or are replaced;
- if upon the command for closing a cell transistor, a voltage drop appears on a transistor while the current in the associated cell is substantially zero, then the cell transistor has failed and no longer closes. Such a situation limits the current that can be provided by a module. The central computer of the photovoltaic energy generation device is informed by indicating to it the maximum current that the module can still support. Moreover, the user is warned of the transistor to be changed;
- similarly, if the command for closing a module transistor gives rise to a voltage drop on the transistor while the current therein is zero, then this signifies that the transistor has failed and no longer closes. This limits the current that the module can pass when the cells are disconnected. The central computer is warned by indicating to it the maximum current that the module can still support. Moreover, the user is warned of the transistor to be changed;
- when a current in a branch is of opposite sign to the current flowing in the other branches, beyond a certain threshold, then there is diagnosed a leakage current of the normally open transistor of this branch. The central computer is warned by indicating to it the value of the leakage current and the maximum current that the module will still be able to support in the case of a partial or complete failure of the transistor in the passing state which could arise thereafter, according for example to model-based anticipation of the future degradation of the transistor. The main computer will be able for example to favour maintaining the module in a particular state (activation of the cells or of the parallel transistor(s)) so as rather to maintain the transistor with leakage current in a closed state in order to avoid losses, its heating, and to limit its switchings so as to limit its degradation. Moreover, the user is warned of the transistor to be changed.

Naturally, the invention is not limited to the previous examples. In particular, several measurement sensors per cell have been implemented but as a variant other numbers of measurement sensors can be chosen or no sensor. Moreover, it is possible to use other types of measurement sensors than those described, to measure quantities characteristic of the state of a cell other than the voltage, the current or the temperature.

Moreover, the previous embodiments have been described by implementing a cell switch for each cell of the photovoltaic energy generation device. However, it would be possible to obtain an improvement of a photovoltaic energy generation device by managing only part of its cells according to the concept of the invention, and therefore employing the cell switches on only part of the cells of the photovoltaic energy generation device, therefore at least one switch, advantageously on at least two cells of one and the same module so as to allow a certain flexibility in this management. Certain modules might not implement the previously described approach and it is possible to contemplate a photovoltaic energy generation device associating conventional parts and improved modules according to the invention. Moreover, a module switch has been described for each module of the photovoltaic energy generation device, or as a variant of the parallel switches associated with each cell. Such switches remain optional and could be eliminated, in a simplified version of the invention. Moreover, the invention covers all the intermediate embodiments incorporating one or more module switch(s) and/or parallel switches, for part only of the modules.

Such switchs remain optional and could be eliminated, in a simplified version of the invention. Moreover, the invention covers all the intermediate embodiments incorporating one or more module switch(s) and/or parallel switchs, for part only of the modules.

Finally, the examples represented comprise few cells for the sake of the clarity of the figures. However, the embodiments envisaged are adapted for the implementation of energy generation devices able to provide a considerable output voltage, that may attain several hundred volts, for example for a 220-volt mains connection. They are therefore adapted for devices comprising a considerable number of modules, in particular greater than or equal to 8.

FIGS. 28 to 30 illustrate for this purpose variant embodiments for implementing a shunt function for several modules of a photovoltaic energy generation device, which rely on complementary switches disposed in parallel with several modules making it possible to add a circulation path of the current when several modules are deactivated, thus limiting the losses.

Thus, FIG. 28 adds a first series of switches 214 each making it possible to shunt four consecutive modules, a second series of switches 314 each making it possible to shunt six consecutive modules, a third series of switches 414 each making it possible to also shunt six consecutive modules but staggered with respect to the second series, a fourth series of switches 514 each making it possible to also shunt six consecutive modules but staggered with respect to the previous two series, a fifth series of switches 614 each making it possible to shunt eight consecutive modules and a sixth series of switches 714 each making it possible to also shunt eight consecutive modules but staggered with respect to the fifth series.

All the switches of these various series are disposed between the lower and upper terminals of different modules, in parallel with one another. Naturally, their management is coherent to avoid creating short-circuit situations, as has been explained in the previous examples.

The two FIGS. 29 and 30 illustrate two other variant embodiments according to the same approach.

The advantage of these various embodiments is to add circulation paths of the current which are much more direct upon the deactivation of several modules by virtue of switches which shunt several stages at one and the same time, thereby generating much fewer losses. Thus, at each instant, according to the number of modules required, a substantially optimal configuration is implemented to minimize the total resistance of the photovoltaic energy generation device.

The various switches mentioned, cell and/or module and/or parallel switches, have been implemented with the aid of transistors. NMOS or PMOS transistors have been represented mainly, but it is however possible to use NPN and PNP bipolar transistors, which exhibit the advantage of being able to be controlled with a fairly low voltage, FET, JFET, IGBT, GaN transistors, relays, etc. As a variant, any other type of switches than those described could be implemented, such as thyristors if the current is naturally required to reverse at the moment where it is desired to open it.

The photovoltaic energy generation device of the invention can be managed by an intelligent unit, a computer or local and/or remote processing circuit accessible through a local communication device, this computer being able to comprise any software element and/or hardware element to manage the photovoltaic energy generation device, in particular to determine the configuration of its switches. Accordingly, the photovoltaic energy generation device can incorporate any actuation means, any control circuit, for its switches.

Numerous other variant embodiments of the invention can be easily contemplated through a simple combination of the previously described embodiments and/or their variants.

As a remark, the communication within the photovoltaic energy generation device and/or to an outside unit can be done according to a carrier current principle, provided that the current demanded by a load is not too considerable to authorize the disconnection of certain cells. Indeed, this principle relies on an intentional alternation of connections and disconnections of certain cells of the photovoltaic energy generation device, so as to create a modulation of induced current and a modulation of power at the level of a module, which propagates to the whole of the photovoltaic energy generation device and beyond. This power modulation is therefore visible by the other modules of the photovoltaic energy generation device and by an outside load, thereby making it possible to use it to transmit information according to any communication protocol, existing and standardized or not. A master circuit may for example be defined which interrogates all the cells in turn, through their address, each cell thereafter responding in a dedicated time slot. The master can for example request an item of information such as a measurement of voltage, current and/or temperature at a certain cell, and then the latter can dispatch the item of information requested with optionally a code making it possible to inform regarding a possible failure or otherwise. This principle thus allows various cells of the photovoltaic energy generation device to communicate simply with one another, or to communicate towards a central computer or a processing circuit of the photovoltaic energy generation device or towards an outside unit. As a remark, the modulation of current can be done without disconnecting a cell completely, but simply by modulating the resistance in the passing state of the cell transistor, that is to say by modulating the gate voltage of the transistor around a bias point. This modulation of resistance in the passing state can also be done on the module transistor when the latter is activated. This then makes it possible to communicate even if the stage is deactivated by the opening of the cell transistors. Communication by carrier current makes it possible to modulate a considerable current at the level of a module without however engendering considerable electrical losses. Indeed, this current modulation is done by modulating a consumption of current which is simply stored and destored since it belongs to a photovoltaic energy generation device coupled to a storage element, this implying that the losses which exist in a dissipative element such as a resistor or a transistor in linear mode, conventionally used for a carrier current system, do not exist.

FIG. 27 thus schematically illustrates the basic implementation, wherein a first module 12 of a photovoltaic energy generation device generates a communication signal 100 by the actuation of at least one cell switch 13, while a corresponding signal 101 is thereafter received at the level of a second module 12' of the photovoltaic energy generation device.

FIG. 31 illustrates a variant of the embodiment of the invention, in which the photovoltaic energy generation device is separated into four equivalent parts or subsets comprising several modules of several cells. The structure of these modules incorporates the concept such as described above, and here each cell comprises a cell switch and each module a module switch. These various parts can be either disposed in series, by closing first switches 103 linking them and by opening second switches 104, this then representing a geometry such as described previously with reference to FIG. 7, or in parallel by opening on the contrary the first switches 103 and by closing the second switches 104. As a variant, any intermediate combination is possible, such as the grouping of the parts two by two in series, and then the disposition of these groupings of two parts in parallel. This variant makes it possible to have the choice between a considerable output voltage Vs or a lower voltage but a greater output current Is than that which would be obtained with all the parts in series. Thus, this structure becomes utilizable as soon as the desired output voltage is lower than that which can be provided by half the modules. If this voltage is lower than a quarter of that which can be provided by the entirety of the modules in series, then the four parts represented can be used in parallel.

As a variant, the same approach could be implemented with any other number of parts; each module could even represent a part, adapted for an association in series or in parallel with the remainder of the photovoltaic energy generation device. Moreover, these various parts could be mutually different, not comprise the same number of cells. The method for managing the photovoltaic energy generation device could thus comprise a step of automatic computation of the number of parts to be placed in parallel, according to a predetermined period, as a function of the voltage and current demanded at output, and then a step of actuating the 103, 104 so as to obtain the photovoltaic energy generation device geometry best adapted to the need, at each instant.

FIG. 32 thus illustrates an implementation of the principle described hereinabove with reference to FIG. 31. In this example, the photovoltaic energy generation device comprises only two parts of three modules to obtain clarity of the representation. Naturally, this principle can be duplicated for a photovoltaic energy generation device of a hundred or so modules, which is divisible into a multitude of parts. The photovoltaic energy generation device represented corresponds to that described with reference to FIG. 14. All the modules comprise the electronic components already described in detail and are linked to a central computer 22 by a communication bus 21 and a galvanic isolation 37. The photovoltaic energy generation device is moreover equipped with an II-bridge by way of four switches 86 to 89 such as explained previously. Finally, the splitting of the photovoltaic energy generation device into two parts is obtained by the addition of three transistors forming the switches 103, 104, 104' explained previously. As is illustrated, two transistors 103, 104 are positioned in the central part of the photovoltaic energy generation device so as to be driven by control circuits 27 for the adjacent modules distributed physically on either side of these transistors. Furthermore, a transistor 104' is positioned towards the lower end of the photovoltaic energy generation device and is driven by a signal 90 of the control circuit for the lower module of the photovoltaic energy generation device. Naturally, these switches 103, 104, 104' could be distributed differently within the structure of the photovoltaic energy generation device.

FIG. 33 schematically illustrates the various blocks of the computer 22 which implements a method for managing the photovoltaic energy generation device, which comprises several modules 12 which can be placed mutually in series or in parallel, according to the principle described hereinabove, and which is linked to the mains 5. This computer implements a first computation in a block 82 of the ratio of the voltage of the mains 5 to the mean voltage of a module or stage 12, obtained in a first block 81, thereby giving the number, non-integer, of modules to be placed in series to attain, under no load, the voltage corresponding to that of the mains 5. It deduces therefrom in a block 83 the number N of modules to be placed in series to obtain, with the desired current, the voltage corresponding to that of the mains 5. Accordingly, a rounding block is disposed at the output of this block 83, making it possible to obtain an integer number. A block 84 computes a mean deviation between the voltage of the modules and their optimal voltage, and implements feedback to approach the optimal situation, by blocks 85. This solution amounts to modifying the output current so as to approach a situation more favourable for attaining optimal operation at the level of each module. Accordingly, a coefficient α is chosen, preferably bounded, to adjust the overall current so as to attain optimal operation of the module. The result is also transmitted to the block 83 for computing the required number of modules. Thereafter, a block 86 performs the selection of the N particular modules to be used, in particular by taking account of the deviation between their voltage and their optimal voltage, favouring those whose voltage is the furthest above this optimal voltage.

FIG. 34 thus illustrates another exemplary embodiment of a photovoltaic energy generation device comprising eight modules of two cells, said modules being distributed in two parts of four modules, each part respectively retrieving a voltage $V_1$ and $V_2$. This photovoltaic energy generation device moreover comprises ten MOS transistors, of which five transistors K11 to K15 are tied to the first part and five transistors K21 to K25 are tied to the second part. These ten transistors are controlled directly by the adjacent modules. They make it possible to implement the two functions of voltage inversion and of placing the two parts of the photovoltaic energy generation device in series or parallel. Accordingly, this does indeed entail a solution equivalent to the previous layout. The total voltage $V_s$ retrieved by the photovoltaic energy generation device is in fact defined by the following formulae:

$V_s=V_1+V_2$ when the transistors K13, K14 and K21 are closed, the others being open, $V_s=-V_1-V_2$ when the transistors K11, K23 and K24 are closed, the others being open, $V_s=V_1=V_2$ when the transistors K12, K22, K15, K25, K14 and K21 are closed, the others being open, $V_s=-(V_1=V_2)$ when the transistors K12, K22, K15, K25, K11 and K24 are closed, the others being open.

This embodiment comprises transistors K14, K15, K24 and K25 which are never subjected to a voltage greater than $V_1$ or $V_2$, thereby making it possible to choose low-voltage transistors, able to receive a higher current without generating too many losses. The ten transistors are controlled via electronics which can be powered and placed on the lower and upper modules of the two parts of the photovoltaic energy generation device, as in the previous cases. As the source potentials of these transistors are referenced with respect to these modules, this simplifies their control.

In the case of a photovoltaic energy generation device comprising N modules, if the computation determines that n modules in series are necessary to obtain a required voltage, then the following computation can be performed:

If n<N/2 then placing of two parts in parallel, by splitting the photovoltaic energy generation device into two;

if n<N/3, division of the photovoltaic energy generation device into three parts, etc.

As a variant, a regulation of hysteresis type can be chosen, to avoid switching the switches too often when the required voltage varies around a limit value like N/2. Accordingly, it may be decided to undertake the division of the photovoltaic energy generation device into p parts when n<N/p−q, where q is an integer constant.

As a variant, the method for managing the photovoltaic energy generation device can implement any regulation around an output voltage and/or current value. When the output voltage is less than the setpoint value, the number n of modules in series is increased, and on the contrary if it is greater than the setpoint value, then this number n is decreased. To prevent the number n from oscillating between two values to attain a setpoint value which is unattainable with an integer value of n, a frequency-of-variation limiter can be used and/or a low-pass filtering at the level of the corrector or of the return loop so as to attain regulation on a mean value.

If the photovoltaic energy generation device must provide an alternating voltage, or any voltage varying over time according to a given period, the placing in parallel of various parts of the photovoltaic energy generation device can be decided on similar criteria, applied to the amplitude of the sinusoid or of the variable voltage to be provided, so as to avoid toggling from one mode to another too often, at each period. Globally, the required current may be all the higher, the lower the amplitude of the required voltage.

FIG. 35 represents an embodiment of a control circuit for commanding the transistors 23, 24, via the discharging of an inductance 105, previously charged through the closing of two transistors, PMOS 106 and NMOS 107, by which it is flanked. When the inductance 105 is sufficiently charged, the NMOS transistor 107 opens while the PMOS transistor 106 remains closed. The current then passes through the diode 108 and will then charge the gate of the module transistor 24, sufficiently to induce its change of state.

Moreover, the invention is also compatible with a three-phase implementation. FIG. 36 illustrates in a simple manner a photovoltaic energy generation device comprising three columns 109, each of similar architecture to a photovoltaic energy generation device according to the invention such as described above, making it possible to supply a three-phase motor 15.

FIG. 37 illustrates a variant embodiment of a photovoltaic energy generation device adapted for delivering a three-phase voltage to a three-phase motor 15, which differs from the previous embodiment through the fact that each column 109 of the photovoltaic energy generation device is equipped with switches 86 to 89, advantageously transistors, to produce H-bridges such as explained in conjunction with FIG. 25. This H-bridge makes it possible to double the peak-to-peak control voltage for the motor and therefore to halve the output current for one and the same output power (Ueffleff=cst). These switches switch twice per period, that is to say on each change of sign of the output voltage. This architecture, with respect to that of FIG. 36, makes it possible to prevent the current provided by a column from moving in the form of a reverse current in another column at certain moments of the period. In this solution, the three coils of the three-phase motor 15 can be supplied independently. This isolation can make it possible to galvanically isolate each of the columns 109 of the photovoltaic energy generation device. This isolation may in particular be useful if the three columns 109 are separated into three photovoltaic energy generation device blocks which are physically distributed in various locations, for example within a vehicle for reasons of electrical safety.

FIG. 38 illustrates another variant embodiment making it possible to provide a three-phase power supply. The device used comprises the arrangement in series of two structures or two photovoltaic energy generation device columns such as are described in relation to FIG. 25. As has been presented, each column is adapted for retrieving an alternating output voltage of sinusoidal type. By applying a phase shift of $2\pi/3$ to the voltages retrieved by these two columns, it is possible to recover a three-phase voltage as output of the photovoltaic energy generation device. As a remark, each column is linked to its central computer 22, 22' by respectively a communication bus 21, 21' and these two computers 22, 22' are linked up with a main computer 222 which manages the photovoltaic energy generation device as a whole and in particular the coordination of its two columns.

The three computers thus share the implementation of the method for managing such a photovoltaic energy generation device. By way of example, the main computer 222 determines the number of stage n1 and n2 to be used on respectively each of the two columns of the photovoltaic energy generation device. Accordingly, a solution consists in choosing the numbers n1 and n2 according to the following rule:

n1=rounded to the integer nearest to [(amplitude of the setpoint peak voltage/voltage of a module)*sin($2\pi f\ t$)]

n2=rounded to the integer nearest to [(amplitude of the setpoint peak voltage/voltage of a module)*sin($2\pi f\ t$)]

The computer defines a desired output setpoint, including the frequency f of the signal and its amplitude. In the case of the use of the photovoltaic energy generation device to supply a motor, the output voltage and the current and the speed of the motor can be managed according to a servo-control loop. The numbers n1 and n2 are adjusted at any instant t to attain the setpoint defined by this servocontrol.

As a supplement, the two computers 22, 22' dedicated to each column of the photovoltaic energy generation device determine more precisely the modules (and optionally the cells) to be used in order to comply with the numbers n1 and n2 defined while attaining the required values of voltage and current. This choice is carried out in such a way as to comply with the state of the various modules. Accordingly, each computer 22, 22' receives the item of information regarding the state of each module of its column, thereby making it possible to determine precisely which n1 and n2 modules are used at each instant. Thus, the cells which make it possible to obtain the short-term required current are selected, and remain connected until the crossing of the current peak, thereby avoiding overly numerous connections and disconnections of the modules. The modules which are able to provide only a lower current are then used only when the required peak current is less than the capacity in terms of current of these modules.

Moreover, the main computer 222 also transmits the item of information regarding the sign of the required voltage, so that each column positions its H-bridge as a function. According to an advantageous embodiment, this item of information is transmitted to each column by modifying the sign of the numbers n1 and n2.

Moreover, the management method also comprises a step of transmission to the main computer 222 of the item of information regarding the state of each module of the two columns. It is thus possible to compute the maximum current and the voltage that can be provided by the photovoltaic energy generation device to take account thereof during the management of the photovoltaic energy generation device: in case of need, the main computer 222 can thus implement a limitation of the peak current required or absorbed, or indeed a limitation of the speed of the motor in the case of a power supply of the motor.

Ultimately, all the embodiments of previously illustrated energy generation devices show that it is possible to use various types of switches to fulfill different and complementary functions, among which:
- cell switches, to connect or disconnect a particular cell of the device;
- parallel switches, to by-pass or otherwise a particular cell of the device;
- module switches, to by-pass or otherwise a module of the device;
- switches to by-pass or otherwise several modules simultaneously of the device;
- switches to invert or otherwise the voltage at the output of the device;
- switches for series/parallel inversion to dispose certain sub-parts of the device in series or in parallel.

According to an advantageous embodiment, as has been described, all these switches are driven by a control circuit powered by at least one cell of the device itself, that is to say powered locally, without recourse to an outside power supply. Moreover, the driving of a switch is preferably carried out by a sufficiently close control circuit, powered by at least one cell of the module which is closest or in proximity, so as to bring into play voltages of one and the same order of magnitude between the control circuit and the driven switch, for example the driven transistor. Accordingly, it is advantageously chosen to drive a switch, one of whose terminals, source or drain terminal in the case of an NMOS transistor for example, is linked to a voltage of a certain module by a control circuit powered by this same module or an adjacent module, more exactly by at least one cell of one of these modules. More generally, it will be possible to choose any control circuit whose power supply link is on a module whose potential difference with the terminals of the switch does not exceed a predefined threshold, which would run the risk of damaging the switch, of creating a situation of electrical risk. This threshold is defined by safety standards and depends on the type of switch employed. This local power supply, in proximity, exhibits the second advantage of allowing the use of drive links of short length between the control circuit and the switch.

Thereafter, it should be noted that the control circuit must allow the reliable actuation of the various switches. In a case where the various modules exhibit a potential difference of 3 V or less and the switch is of NMOS type, a control circuit preferably incorporates a voltage booster (for example a charge pump) to increase the voltage present on its input terminals, and use as output a higher voltage for the actuation of the switches, as a function of these latter. In the case of an NMOS transistor for example, it will be chosen to power its gate with a voltage such that the voltage difference between its gate and its source is of the order of 20 V, to guarantee reliable actuation.

FIG. 39 thus illustrates an exemplary use of such a photovoltaic energy generation device applied to a resistive load, with certain assumptions regarding aging and loss of capacity of certain modules.

The invention has been described with embodiments in which each stage or module is composed of cells, associated with switches driven by a control circuit. However, it is possible to contemplate variants in which not all the cells comprise a cell switch, and/or in which not all the modules are driven, as has been mentioned previously.

Moreover, it has been seen that it is beneficial to be able to modify the number of cells in series or in parallel, so as to more easily adapt to the need as a function of sunshine. FIGS. 40 to 46 illustrate for this purpose other embodiments of photovoltaic energy generation devices, wherein the cells are organized differently inside the modules, so as to facilitate the modification of their number in series or parallel and adapt to the conditions of sunshine and demand of a load.

Thus, FIG. 40 schematically represents an embodiment of the invention wherein a photovoltaic energy generation device comprises a multitude of cells 111 organized as several modules 112.

In this embodiment, each module 112 comprises a lower terminal 117, linked to a lower neighbour module, and an upper terminal 118 for a series link with the upper neighbour module. Each module is composed of bricks 120 disposed in parallel between its two terminals 117, 118. In this embodiment, each brick 120 comprises two vertical branches extending between its two terminals, lower 117 and upper 118, on which are respectively disposed in the following order from bottom to top: a cell 111 and a switch K1 on the first branch, and a switch K3 and a cell 111 on the second branch. Moreover, a transverse branch comprising a third switch K5 links the two intermediate terminals 116 disposed on each of the two vertical branches between the cell 111 and the switch K1, K3.

This architecture allows a brick 120 to occupy the following various configurations:
- if the switches K1 and K3 are closed and the switch K5 is open, then the two cells 111 of the brick are disposed in parallel: this configuration makes it possible to obtain the maximum current through the brick;
- if the switches K1 and K3 are open and K5 closed, then the two cells 111 of the brick are disposed in series: this configuration makes it possible to obtain the maximum voltage of the brick, and the maximum voltage of a module 112;
- if the switch K5 is open and a single of the two switches K1 or K3 is closed, then a single of the two cells of the brick is active;
- finally, if all the switches are open, the two cells of the brick are disconnected from the remainder of the device.

It is thus apparent that this architecture allows each brick and therefore each module to provide a zero, simple or double voltage, a zero, simple or double available current, simply by choosing the position of the three switches K1, K3, K5 disposed at the level of the cells of a brick. For this reason, these three switches will simply be called "cell switch 113" subsequently.

On the chosen embodiment, each module 112 also comprises a switch K6 114 in parallel with the bricks 120 of the module 112, thus making it possible to short-circuit the whole of the module: accordingly, we shall call it a "module switch 114" subsequently. It is useful when all the bricks of a module are in the disconnected configuration. As a remark, in this embodiment, the closing of the switch K6 requires that the switches K1 and K3 be reversible in voltage.

The use of such a photovoltaic energy generation device to supply a load, such as a motor, makes it possible to circumvent the intermediate converters used in the prior art, as has been explained previously.

FIG. 41 represents a variant embodiment in which each brick 120 comprises two additional switches K2, K4, disposed on each vertical branch on the cell 111 side with respect to the intermediate terminal 116. Such an architecture offers additional configurations, further to the configurations already explained in relation to the previous embodiment. It makes it possible in particular to impose a zero voltage difference between the two terminals 117, 118 of a module, by closing the three switches K1, K3, K5 and by opening the other two switches K2, K4.

FIG. 42 illustrates another embodiment in which the bricks presented in the previous embodiments are associated two by two in each module 112 so as to allow cells to be placed in series or in parallel four by four, rather than two by two. Indeed, two bricks 120, 120' are linked by three branches and three additional switches K7, K8, K9 disposed respectively between the two lower terminals of the two bricks, between their two upper terminals, and between the upper terminal of the first lower brick 120 and the lower terminal of the second upper brick 120'.

The three so-called "intermediate" additional switches K7, K8, K9 between the two bricks 120, 120' can occupy the following configurations:
- K7 and K8 closed, K9 open: the two bricks 120, 120' are disposed in parallel between the two terminals 117, 118 of the module;
- K7, K8 open, K9 closed: the two bricks 120, 120' are disposed in series between the two terminals 117, 118 of the module.

As the cells 111 of each brick 120, 120' can themselves be situated in series or in parallel, it is apparent that the following configurations are possible:
- the four cells 111 can be situated in parallel between the terminals 117, 118 of the module;
- the four cells 111 can be situated in series between the terminals 117, 118 of the module;
- two sets of two cells in parallel can be situated in series;
- two sets of two cells in series can be situated in parallel.

As a remark, four switches K10, K11, K12 and K13 are disposed on the output of the module. They make it possible to cancel the output voltage of the module (between the potentials of the connections situated between K10 and K11 and between K12 and K13) without requiring bidirectional transistors at the level of K1, K3, K1' and K3', by closing K10 and K12 (K11 and K13 open) or by closing K11 and K13 (K10 and K12 open). These four transistors moreover make it possible optionally to invert the output voltage of the module. As the maximum voltage of the module is relatively limited (for example less than 30 V), this makes it possible to use transistors of low voltage withstand, which are less expensive and less resistive than transistors which ought to withstand the full voltage of the device so as to effect a voltage inversion only at the level of the device. Each of these modules equipped with their output inverter are thereafter placed in series and/or parallel to attain the peak voltages/currents desired at the level of the device.

FIG. 43 represents a variant of the previous embodiment, in which each brick comprises five cell switches 113 K1, K2, K3, K4, K5, in a manner similar to the embodiment illustrated in FIG. 41. Moreover, the modules are simply disposed in series, without the switches K10 to K13 provided in the previous embodiment.

FIG. 44 shows in a schematic manner the architecture provided for at the level of a module for the management of such a photovoltaic energy generation device. This same management architecture can readily be implemented on all the other embodiments of photovoltaic energy generation device.

One or more measurement sensors, not represented, for measuring for example the temperature, the voltage and/or the current, are provided for each cell of the module 112 and communicate their measurements to a measurement unit 135. The measurements performed by this or these sensors are transmitted to a local processing circuit 130, via a multiplexer for example, by communication pathways, not represented. The processing circuit 130 thus receives these data through a communication pathway 131 performing a digitization, of "ADC input" type; or as a variant, these signals arrive already digitized, this digitization being carried out at the level of the multiplexer. According to a possible embodiment, the processing circuit 130 can be a microcontroller having a sufficient number of input/output to interrogate all of the sensors. All the transistors used to form the cell switches 113, to form the device for series/parallel inversion between the bricks of the module (K7, K8, K9), and to form the device for series/parallel inversion with the adjacent modules (K10 to K13), are driven by a control circuit 127 which transmits control signals 141 to them, under the orders of the processing circuit 130. Finally, the latter is linked to the central computer by the communication bus 121 and by way of an interface 137 forming a galvanic isolation. All these components associated with a single module are powered by the voltage of at least one of the cells 111 of the module 112, according to the solutions explained during the previous embodiments, for example by way of a link 128 and of a diode 140. As in the case of FIG. 42, it is possible to contemplate a variant embodiment without the transistors K2, K4, K2' and K4' represented in FIG. 43.

FIG. 45 illustrates another embodiment of a photovoltaic energy generation device of which a module comprises the association of four bricks 120 such as presented previously, to form a basic structure of four bricks that we will call a "superbrick" 156. This superbrick comprises a first brick linked to the lower terminal 117 of the module, and linked to a second brick linked to the upper terminal 118 of the module by way of three switchs K12, K13, K14 making it possible to dispose these two bricks in series or in parallel, according to a manner of operation explained previously. This same association of two bricks is disposed between the two terminals, lower 117 and upper 118, of the module in parallel with the two bricks described previously. These four bricks together form a superbrick, which serves as the basis for the architecture of the photovoltaic energy generation device. The latter therefore comprises a multitude of other superbricks, not represented, disposed on the same module in parallel with the superbrick illustrated and/or on the other modules. This superbrick offers a multitude of possibilities for arranging eight cells, either all in parallel, or in two parallel vertical branches each of four cells in series, or according to intermediate configurations such as four vertical branches each of two cells in series for example.

FIG. 46 presents a variant of the previous embodiment in which two intermediate terminals 116, 116' of the two lower bricks of the superbrick are linked, as are the two upper terminals of these same two bricks. This configuration offers the additional possibility of placing a cell of one of the two lower bricks in series with a cell of the other brick for example.

As a variant, other links between the four bricks of the superbrick can be implemented, such as a link between intermediate terminals of the two upper bricks, in a manner similar to the layout chosen for the two lower bricks, and/or a link between the other intermediate terminals of the two lower bricks, etc.

Naturally, these embodiments described with reference to FIGS. 40 to 46 can be managed by the photovoltaic energy generation method described previously. Moreover, the devices illustrated can be combined together to propose other variant embodiments.

In a fractal manner, it is possible to associate as many bricks as desired to ensure series or parallel placements of a desired number of cells. For example, returning to the example of FIG. 42, it is possible to place the two subsets of two elementary bricks in series or parallel via the transistors K7, K8 and K9. It is possible to extend this principle, each time rising one level by associating two groups of four elementary bricks via transistors K7', K8' and K9' and then K7", K8" and K9", etc., to form a module containing a more considerable number of completely switchable series/parallel cells and making it possible to generate an output voltage varying in increments of an elementary cell voltage (from the voltage of an elementary cell to the voltage corresponding to the whole set of cells in series). If moreover a voltage inverter is placed at output, the module can take an output voltage ranging from more or less the voltage of all the cells in series, by cell voltage increments.

All the modes of execution represented by FIGS. 40 to 46 and described hereinabove can naturally be combined with the embodiments described previously, to obtain a considerable number of additional embodiments. For example, any brick or superbrick can be incorporated into the modular structures described previously, for example in replacement for a single cell, to obtain variant embodiments.

The invention claimed is:

1. Photovoltaic energy generation device, comprising at least one brick consisting of:
   (a) a lower terminal,
   (b) an upper terminal,
   (c) two cells arranged between the upper and lower terminals, each cell consisting of an elementary photovoltaic cell, and a storage element connected to terminals of the elementary photovoltaic cell,
   (d) three cell switches which switch to connect said two cells at least one of in series and in parallel,
   (e) first and second branches extending between the lower and upper terminals, wherein the first branch extends between the lower and upper terminals and consists of a cell connected to the upper terminal and a first of the three cell switches connected to the lower terminal, wherein the second branch extends between the lower and upper terminals and consists of a second of the three cell switches connected to the upper terminal and a cell connected to the lower terminal, and
   (f) a transverse branch consisting of a third of the three cell switches linking respectively intermediate terminals, disposed between the cell and the cell switch, of each of the first and second branches.

2. A Photovoltaic energy generation device, wherein the device comprises a module comprising a lower terminal and an upper terminal, between which are disposed two bricks, linked by three branches, and three switches disposed respectively between two lower terminals of the two bricks, between two upper terminals of the two bricks, and between an upper terminal of a first lower brick and a lower terminal of a second upper brick, connecting the two bricks at least one of in series and in parallel, wherein each of the bricks is a brick according to claim 1.

3. A Photovoltaic energy generation device wherein the device comprises a module comprising a lower terminal and an upper terminal, between which are disposed plural sets of more than two bricks that are able to be electrically disposed at least one of in series and in parallel therebetween, and these sets being able to be electrically disposed at least in series and/or in parallel between the upper and lower terminals of the module by several switches, wherein each of the bricks is a brick according to claim 1.

4. A Photovoltaic energy generation device, wherein the device comprises a module comprising a lower terminal and an upper terminal, between which are disposed four bricks so as to form a superbrick, this superbrick comprising a first set comprising a first brick linked to the lower terminal of the module, and linked to a second brick linked to the upper terminal of the module by way of three switches making it possible to dispose these two bricks in series or in parallel, and comprising a second set of two other bricks disposed between the two terminals, lower and upper, of the module in parallel with the first set of two bricks, wherein each of the bricks is a brick according to claim 1.

5. Photovoltaic energy generation device according to claim 4, wherein the device comprises at least one intermediate electrical link distinct from the upper and lower terminals between the two sets of two bricks.

6. A Photovoltaic energy generation device, wherein the device comprises several modules disposed in series, and in that each module comprises a lower terminal and an upper terminal between which are disposed several bricks in parallel, and/or several sets of two bricks interlinked in series and/or parallel, and/or several superbricks, each superbrick formed from four bricks, in parallel, wherein each of the bricks is a brick according to claim 1.

7. Photovoltaic energy generation device according to claim 1, wherein the device comprises
   at least one H-bridge configured to invert a voltage across terminals of all or part of the photovoltaic energy generation device, and/or
   several subsets of cells and switches disposed between these subsets configured to dispose two subsets in series or in parallel.

8. Photovoltaic energy generation device according to claim 1, wherein the device comprises at least one of the following:
   (a) a module switch connected in parallel with a module and at least one control circuit connected to the module or the brick,
   (b) a parallel switch connected in parallel with one of the cells and at least one control circuit connected to the brick,
   (c) cell switches disposed in series with one of the cells and at least one control circuit connected to the brick,
   (d) at least one switch disposed in parallel with several modules and at least one control circuit connected to the several modules or the brick, and/or
   (e) switches for inverting the voltage across the terminals of all or part of the photovoltaic energy generation device and/or electrically modifying connection in series or in parallel of subsets of cells of the photovoltaic energy generation device and at least one control circuit connected to the brick.

9. Photovoltaic energy generation device according to claim 8, wherein the device comprises at least one processing circuit connected at one of the module, the several modules, the brick, and a central computer, wherein the at least one processing circuit drives switches of the photovoltaic energy generation device via the control circuit.

10. Photovoltaic energy generation device according to claim 9, wherein the one or more control circuit(s) and/or at least one processing circuit are connected electrically by at least one cell of the photovoltaic energy generation device.

11. Photovoltaic energy generation device according to claim 1, wherein the device comprises
a sensor for measuring current of a cell, and/or
a sensor for measuring voltage across terminals of a cell and/or across terminals of a cell switch, and/or
a sensor for measuring temperature of a cell and/or for impedance spectrometry measurement.

12. Photovoltaic energy generation device according to claim 1, wherein the device comprises an electronic card comprising at least one of the following:
terminals for a link with cells of the photovoltaic energy generation device,
cell switches,
a module switch connected in parallel with a module,
a parallel switch connected in parallel with a cell,
at least one switch disposed in parallel with several bricks or modules or subsets of cells,
switches for inverting the voltage across the terminals of all or part of the photovoltaic energy generation device and/or modifying connection in series or in parallel of subsets of cells of the photovoltaic energy generation device,
sensors for measuring a quantity characteristic of a state of cells,
a control circuit for the cell switches,
a processing circuit.

13. Photovoltaic energy generation device according to claim 1,
wherein the device comprises several transistors configured to function as switches and/or
wherein the storage element comprises a capacitor.

14. Method for managing a photovoltaic energy generation device comprising the bricks according to claim 1, wherein the method comprises a step of:
determining position of the cell switches of at least one brick of the photovoltaic energy generation device so as to connect its two cells in series or in parallel and to maintain its two cells in an operating state in a range around a predetermined optimal operating point of the photovoltaic energy generation device.

15. Method for managing a photovoltaic energy generation device according to claim 14, wherein the position of at least one cell switch maintains the cell in an operating state in a range of plus or minus 5% around an optimal voltage operating point.

16. Method for managing a photovoltaic energy generation device according to claim 14, wherein the method comprises a step of:
charging of the storage element by a photovoltaic cell during its disconnection from a remainder of the device.

17. Method for managing a photovoltaic energy generation device according to claim 14, wherein the method comprises a step of:
comparing an actual state of a cell with an optimal operating state, stored previously in an electronic memory, or a step of searching for the optimal operating conditions of the cell.

18. Method for managing a photovoltaic energy generation device according to claim 14, wherein the method comprises the implementation of the following steps:
measurement of a quantity representative of a state of a cell and transmission of the measured quantity to at least one computer;
determination of the position of a cell switch and/or module switch and/or parallel switch and/or a switch for placing bricks in series or parallel by taking into account the measured quantity;
transmission of a command for opening or closing a switch as a function of a previous determination.

19. Method for managing a photovoltaic energy generation device according to claim 18, wherein the method comprises a step consisting in:
diagnosing a failure and/or an at-risk state of a cell, by recognizing defective cells, the failure including overheating subsequent to a situation of short-circuit, ingress of moisture, electrical arcing, flame, insulation defect, on the basis of the quantity measured at the level of a cell, so as to disconnect or discard from the overall operation of the photovoltaic energy generation device the cell concerned, by opening or closing at least one brick switch.

20. Method of photovoltaic energy generation device management according to claim 14, wherein the method implements the following steps:
mutual balancing of the bricks and/or modules and/or cells, using by priority the bricks and/or modules and/or cells whose voltage is the highest; and/or
balancing of the bricks and/or modules and/or cells by modifying the mean rate of use of the bricks and/or modules and/or cells, but without using the same bricks and/or modules and/or cells permanently, so that the voltage of the bricks and/or modules and/or cells balances.

21. Method for managing a photovoltaic energy generation device according to claim 14, wherein the method comprises a step of:
regulating output voltage of the photovoltaic energy generation device which comprises a step of opening/closing switches of the photovoltaic energy generation device so as to follow an imposed output voltage setpoint, the imposed output voltage setpoint being a time-varying setpoint such as of sinusoidal form.

22. Method for managing a photovoltaic energy generation device according to claim 14, wherein the method comprises a step of:
computing a number of bricks and/or subsets of bricks of the photovoltaic energy generation device to be connected in parallel or in series.

23. Photovoltaic energy generation device, comprising at least one brick consisting of:
(a) lower terminal
(b) an upper terminal,
(c) two cells arranged between the upper and lower terminals, each cell consisting of an elementary photovoltaic cell, and a storage element connected to terminals of the elementary photovoltaic cell, (d) five cell switches which switch to connect said two cells at least one of in series and in parallel,
(e) first and second branches extending between the lower and upper terminals, wherein the first branch extends between the lower and upper terminals and consists of a cell connected to the upper terminal, a first of the five cell switches connected to the lower terminal and a fourth cell switch of the five cell switches, wherein the second branch extends between the lower and upper terminals and consists of a second of the five switches connected to the upper terminal, a fifth of the five cell switches, and a cell connected to the lower terminal and
(f) a transverse branch consisting of a third a the five cell switches linking respectively intermediate terminals, disposed between the cell and the cell switch, of each of the first and second branches, wherein the fourth and the fifth switch of the five cell switches are each disposed respectively on one of first and second branches on the cell side with respect to the intermediate terminal.

* * * * *